(12) United States Patent
Bahadori et al.

(10) Patent No.: US 11,693,180 B2
(45) Date of Patent: Jul. 4, 2023

(54) RESONANT-BASED PHOTONIC INTENSITY MODULATORS INTEGRATED WITH FULLY ETCHED THIN-FILM LITHIUM NIOBATE WAVEGUIDES

(71) Applicant: Board of Trustees of the University of Illinois, Urbana, IL (US)

(72) Inventors: Meisam Bahadori, New York, NY (US); Songbin Gong, Chanpaign, IL (US); Lynford L. Goddard, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 17/377,305

(22) Filed: Jul. 15, 2021

(65) Prior Publication Data

US 2022/0026634 A1   Jan. 27, 2022

Related U.S. Application Data

(60) Provisional application No. 62/705,809, filed on Jul. 16, 2020.

(51) Int. Cl.
  *G02B 6/293* (2006.01)
  *G02B 6/12* (2006.01)
  (Continued)

(52) U.S. Cl.
  CPC ..... *G02B 6/12007* (2013.01); *G02B 6/29338* (2013.01); *G02F 1/0018* (2013.01);
  (Continued)

(58) Field of Classification Search
  CPC ................................................. G02B 6/29338
  See application file for complete search history.

(56) References Cited

U.S. PATENT DOCUMENTS 5,581,642 A * 12/1996 Deacon .................. G02F 1/313
  385/40
6,636,668 B1 * 10/2003 Al-hemyari ........ G02B 6/12007
  385/32
(Continued)

FOREIGN PATENT DOCUMENTS

CN   101858745 A * 10/2010
CN   105954892 A *  9/2016  ........... G02F 1/0316

OTHER PUBLICATIONS

Zhang et al., "A compact and low loss Y-junction for submicron silicon waveguide," Opt. Express 21(1), pp. 1310-1316 (2013).
(Continued)

*Primary Examiner* — Charlie Y Peng
(74) *Attorney, Agent, or Firm* — Lowenstein Sandler LLP

(57) ABSTRACT

An apparatus such as an optical modulator includes a buried oxide layer is disposed on a substrate. A microring resonator and an optical waveguide are disposed on the buried oxide layer and within a bonded semiconductor layer. The optical waveguide is optically coupled to the microring resonator and inputs a first optical wave into the microring resonator. An oxide layer is deposited on top of the optical waveguide and the microring resonator. A set of electrodes is disposed adjacent to the microring resonator, and in response to an electrical signal, the set of electrodes modulates the first optical wave into a modulated optical wave of transverse magnetic polarization within the microring resonator and outputs the modulated optical wave to the optical waveguide.

24 Claims, 49 Drawing Sheets

(51) Int. Cl.
*G02F 1/00* (2006.01)
*H01S 5/10* (2021.01)

(52) U.S. Cl.
CPC .... *H01S 5/1032* (2013.01); *G02B 2006/1204* (2013.01); *H01S 5/1071* (2013.01)

(56) References Cited

U.S. PATENT DOCUMENTS

| | | | | |
|---|---|---|---|---|
| 2002/0021765 | A1* | 2/2002 | Maleki | G02F 1/17 398/186 |
| 2006/0291791 | A1* | 12/2006 | Hochberg | G02F 1/065 385/132 |
| 2009/0180747 | A1* | 7/2009 | Schrauwen | B82Y 20/00 385/129 |
| 2010/0187402 | A1* | 7/2010 | Hochberg | G02B 6/12004 250/208.1 |
| 2016/0048041 | A1* | 2/2016 | Cunningham | G02F 1/225 385/2 |
| 2020/0201138 | A1* | 6/2020 | Lin | G02F 1/3551 |

OTHER PUBLICATIONS

Thomson et al., "Low loss MMI couplers for high performance MZI modulators," IEEE Photonics Technol. Lett. 22(20), pp. 1485-1487 (2010).
Bahadori et al., "Design space exploration of microring resonators in silicon photonic interconnects: impact of the ring curvature," J. Lightwave Technol. 36(13), pp. 2767-2782 (2018).
Park et al., "Ring resonator based polarization diversity WDM receiver," Opt. Express 27(5), pp. 6147-6157 (2019).
Ding et al., "Design and characterization of a 30-GHz bandwidth low-power silicon traveling-wave modulator," Opt. Commun. 321, pp. 124-133 (2014).
Ogawa et al., "Silicon Mach-Zehnder modulator of extinction ratio beyond 10 dB at 10.0-12.5 Gbps," Opt Express 19(26), pp. B26-B31 (2011).
Xiao et al., "44-GB/s silicon microring modulators based on zigzag PN junctions," IEEE Photonics Technol. Lett. 24(19), pp. 1712-1714 (2012).
Xu et al., "12.5 Gbit/s carrier-injection-based silicon micro-ring silicon modulators," Opt. Express 15(2), pp. 430-436 (2007).
Wade et al., "75% efficient wide bandwidth grating couplers in a 45nm microelectronics CMOS process in 2015," IEEE Optical Interconnects Conference (OI) (IEEE, 2015), pp. 46-47.
Wang et al., "Apodized focusing fully etched subwavelength grating couplers," IEEE Photonics J. 7(3), pp. 1-10 (2015).
Vermeulen et al., "Optical interfaces for silicon photonic circuits," Proc. IEEE 106(12), pp. 2270-2280 (2018).
Rao et al., "Second-harmonic generation in integrated photonics on silicon," Phys. Status Solidi A 215(4), 1700684 (2018), 9 pages.
Park et al., "Comparison of DAC-less PAM4 modulation in segmented ring resonator and dual cascaded ring resonator," in 2017 IEEE Optical Interconnects Conference (OI) (IEEE, 2017), pp. 7-8.
Palmero et al., "PAM4 silicon photonic microring resonator-based transceiver circuits," in H. Schröder and R. T. Chen, eds. (2017), p. 101090F-1-101090F-7.
Rao et al., "Heterogeneous thin-film lithium niobate integrated photonics for electrooptics and nonlinear optics," IEEE J. Sel. Top. Quantum Electron. 24(6), pp. 1-12 (2018).
He et al., "High-performance hybrid silicon and lithium niobate Mach-Zehnder modulators for 100 Gbit/s and beyond," ArXiv 180710362 Phys. (2018), 21 pages.
Rao et al., "High-performance and linear thin-film lithium niobate Mach-Zehnder modulators on silicon up to 50 GHz," Opt. Lett. 41(24), pp. 5700-5703 (2016).
Krasnokutska et al., "Ultra-low loss photonic circuits in lithium niobate on insulator," Opt. Express 26(2), pp. 897-904 (2018).
Cai et al., "Low-loss waveguides on Y-cut thin film lithium niobate: towards acousto-optic applications," Opt. Express 27(7), pp. 9794-9802, (2019).
Mahmoud et al., "Lithium niobate on insulator (LNOI) grating couplers," in CLEO: 2015 (2015), Paper SW4I.7 (Optical Society of America, 2015), p. SW4I.7.
Cai et al., "Low-loss chirped grating for vertical light coupling in lithium niobate on insulator," J. Opt. 21(6), 065801 (2019), pp. 1-7.
Jian et al., "High-efficiency hybrid amorphous silicon grating couplers for sub-micron-sized lithium niobate waveguides," Opt. Express 26(23), pp. 29651-29658 (2018).
Hu et al., "Computing optimal waveguide bends with constant width," J. Lightwave Technol. 25(10), pp. 3161-3167 (2007).
Shen et al., "Reducing mode-transition loss in silicon-on-insulator strip waveguide bends," in 2008 Conference on Lasers and Electro-Optics (IEEE, 2008), pp. 1-2.
Bahadori et al., "Universal design of waveguide bends in silicon-on-insulator photonics platform," J. Lightwave Technol. 37(13), pp. 3044-3054 (2019).
Reshef et al., "Extracting losses from asymmetric resonances in micro-ring resonators," J. Opt. 19(6), 065804 (2017), 9 pages.
Bogaerts et al., "Silicon microring resonators," Rev. 6(1), pp. 47-73 (2012).
Marpaung et al., "Integrated microwave photonics," Nat. Photon., vol. 13, No. 2, pp. 80-90, Feb. 2019.
Wang et al., "Integrated lithium niobate electro-optic modulators operating at CMOS-compatible voltages," Nature, vol. 562, No. 7725, pp. 101-104, Oct. 2018, doi: 10.1038/s41586-018-0551-y.
Yu et al., "An equivalent circuit model of the traveling wave electrode for carrier-depletion-based silicon optical modulators," J. Lightw. Technol., vol. 30, No. 11, pp. 1602-1609, Jun. 2012.
Baehr-Jones et al., "Ultralow drive voltage silicon traveling-wave modulator," Opt. Express, vol. 20, No. 11, May 2012, Art. No. 12014.
Fuste et al., "Bandwidth-length trade-off figures of merit for electro-optic traveling wave modulators," Opt. Lett., vol. 38, No. 9, May 2013, pp. 1548-1550.
Zhang et al., "Silicon-based microring resonator modulators for intensity modulation," IEEE J. Sel. Top. Quantum Electron., vol. 16, No. 1, pp. 149-158, 2010.
Honardoost, et al., "Towards subterahertz bandwidth ultracompact lithium niobate electrooptic modulators," Opt. Express, vol. 27, No. 5, Mar. 2019, pp. 6495-6501.
Alferness, R.C., "Waveguide electrooptic modulators," IEEE Trans. Microw. Theory Tech., vol. MTT-30, No. 8, pp. 1121-1137, Aug. 1982.
Dagli, N., "Wide-bandwidth lasers and modulators for RF photonics," IEEE Trans. Microw. Theory Tech., vol. 47, No. 7, pp. 1151-1171, Jul. 1999.
Lin et al., "High-throughput GaAs PIN electrooptic modulator with a 3-dB bandwidth of 9.6 GHz at 1.3 μm," Appl. Opt., vol. 26, No. 9, pp. 1696-1700, May 1987.
Spickerman et al., "In traveling wave modulators which velocity to match?," in Proc. Conf. Proc. LEOS'96 9th Annu. Meet. IEEE Lasers Electro-Opt. Soc., pp. 97-98, 1996.
Rigrod et al., "Wide-band microwave light modulation," Proc. IEEE, vol. 51, No. 1, pp. 137-140, 1963.
Spickerman et al., "GaAs/AlGaAs travelingwave electro-optic modulators," presented at the Photonics West '97, San Jose, CA, 1997, doi: 10.1117/12.264228, pp. 272-279.
Ayazi et al., "Linearity of silicon ring modulators for analog optical links," Opt. Express, vol. 20, No. 12, Jun. 2012, pp. 13115-13122.
Yu et al., "Electrical nonlinearity in silicon modulators based on reversed PN junctions," Photon. Res., vol. 5, No. 2, pp. 124-128, Apr. 2017.
Izutsu et al., "Broad-band traveling-wave modulator using a LiNbO3 optical waveguide," IEEE J. Quantum Electron., vol. QE-13, No. 4, pp. 287-290, Apr. 1977.
Kubota et al., "Traveling wave optical modulator using a directional coupler LiNbO3 waveguide," IEEE J. Quantum Electron., vol. QE-16, No. 7, pp. 754-760, Jul. 1980.

(56) References Cited

OTHER PUBLICATIONS

Tazawa et al., "Analysis of ring resonator-based traveling-wave modulators," IEEE Photon. Technol. Lett., vol. 18, No. 1, pp. 211-213, Jan. 2006.
Weigel et al., "Hybrid silicon photonic-lithium Niobate electro-optic Mach-Zehnder modulator beyond 100 GHz bandwidth" ArXiv180310365 Phys. (2018), pp. 1-15.
Kuchta et al., "A 56.1GB/s NRZ modulated 850 nm VCSEL-based optical link," in Optical Fiber Communication Conference/National Fiber Optic Engineers Conference 2013 (OSA, 2013), 4 pages.
Wooten, et al., "A review of lithium niobate modulators for fiber-optic communications systems," IEEE J. Sel. Top. Quantum Electron. 6(1), 69-82 (2000), 14 pages.
Bahadori et al., "High-performance integrated photonics in thin film lithium niobate platform," in Conference on Lasers and Electro-Optics, Jan. 2019, 3 pages.
Cai et al., "Waveguides in single-crystal lithium niobate thin film by proton exchange," Opt. Express 23(2), 1240-1248 (2015).
Wang et al., "Nanophotonic lithium niobate electro-optic modulators," Opt. Express 26(2), 1547-1555 (2018).
Boes et al., "Status and potential of lithium niobate on insulator (LNOI) for photonic integrated circuits," Laser Photonics Rev 12(4), 1700256 (2018), 19 pages.
Hu et al., "Lithium niobate-on-insulator (LNOI): status and perspectives," in (2012), p. 84311D, 8 pages.
Dourjal et al., "Lithium Niobate Optical Waveguides and Microwaveguides," Emerg. Waveguide Technol. (2018), 22 pages.
Wang et al., "Broadband 2x2 lithium niobate electro-optic switch based on a Mach-Zehnder interferometer with counter-tapered directional couplers," Appl. Opt. 56(29), 8164-8168 (2017), 6 pages.
Rao et al., "Compact Lithium Niobate Electrooptic Modulators," IEEE J. Sel. Top. Quantum Electron. 24(4), pp. 1-14 (2018).
Chen et al., "12.5 pm/V hybrid silicon and lithium niobate optical microring resonator with integrated electrodes," Opt. Express 21(22), 27003 (2013), 9 pages.
Ahmed et al., "Tunable hybrid silicon nitride and thin-film lithium niobate electro-optic microresonator," Opt. Lett. 44(3), 618(2019), 4 pages.
Ahmed et al., "Electro-Optically Tunable Modified Racetrack Resonator in Hybrid Si3N4—LiNbO3," Adv. Photonics Congr. 2 pages, (2019).
Rabiei et al., "Heterogeneous lithium niobate photonics on silicon substrates," Opt. Express 21(21), pp. 25573-25581 (2013).
Mahmoud et al., "Lithium niobate electro-optic racetrack modulator etched in Y-cut LNOI platform," IEEE Photonics J. 10(1), pp. 1-10 (2018).
Zhang et al., "Ultra-high bandwidth integrated lithium niobate modulators with record-low Vpi," in 2018 Optical Fiber Communications Conference and Exposition (OFC) (2018), pp. 1-3.
Guarino et al., "Electro-optically tunable microring resonators in lithium niobate," Nat. Photonics 1(7), pp. 407-410 (2007).
Krasnokutska et al., "Tunable large free spectral range microring resonators in lithium niobate on insulator," ArXiv180706531 Cond-Mat Physicsphysics Physicsquant-Ph (2018), 6 pages.
Yang et al., "An Isotropic Lithium Niobate Microring Resonator with a 1 38-nm Wide Continuous Tuning Range using 80V," in Conference on Lasers and Electro-Optics (CLEO) (2020), p. JTh2A.142, 2 pages.
Kar et al., "Realization of alignment-tolerant grating couplers for z-cut thin-film lithium niobate," Opt. Express 27(11), pp. 15856-15867 (2019).
Bahadori et al., "High performance fully etched isotropic microring resonators in thin-film lithium niobate on insulator platform," Opt. Express 27(15), 22025 (2019), 15 pages.
Zhang et al., "Electronically programmable photonic molecule," Nat. Photonics 13(1), pp. 36-40 (2019).
Chen et al., "Hybrid silicon and lithium niobate electro-optical ring modulator," Optica 1(2), pp. 112-118 (2014).
Wang et al., "Monolithic lithium niobate photonic circuits for Kerr frequency comb generation and modulation," Nat. Commun. 10(1), 978 (2019), 6 pages.
Rao et al., "Heterogeneous microring and Mach-Zehnder modulators based on lithium niobate and chalcogenide glasses on silicon," Opt. Express 23(17), 22746 (2015), 7 pages.
Wang et al., "Electro-optically tunable microring resonators on lithium niobate," Opt. Lett. 32(19), 2777 (2007), 3 pages.
Lee et al., "Hybrid Si—LiNbO3 microring electro-optically tunable resonators for active photonic devices," Opt. Lett. 36(7), pp. 1119-1121 (2011).
Siew et al., "Rib Microring Resonators in Lithium Niobate on Insulator," IEEE Photonics Technol. Lett. 28(5), pp. 573-576 (2016).
Gilarlue et al., "Multilayered Maxwell's fisheye lens as waveguide crossing," Opt. Commun. 435, pp. 385-393 (2019).
Jinesh et al., "Maxwell-Wagner instability in bilayer dielectric stacks," Appl. Phys. Lett. 95(12), 122903 (2009), 4 pages.
Vu et al., "Maxwell-Wagner Effect in Multi-Layered Dielectrics: Interfacial Charge Measurement and Modelling," Technologies 5(2), 27 (2017), 14 pages.
Bahadori et al., "Theory of coupled harmonics and its application to resonant and non-resonant electro-optic modulators," IEEE/OSA J. Light. Technol. (2020), 13 pages.
Karimelahi et al., "Ring modulator small-signal response analysis based on pole-zero representation," Opt. Express 24(7), 7585 (2016), 15 pages.
Sacher et al., "Dynamics of microring resonator modulators," Opt. Express 16(20), 15741 (2008), 13 pages.
Muller et al., "Optical Peaking Enhancement in High-Speed Ring Modulators," Sci. Rep. 4(1), 6310 (2015), 9 pages.
Bahadori et al., "Fundamental electro-optic limitations of thin-film lithium Niobate microring modulators," Opt. Express 28(9), pp. 13731-13749 (2020).
Johnson et al., "Optical Constants of the Noble Metals," Phys. Rev. B 6(12), pp. 4370-4379 (1972).
"Honardoost et al., "High-Speed Modeling of Ultracompact Electrooptic Modulators," J. Lightwave Technol. 36(24), pp. 5893-5902 (2018)."
Song et al., "Optoelectronic integrated circuits for growing datacenters: challenge, strategy, and evolution," in Smart Photonic and Optoelectronic Integrated Circuits XXI, E.-H. Lee and S. He, eds. (SPIE, 2019), 9 pages.
Cheng et al., "Recent advances in optical technologies for data centers: a review," Optica 5(11), pp. 1354-1370 (2018).
Kuchta et al., "A 71-GB/s NRZ modulated 850-nm VCSEL-based optical link," IEEE Photonics Technol. Lett. 27(6), pp. 577-580 (2015).
Cheng et al., "Photonic switching in high performance datacenters [Invited]," Opt. Express 26(12), pp. 16022-16043 (2018).
Rumley et al., "Optical interconnects for extreme scale computing systems," Parallel Comput. 64, pp. 65-80 (2017).
Rumley et al., "Silicon photonics for exascale systems," J. Lightwave Technol. 33(3), pp. 547-562 (2015).
Shen et al., "Silicon photonics for extreme scale systems," J. Lightwave Technol. 37(2), pp. 245-259 (2019).
Lim et al., "Review of silicon photonics foundry efforts," IEEE J. Sel. Top. Quantum Electron. 20(4), pp. 405-416 (2014).
Westerveld et al., "Extension of Marcatili's analytical approach for rectangular silicon optical waveguides," J. Lightwave Technol. 30(14), pp. 2388-2401 (2012).
Bogaerts et al., "Silicon photonics circuit design: methods, tools and challenges," Laser Photonics Rev. 12(4), 1700237 (2018), 31 pages.
Lee et al., "Fabrication of ultralow-loss Si/SiO_2 waveguides by roughness reduction," Opt. Lett. 26(23), pp. 1888-1890 (2001).
Lu et al., "Broadband silicon photonic directional coupler using asymmetric-waveguide based phase control," Opt. Express 23(3), pp. 3795-3808 (2015).

* cited by examiner

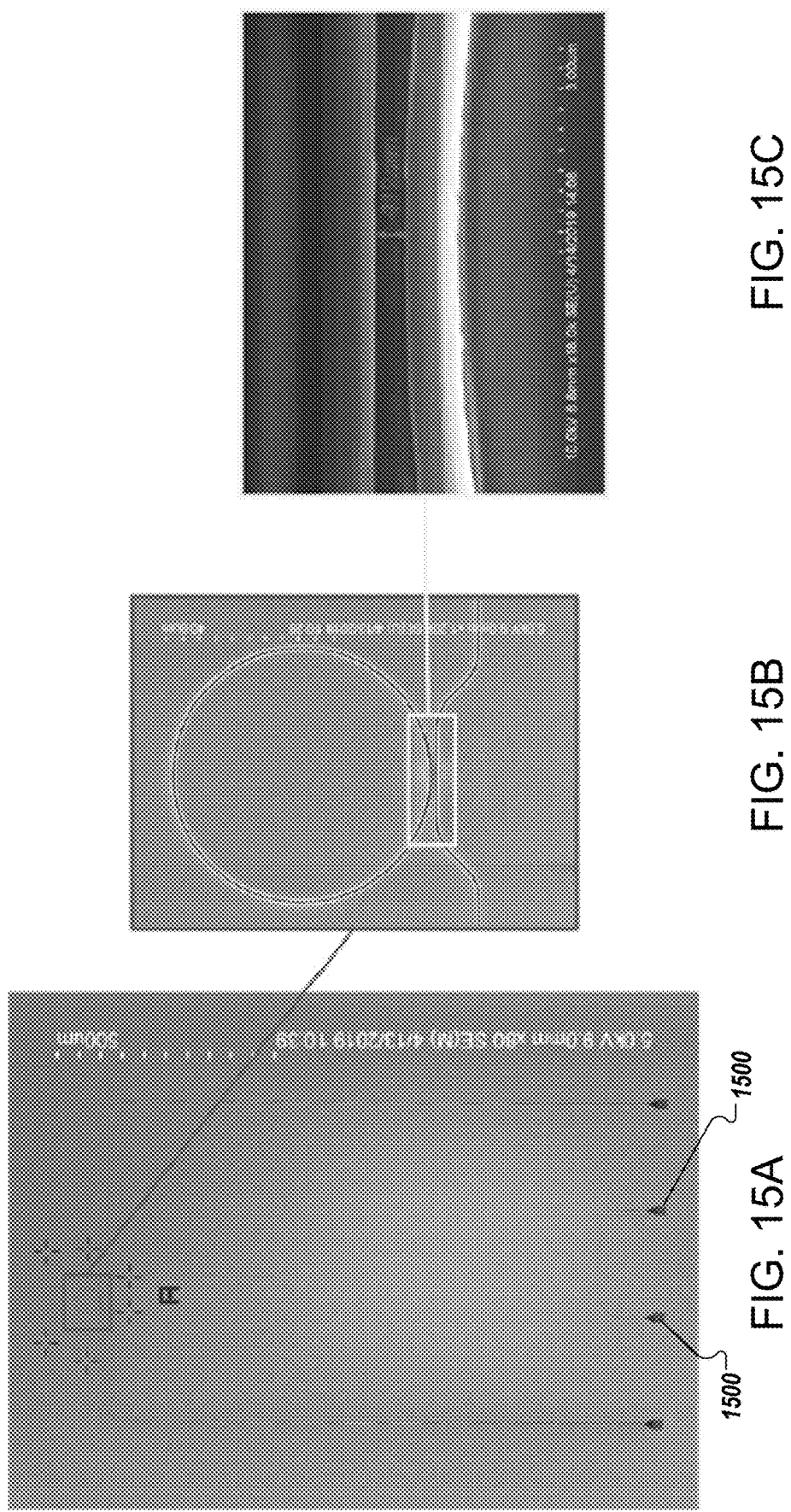

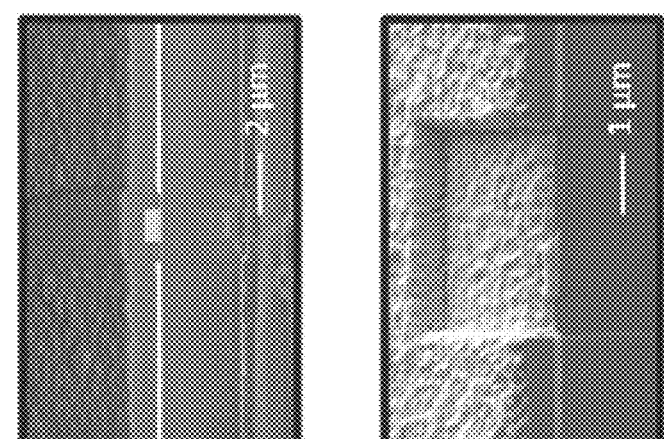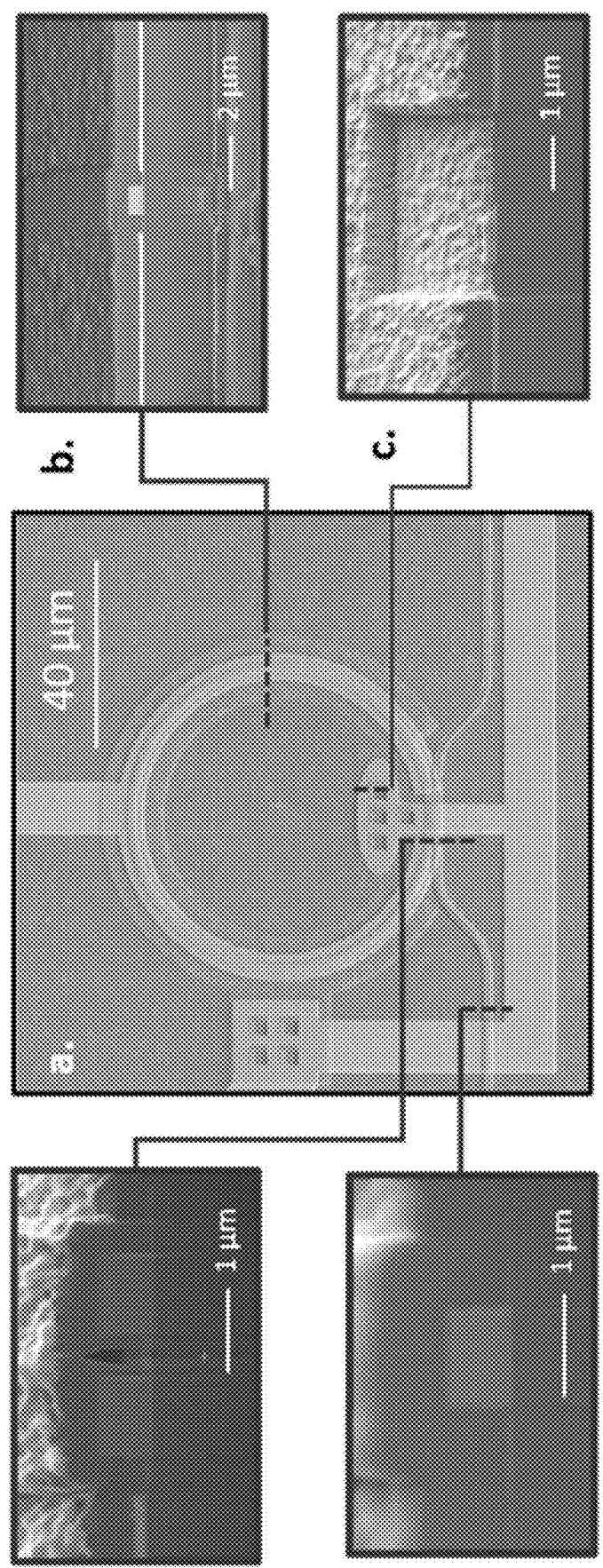

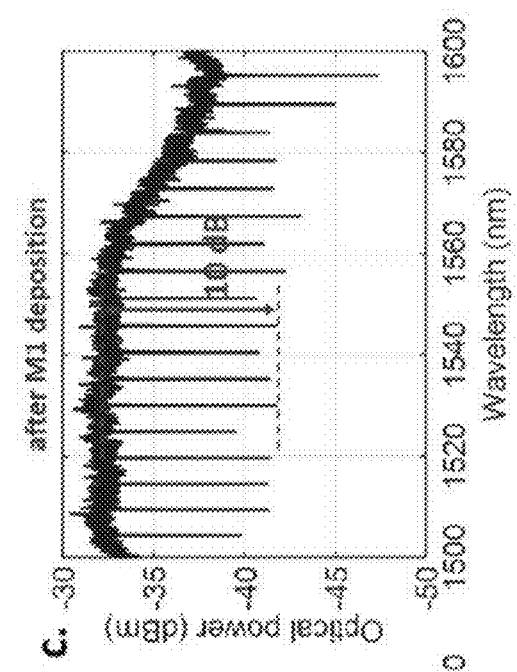
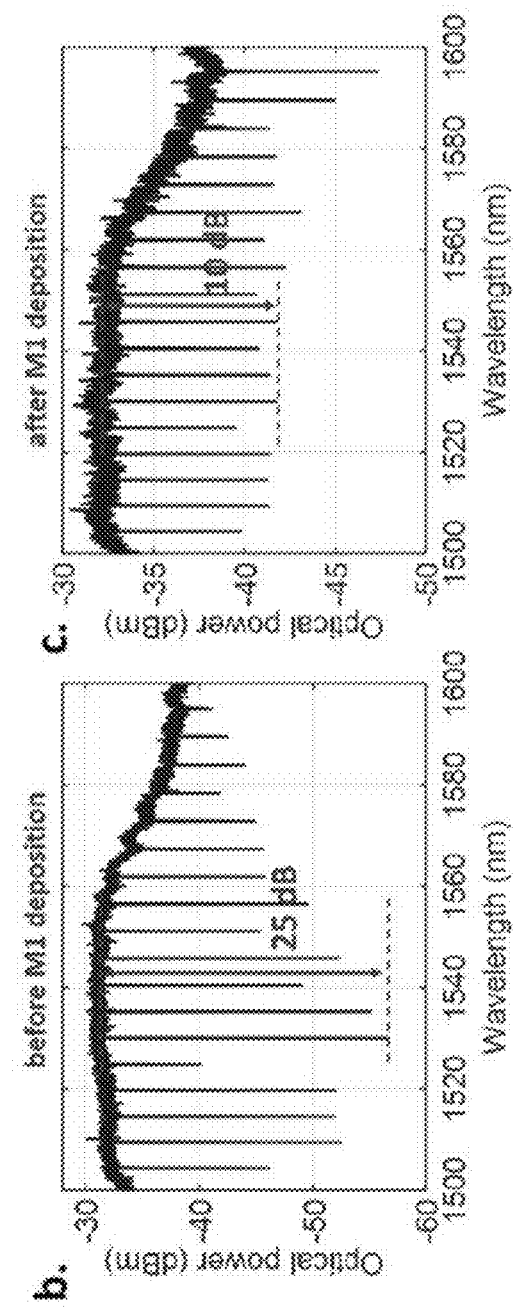
FIG. 24C
FIG. 24B
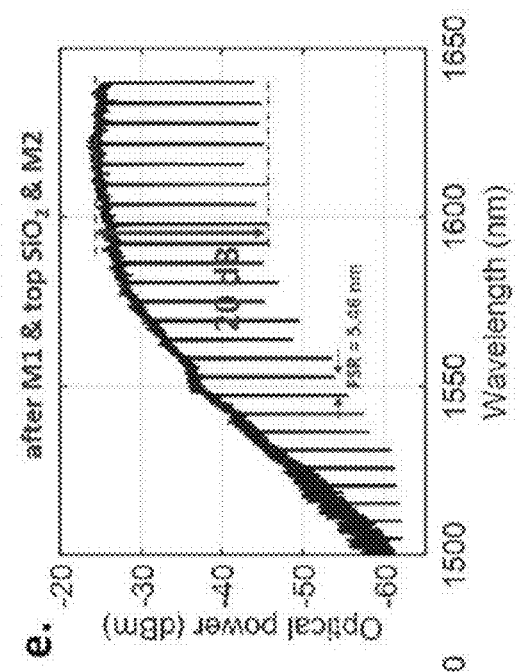
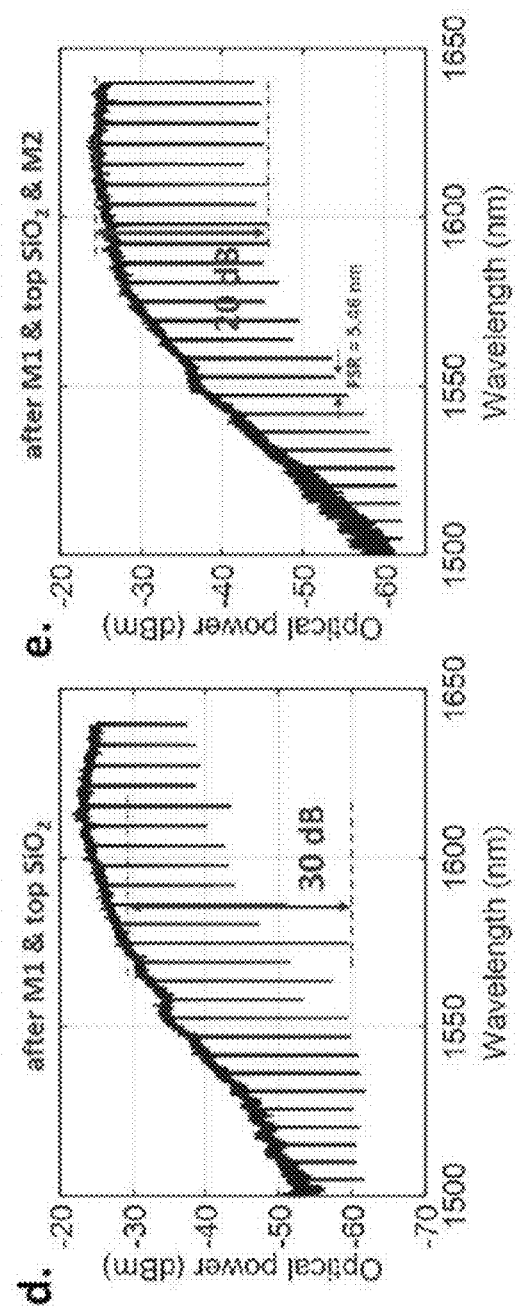
FIG. 24E
FIG. 24D
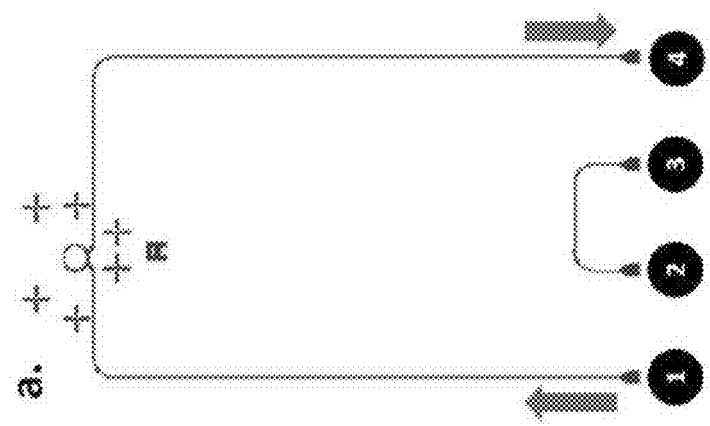
FIG. 24A ium niobate (LN) thin-film according to various embodiments.

RESONANT-BASED PHOTONIC INTENSITY MODULATORS INTEGRATED WITH FULLY ETCHED THIN-FILM LITHIUM NIOBATE WAVEGUIDES

RELATED APPLICATIONS

This application claims the benefit under 35 U.S.C. § 119(e) of U.S. Provisional Patent Application No. 62/705,809, filed Jul. 16, 2020, which is incorporated herein by this reference in its entirety

FEDERALLY SPONSORED RESEARCH OR DEVELOPMENT

This disclosure was made with government support under Grant No. 80NSSC17K0529 awarded by the National Aeronautics and Space Administration (NASA) for the Early Career Award program. The government has certain rights in the invention.

TECHNICAL FIELD

Embodiments of the disclosure relate generally to resonators, and more specifically, to electro-optic modulators designed for integrated photonics applications.

BACKGROUND

An increasing demand for higher bandwidth in data centers and cloud-based services has led to the advancement and deployment of optical transceivers. Pluggable transceivers based on directly modulated vertical cavity surface emitting lasers (VCSELs) dominate the market due to their low cost per bit solution for short-range interconnects (intra data-center). As the size of these communication intensive centers continues to grow, solutions for scalable long-range interconnect are becoming increasingly important.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 15A is an SEM image of a fabricated all-pass microring resonator according to various embodiments.

FIG. 15B is a zoomed-in SEM image of the microring resonator and optical waveguide according to various embodiments.

FIG. 15C is a zoomed-in SEM image of the coupling gap between the microring resonator and the optical waveguide according to various embodiments.

FIGS. 23A-23E are microscopic images of a microring with the top and bottom electrodes and vias according to various embodiments.

FIG. 24A is a schematic illustration of the layout of the passive microring (e.g., with no electrodes) with its ports numbered from left to right according to various embodiments.

FIG. 24B is a graph that illustrates the measured optical spectrum of the passive device without any metal electrodes according to various embodiments FIG. 24C is a graph that illustrates the measured optical spectrum after deposition of the bottom electrodes and before deposition of oxide cladding according to various embodiments.

FIG. 24D is a graph that illustrates the measured optical spectrum after the deposition of the top oxide cladding according to various embodiments.

FIG. 24E is a graph that illustrates the optical spectrum of the finished device after the deposition of the top electrode according to various embodiments.

FIB. 43B is a schematic illustration of an equivalent discrete representation of a lumped on-linear phase shift according to various embodiments.

Figure 44A:
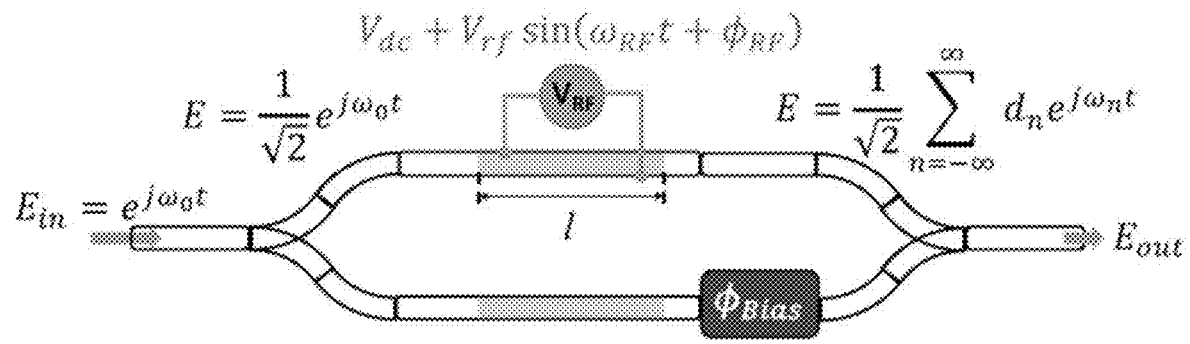

FIG. 44A is a schematic illustration of a lumped Mach-Zehnder modulator according to various embodiments.

Figure 44B:
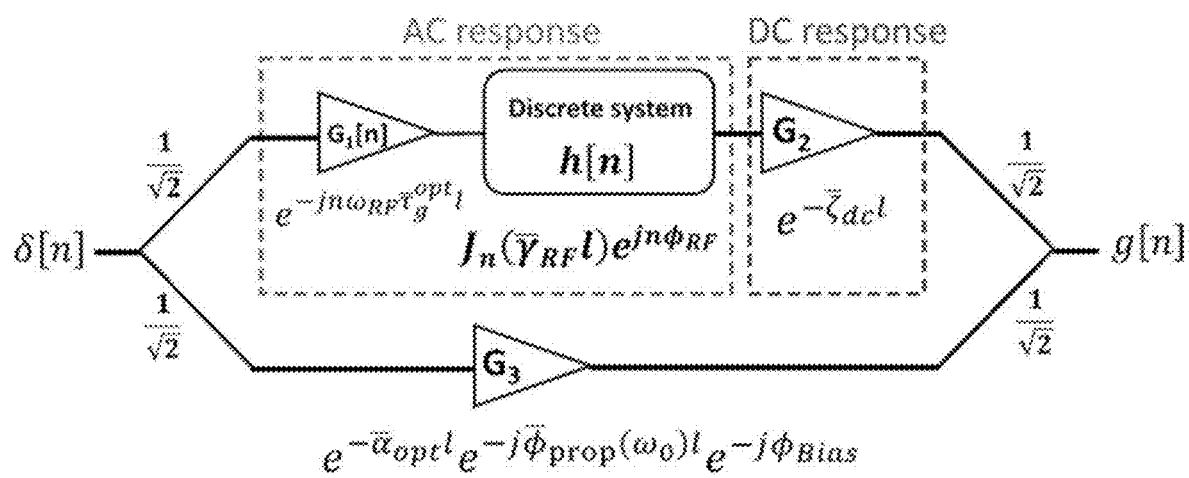

FIG. 44B is a schematic illustration of an equivalent discrete system representation of the RF harmonic for the lumped Mach-Zehnder modulator according to various embodiments.

Figure 45A:
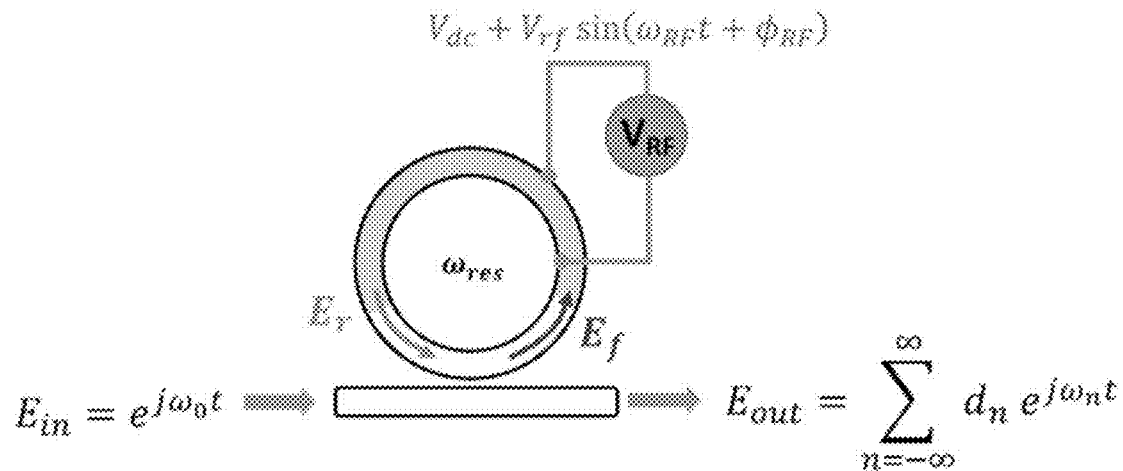

FIG. 45A is a schematic illustration of a microring resonator with an embedded phase shifter according to various embodiments.

Figure 45B:
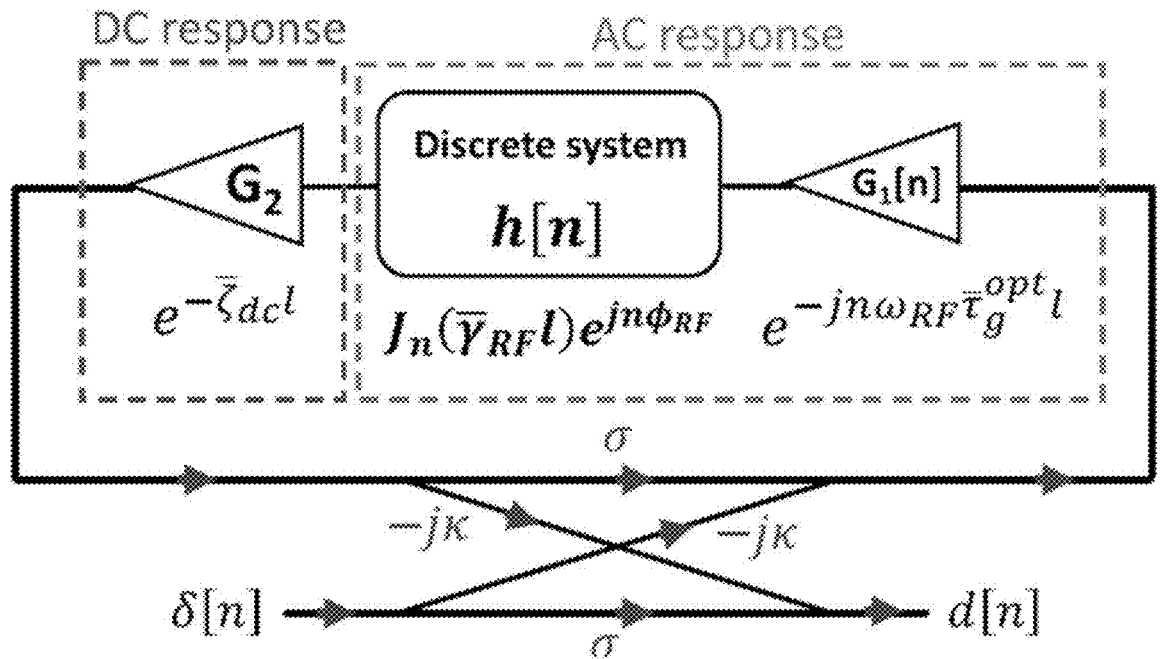

FIG. 45B is a schematic representation of an equivalent discrete system representation of the RF harmonic mixing in a lumped microring modulator according to various embodiments.

Figure 46:
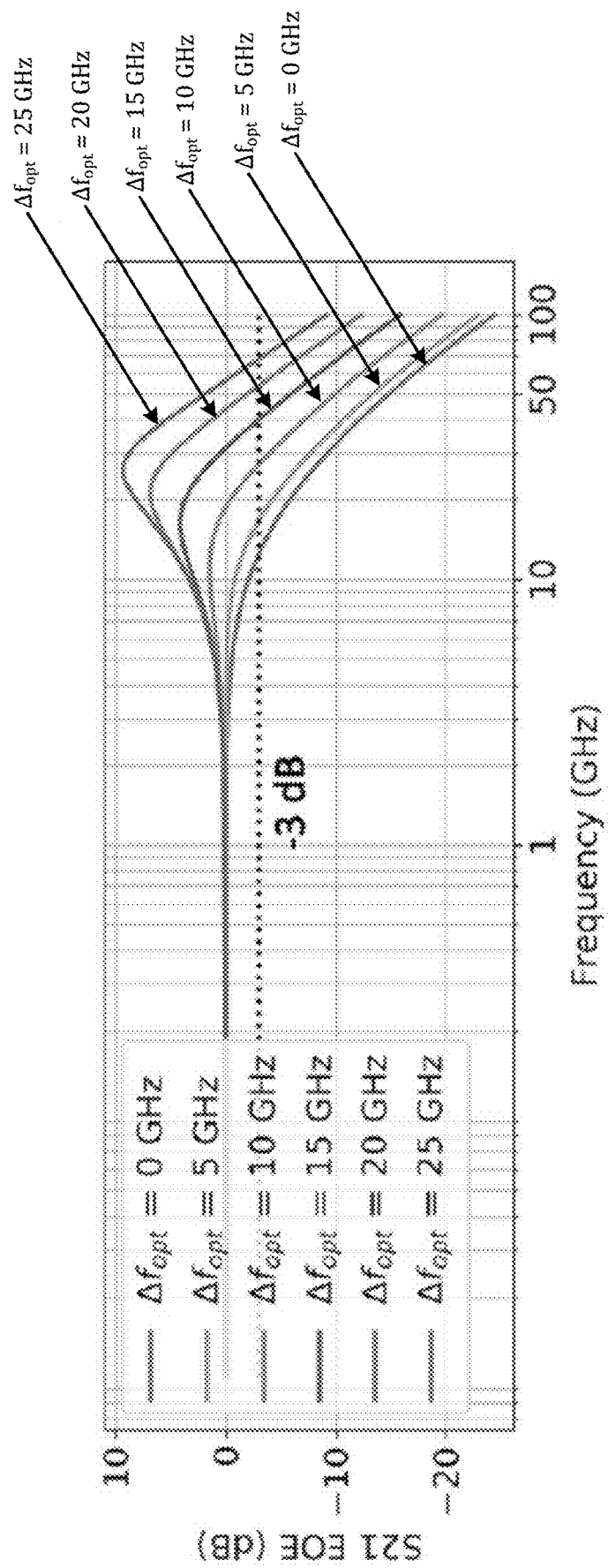

FIG. 46 is a graph illustrating a simulation of the EO frequency peaking phenomenon of the microring modulators due to the optical detuning according to various embodiments.

DETAILED DESCRIPTION

Similar to electronics, scalability for photonics benefits from integration. Long-range reach of optical modulation can be achieved using modulated lasers with sufficiently high optical power. Therefore, photonics technologies that can readily take advantage of complementary metal oxide semiconductor (CMOS) foundries have the potential for mass-volume production and low cost. Silicon photonics (SiPh) are potential candidates for such technologies. Thanks to its high index contrast (HIC) property, photonic functionalities such as optical routing with waveguides at low propagation loss (1-3 dB/cm), power splitters and combiners, wavelength selective filters, broadband Mach-Zehnder modulators, wavelength selective modulators, low-loss vertical grating couplers, and edge couplers for optical input/output can be produced using standardized process development kits (PDKs).

Silicon photonics (SiPh) offers scalability and low production cost. Properties of SiPh include its reliance on carrier dynamics for modulation as well as induced excess loss, which can potentially limit its adoption for niche applications where linear electro-optic modulation or strong nonlinear optical effects are highly desired. Examples include second harmonic generation or transferring equi-level 4-level pulse amplitude modulation (PAM4) electrical voltages onto an optical signal, which relies on special electrical equalization or other techniques to compensate for the nonlinear electro-optic response of silicon phase shifters.

Similar to SiPh, a lithium niobate on insulator (LNOI) platform can provide a high index contrast ($\Delta n=0.7$) which allows for decreasing the size of photonic structures. Moreover, its linear electro-optic response and larger optical transparency window ($\Delta=0.35$-$5.2$ μm) can allow LNOI to have improved properties compared to SiPh, especially when highly linear electro-optic modulation is demanded, such as in analog RF photonics applications. Thin-film LNOI (e.g., with a thickness ~400-800 nm) can be used to integrate LNOI for photonics applications. However, because lithium niobate (LN) can be a challenging material to etch, hybrid (e.g., heterogeneous) solutions can be used. Several types of hybrid waveguides and modulators can be made, such as with silicon, silicon nitride, and tantalum pentoxide materials. Because the optical indices of these materials are close to or higher than LN, most of the optical confinement occurs outside of LN, which can lead to degraded electro-optic performance of such modulators.

To induce more optical confinement in LN, partially-etched LN can be used to create optical waveguides. Partially-etched LN can be used to realize high-performance electro-optic traveling waveguide structures and resonant devices. Due to the optical anisotropy of LN, the performance of the demonstrated structures based on X-cut or Y-cut crystals (in-plane extraordinary axis) and a transverse electric (TE) optical mode (in-plane polarization) can have a dependence on their orientation. This is evident in microring-based resonators, where their optical or electro-optic response can potentially degrade if the structures have some in-plane rotation or misplacement. This problem can also exist for vertical grating in LN platforms. Although hybrid Si-LN grating couplers can be a solution to this problem, their fabrication can be more complex and challenging. Vertical grating couplers, such as those described herein, can provide several advantages including compactness and the ability to couple light from anywhere on the surface of the chip (e.g., flip-chipped vertical cavity surface emitting lasers (VCSELs)), thereby enabling rapid die/wafer testing and heterogeneous integration with light sources.

Isotropic grating couplers and isotropic low-loss microring resonators can utilize a transverse magnetic (TM) polarization in a Z-cut LN crystal. The optical extraordinary axis is normal to the plane of the chip and hence the in-plane axes are both ordinary (with the same optical index) and no sensitivity to the resonator orientation can occur. Furthermore, because TM polarization can have less overlap with the sidewalls than its TE counterpart, a fabricated fully-etched rectangular single-mode optical waveguide (~800 nanometers (nm) wide and 560 nm thick) can exhibit low propagation loss (~7 dB/cm for circular waveguides). Although single-mode optical waveguides can have more propagation loss due to the higher overlap of optical mode with the sidewalls, a balance between the loss and coupling can have an effect on the performance of microring resonators, e.g., operating close to critical coupling. By designing the optical mode and the coupling between microring resonators and straight optical waveguides, a high resonance extinction (~25 dB) for a small radius (~30 μm) and high Q-factor (~31000) can be achieved. It should be noted that extinction herein refers to an extinction of resonance. In other words, the extinction refers to a difference between maximum and minimum values in the spectral response of the microring. The extinction for thin-film LN microring resonators is high, and can potentially be used for realizing ultra-compact and isotropic microring resonator with speeds of 10 gigabits per second (Gb/s) in thin-film LNOI.

In one embodiment, an optical device can include an insulating carrier substrate, a microring resonator, an optical waveguide, and electrodes. The microring resonator and the optical waveguide are located on the insulating carrier substrate. The optical waveguide is coupled to the microring resonator and inputs a first optical wave with a first frequency into the microring resonator. The electrodes may be disposed on the microring resonator in a symmetric configuration and include electrode lines disposed on the insulating carrier substrate. The electrodes produce an electric field within the microring resonator, thus resulting in a voltage potential between the electrodes. The electric field can be a strong vertical field in the microring resonator without significantly increasing optical loss therein. In response to an electrical signal, the electrodes modulate a refractive index of the microring resonator, causing the microring resonator to modulate the first optical wave to generate a modulated optical wave. The microring resonator outputs the modulated optical wave to the optical waveguide.

In a further embodiment, the optical waveguide is made of a Z-cut LN etched thin film. In one embodiment, the insulating carrier substrate is a silicon substrate. In one embodiment, the optical waveguide is separated from the microring resonator by a first distance that is between 100 nm and 4000 nm.

In a further embodiment, the optical device includes a light source, a first vertical grating, and a second vertical grating. The light source generates the first optical wave. The first vertical grating coupler is coupled between the light source and an input of the optical waveguide. The first vertical grating coupler provides the first optical wave from the light source to the optical waveguide. The second vertical grating coupler is coupled to an output of the optical waveguide. The light source can be either coherent or incoherent. A coherent light source can include a surface-emitting laser, a fiber or gas laser or the like. An incoherent light source can include a light-emitting diode (LED).

Figure 1A:
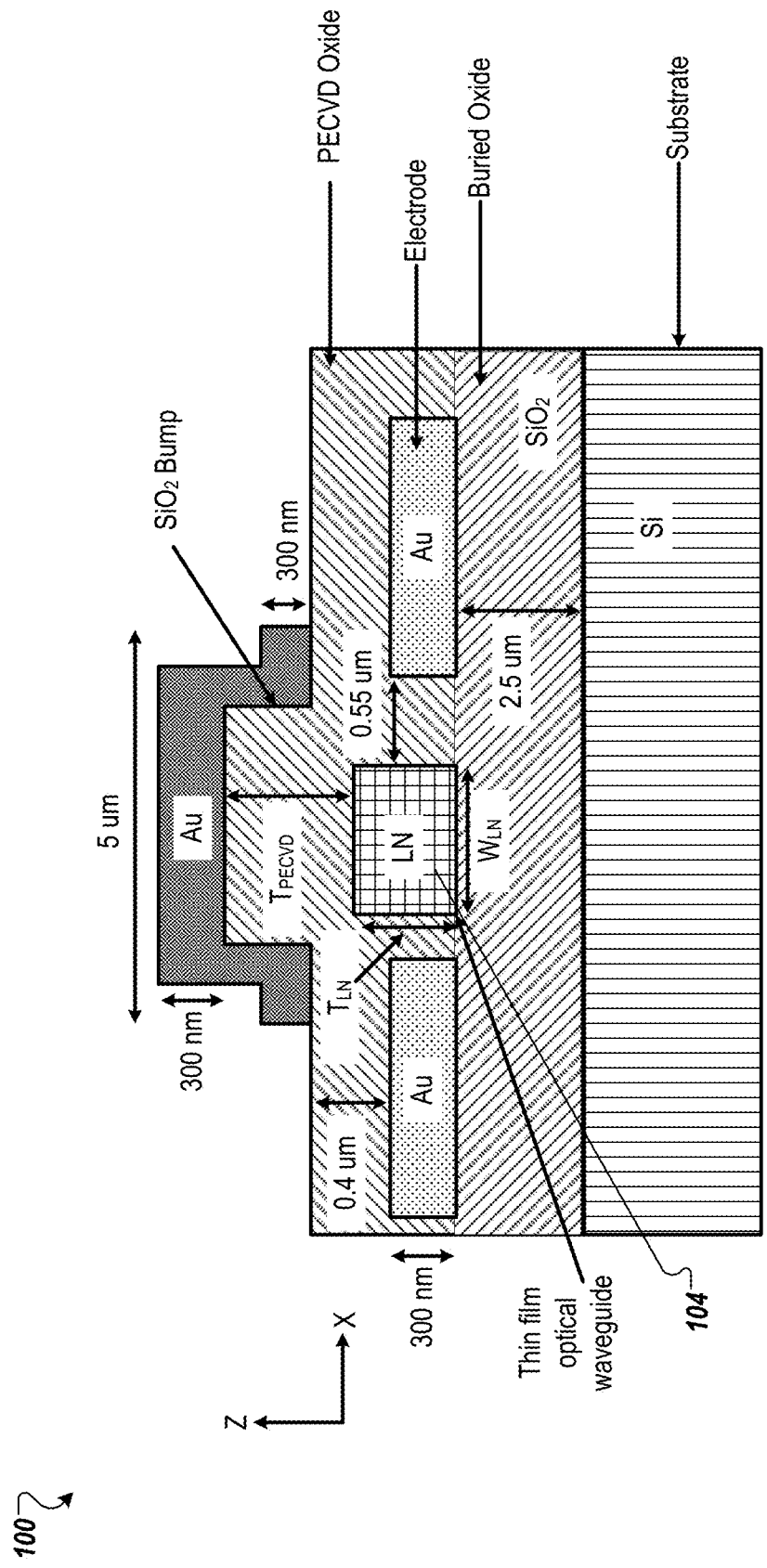
FIG. 1A is a schematic diagram of an optical waveguide using Z-cut lithium niobate on insulator (LNOI) with a silicon substrate according to various embodiments.

FIG. 1A is a schematic diagram of an optical device 100 using Z-cut LNOI with a silicon substrate according to various embodiments. The LNOI with silicon substrate can be processed with e-beam lithography and etching to create an optical waveguide 104 within the optical device 100. The dimensions of the optical waveguide 104 can be set with a width $W_{LN}$ and a thickness $T_{LN}$. For example, $W_{LN}$ may be between 0.8 μm-1.5 μm (e.g., 0.8 micrometers (e.g., microns) (μm), 1 μm, 1.5 μm, etc.) and $T_{LN}$ may be between 500 nm-600 nm (e.g., 0.5 μm, 0.58 μm, 0.6 μm, etc.). For example, a thickness of 560 nm may allow the optical waveguide 104 to support the propagation of a single optical mode. A PECVD oxide layer can have a thickness $T_{PECVD}$ between 300 nm-700 nm (e.g., 300 nm, 640 nm, 700 nm, etc.). It is worth noting that the values indicated in the figure are exemplary, and additional values may be expressed herein and with respect to FIG. 22.

The optical device 100 can be an electro-optic modulator designed for integrated photonics applications. A DC or high-speed (e.g., up to 15 GHz) signal can be applied to the positive and negative electrodes, causing a change in the optical refractive index of LN, which leads to a phase shift in the light. Due to the resonant nature of the modulator (e.g., the optical device 100), the phase-shifted light can constructively or destructively interfere with the original input light from an input light source (e.g., optical waves), which can result in an on-off keying (OOK) optical amplitude modulation. The microring resonator can offer an isotropic design of photonic circuits using planar active integrated resonant electro-optic resonators made of anisotropic LN material. The microring resonator can allow for dense and complex integrated photonic circuit designs including photonic transceivers with high performance.

In some embodiments, the microring resonator can utilize LN as a good linear electro-optic material. In particular, the use of Z-cut LN can substantially eliminate requirements on the orientation of the microring resonator on the wafer. The use of TM optical polarization in the optical waveguide 104 that utilizes a Z-cut LN crystal or a Z-cut LN etched thin film can significantly reduce optical losses due to the etching process and further leads to good electro-optical performance. The microring resonator can enable a true isotropic photonic circuit design, and can use a fully-etched, single-mode optical waveguide for the highest optical confinement. The microring resonator can further provide an ultra-compact footprint for a highly dense photonic circuit design.

Figure 1B:
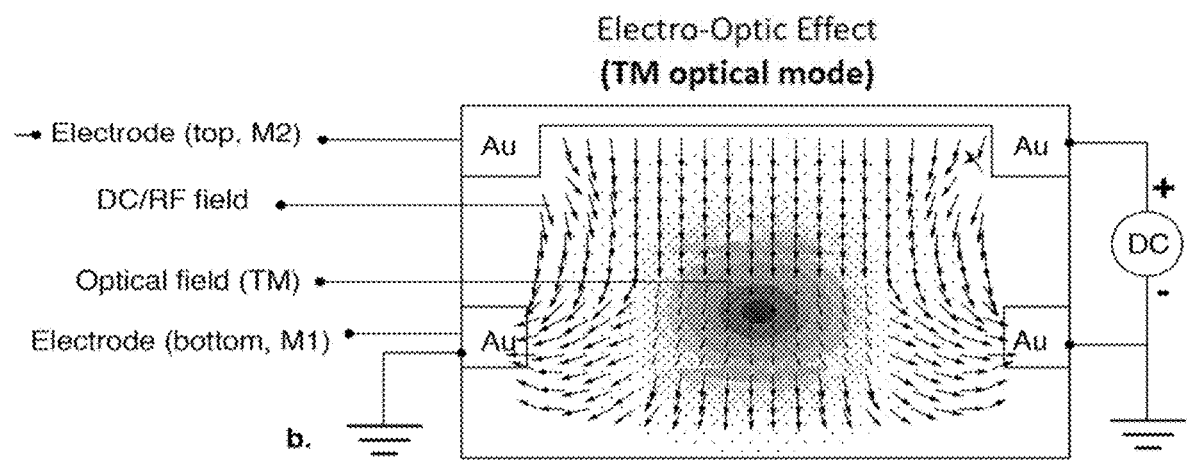
FIG. 1B is a graph that illustrates a transverse magnetic (TM) polarization of light inside of the optical waveguide according to various embodiments.

FIG. 1B is a graph that illustrates a transverse magnetic (TM) polarization of light inside of an optical waveguide according to various embodiments. The optical waveguide can be the optical waveguide 104 of FIG. 1A. The polarization of the light (e.g., optical waves) inside the optical waveguide can be set to TM by a selective optical input/output (I/O). This polarization can overlap with the top and bottom edges of the optical waveguide that remain substantially untouched during the etching process, and therefore can have very low roughness, leading to a low optical propagation loss, e.g., less than a few dB/cm.

Figure 1C:
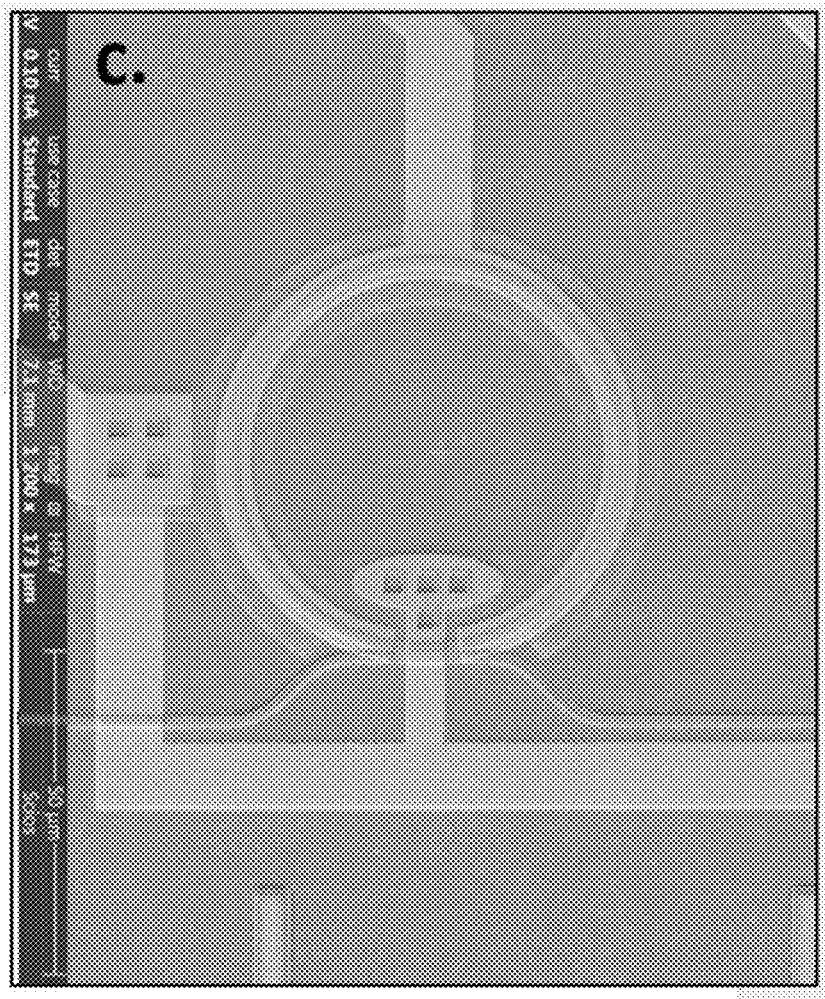
FIG. 1C is an image of a top-view of the layout of the optical waveguide including a microring resonator and a coupling waveguide as well as top and bottom metal layers and via connections used for routing electrical signals according to various embodiments.

FIG. 1C is an image of a top-view of the layout of an optical waveguide device including a microring resonator and a coupling waveguide as well as top and bottom metal layers and via connections used for routing electrical signals according to various embodiments. Optical intensity modulation can be performed by applying an electrical signal (e.g., a DC (0 Hz) or radio frequency (RF) signal up to 15 GHz) to the electrodes. In the case of a Z-cut crystal (e.g., a Z-cut LN etched thin film), the DC/RF field should be vertical in the optical waveguide device to achieve a high optical index perturbation and electro-optic effect. To accomplish this, the optical waveguide device design can utilize a symmetrical electrode design based on a linear superposition principle of Maxwell's equations.

Figure 2A:
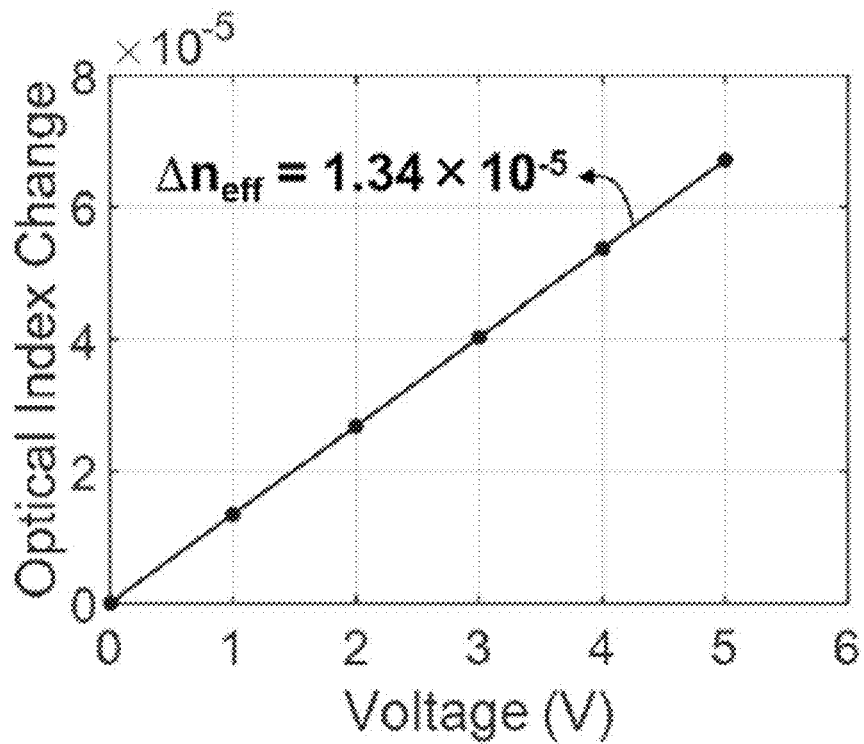
FIG. 2A is a graph that illustrates a simulated linear electro-optical perturbation effect of the optical index according to various embodiments.

FIG. 2A is a graph that illustrates a simulated linear electro-optical perturbation effect of the optical index according to various embodiments. The perturbation effect can result in a resonant shift efficiency of greater than 7 pm/V. The simulated electro-optical performance can have linear behavior.

Figure 2B:
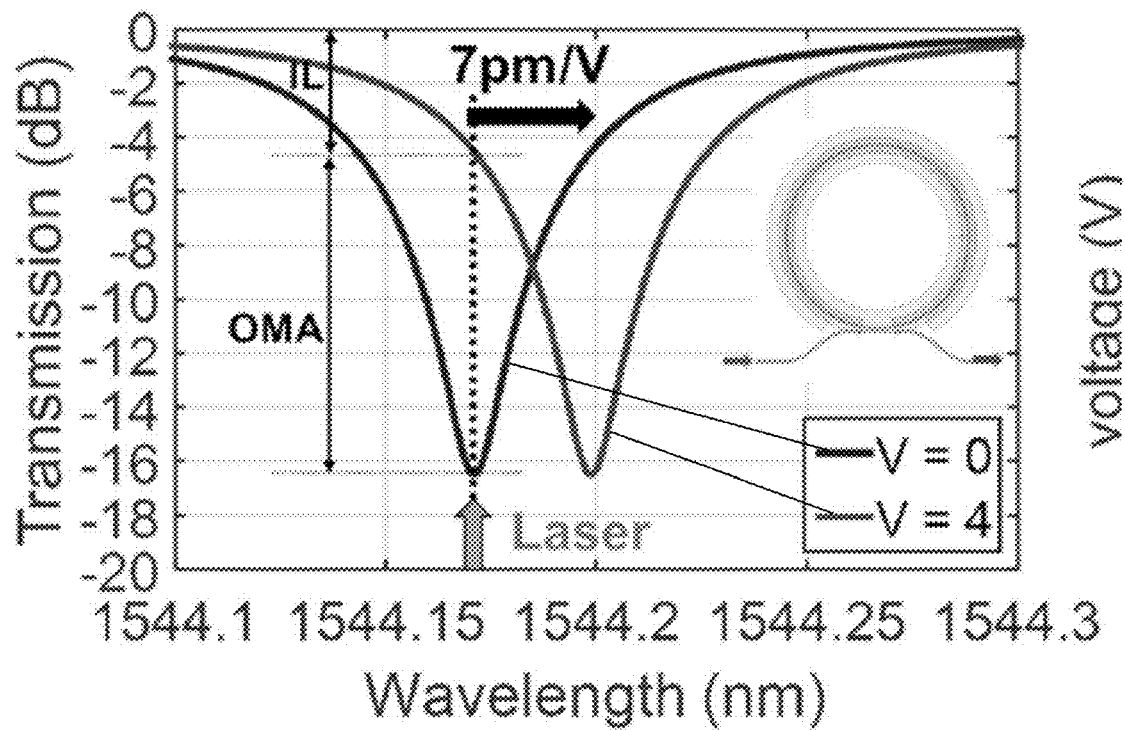
FIG. 2B is a graph that illustrates a simulated optical modulation performance of the optical waveguide according to various embodiments.

FIG. 2B is a graph that illustrates a simulated optical modulation performance of the optical waveguide according to various embodiments. FIG. 2B demonstrates the intensity modulation by applying a voltage as low as 4V and achieving an optical modulation amplitude (OMA) of greater than 15 dB. The extinction of the resonance can be quantified as a sum of the insertion loss (IL) and OMA. An extinction of modulation can be quantified as the OMA, which is a difference between digital signals that are generated by the optical modulation.

Figure 2C:
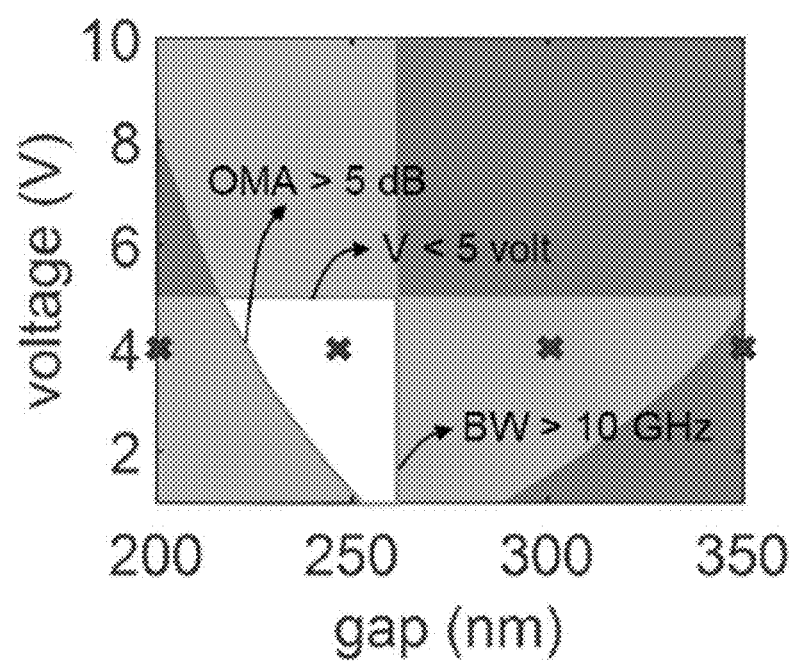
FIG. 2C is a graph that illustrates a design space characterization of the microring resonator with four selected design points for fabrication according to various embodiments.

FIG. 2C is a graph that illustrates a design space characterization of the microring resonator with four selected design points for fabrication according to various embodiments. The characterization of the design space of the optical modulation is shown as a function of the applied voltage and coupling gap between a bus waveguide (e.g., the optical waveguide) and a microring resonator cavity. Based on the desired performance requirements and considerations on possible fabrication variations, four example design candidates are marked by crosses in FIG. 2C.

Figure 3:
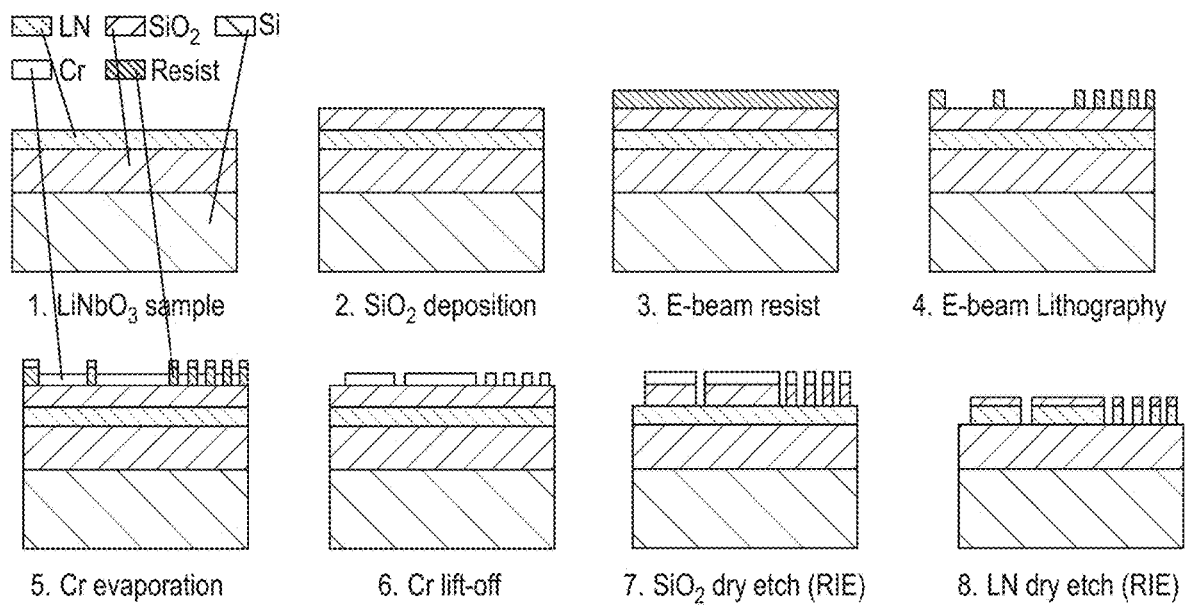
FIG. 3 is a schematic diagram that illustrates process steps used to fabricate an isotropic microring resonator according to various embodiments.

FIG. 3 is a schematic diagram that illustrates process steps used to fabricate an isotropic microring resonator according to various embodiments. In particular, an optical response of the microring resonator is isotropic with respect to an axis of symmetry of the microring resonator. One fabrication process for making thin-film LN on oxide can be referred to as "smart cut." In general, semiconductor layers can be grown on host substrates because the lattice constants of the two materials need to be closely matched to maintain the crystalline structure, while dielectric layers are deposited because they are amorphous. In some embodiments, the fabrication process involves one or more of the following steps. Initially, the sample is a stack of an LN layer deposited on a first silicon dioxide ($SiO_2$) that is deposited on a silicon (Si) layer (step 1). A second $SiO_2$ layer can be deposited on the LN layer (step 2). $SiO_2$ can be used as a hard mask for etching LN. An electron beam (e-beam) resist (e.g., a photoresist) layer can be deposited on the second $SiO_2$ layer (step 3). The e-beam resist can be polymethyl methacrylate (PMMA), copolymer resist, such as methyl methacrylate and methacrylic acid (PMMA/MA), or the like. Channels can be etched in the e-beam resist layer using e-beam lithography (EBL) (step 4). A layer of chromium (Cr) can be deposited on the etched e-beam resist layer (step 5). It should be noted that a first portion of the layer of Cr can be at a first height (e.g., where there is no e-beam resist due to the e-beam lithography) and a second portion of the layer Cr can be at a second height (where there is e-beam resist) that is higher than the first height due to the e-beam lithography. Cr can be chosen as a hard mask for defining $SiO_2$. The second portion of the layer of Cr can be lifted off along with the e-beam resist (step 6). The sample can be $SiO_2$ dry etched (e.g., by using reactive-ion etching (RIE)) (step 7). Finally, the sample can be LN dry etched (e.g., by using RIE) (step 8). Devices can be fabricated using the process steps shown in FIG. 3.

In various embodiments, the Z-cut thin-film lithium niobate wafers can be employed that have a nominal thickness of 560 nm on 2.5 μm $SiO_2$ on a silicon substrate, for example. The thickness of the buried oxide can be chosen such that the leakage of the optical mode into the substrate for both TE and TM polarizations is substantially negligible. An approximately 700 nm layer of $SiO_2$ can be used as the hard mask for dry etching LN and deposited using standard plasma-enhanced chemical vapor deposition (PECVD) (~113 nm/min). A 300 nm of photoresist (e.g., an e-beam resist such as PMMA) can be spin coated at 2000 rpm for 1 minute and EBL can be performed on the sample. Proximity effect corrections can be performed (e.g., using Beamer software) to generate a dose table that enables patterning of the small feature sizes of (300-400 nm). A 120 nm-thick Cr layer patterned via evaporation and lift-off process can be used as the mask for etching $SiO_2$ ($SiO_2$:Cr rate~20:1).

Figure 4A:
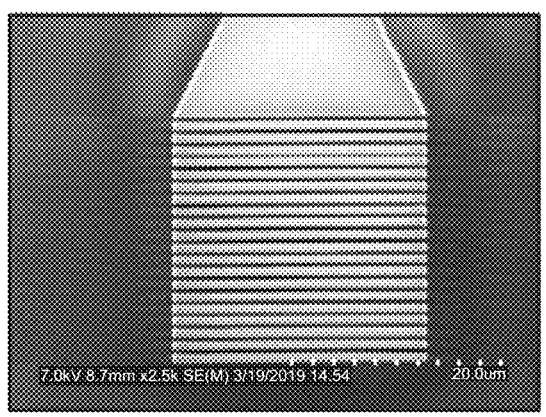
FIGS. 4A-4B are scanning electron microscope (SEM) images of patterned chromium (Cr) for various grating couplers according to various embodiments.
Figure 4B:
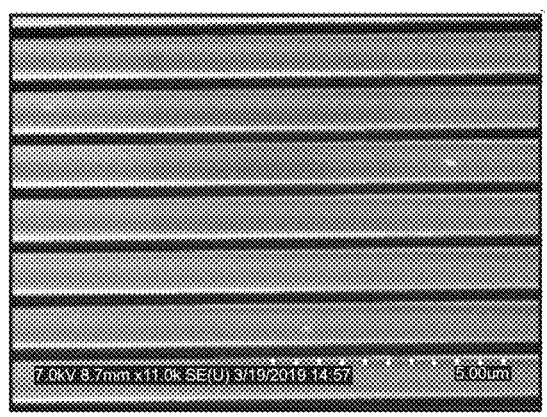
Figure 5A:
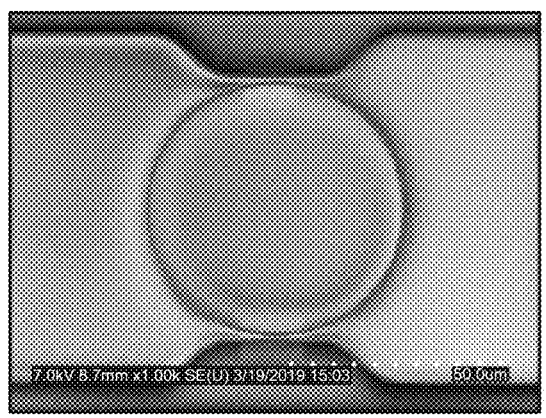
FIGS. 5A-5B are SEM images of patterned Cr for various add-drop microring resonators according to various embodiments.
Figure 5B:
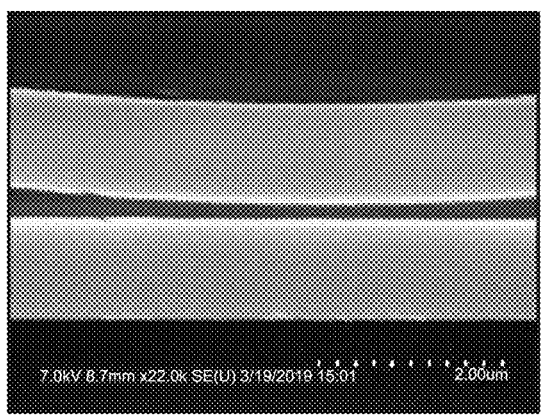

FIGS. 4A-4B are scanning electron microscope (SEM) images of patterned chromium (Cr) for various grating couplers according to various embodiments. FIGS. 5A-5B are SEM images of patterned Cr for various add-drop microring resonators according to various embodiments. Following steps as outlined in FIG. 3, the $SiO_2$ layer and then the LN layer can be dry etched. The dry etching of $SiO_2$ and LN can be done for example, by using an RIE system such as a Plasma Therm ICP RIE system. The $SiO_2$ can be etched using $CHF_3$ (20 sccm) and $O_2$ (5 sccm) gases with ICP power of 800 W and RIE power of 100 W. The LN can be etched using $Cl_2$ (5 sccm), $BCl_3$ (15 sccm), and Ar (18 sccm) gases with ICP and RIE powers of 800 W and 280 W, respectively. The etch rates of $SiO_2$ and LN in the LN etching can be set to 140 nm/min and 200 nm/min respectively, corresponding to the selectivity of 1.45:1. The thickness of the remaining $SiO_2$ after fully etching LN can be measured to be approximately 280 nm. This thickness can be left on top of LN layer to improve the coupling loss of grating couplers.

Figure 6A:
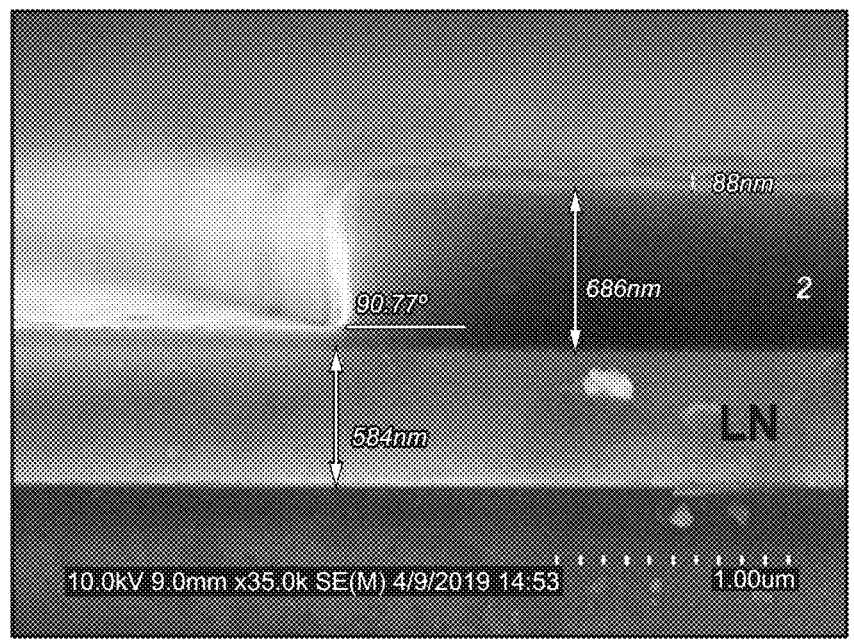
FIG. 6A is a cross-sectional view SEM image of the etched $SiO_2$ according to various embodiments.
Figure 6B:
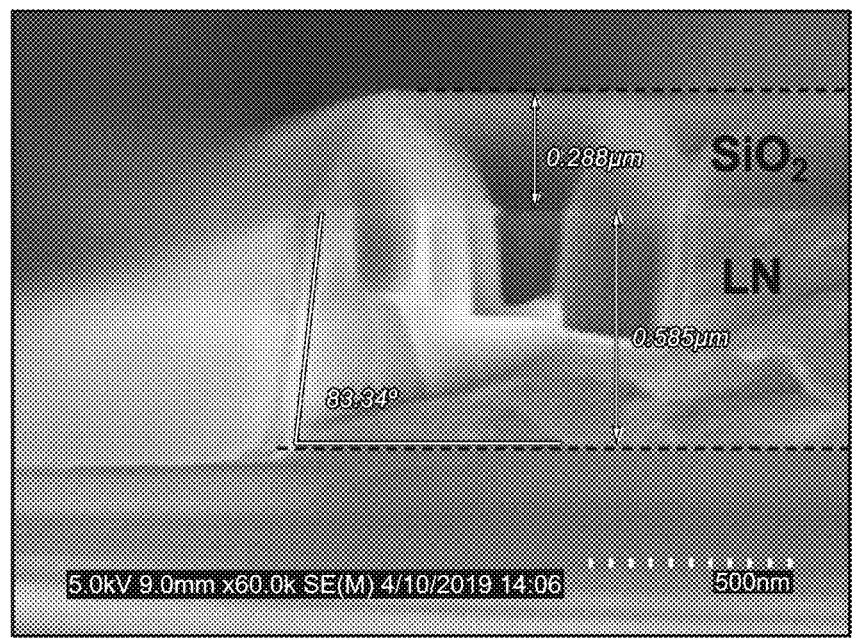
FIG. 6B is a cross-sectional view SEM image of etched lithium niobate (LN) thin-film according to various embodiments.

FIG. 6A is a cross-sectional view SEM image of the etched $SiO_2$ according to various embodiments. FIG. 6B is a cross-sectional view SEM image of etched lithium niobate (LN) thin-film according to various embodiments. FIGS. 6A-6B show the second layer of $SiO_2$ on the layer of LN following the $SiO_2$ dry etch (e.g., step 7) as described in reference to FIG. 3. The angle of LN sidewalls can be estimated to be 83°.

Figure 7A:
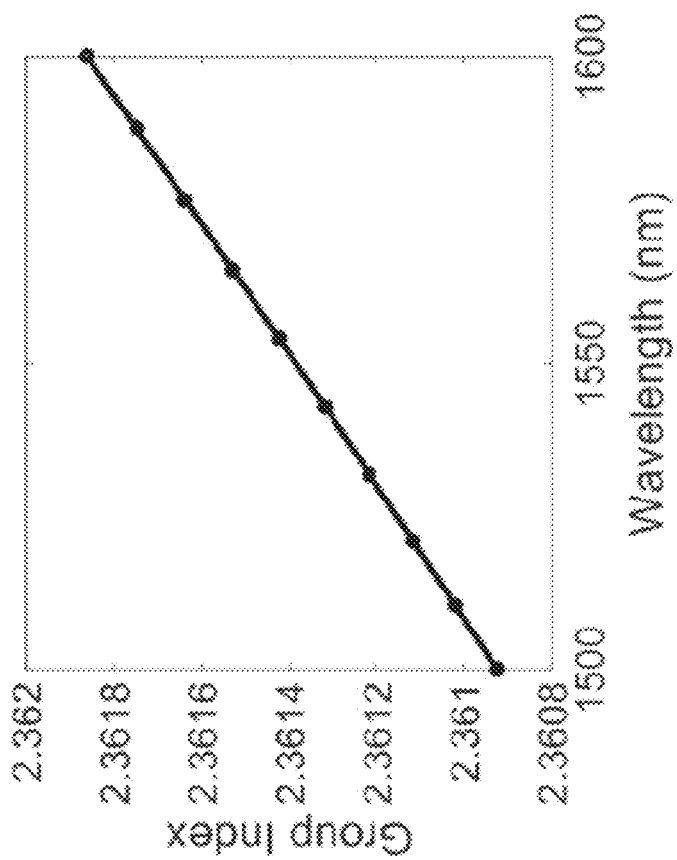
FIG. 7A is a graph that illustrates a calculated effective index of the fundamental TM mode in a fully etched optical waveguide with dimensions of 800 nm×560 nm according to various embodiments.

FIG. 7A is a graph that illustrates a calculated effective index of the fundamental TM mode in a fully etched optical waveguide with dimensions of 800 nm×560 nm according to various embodiments. The optical waveguide (that can be the same or similar to the optical waveguide 104 of FIG. 1A) is designed to have a small cross section to function as a single-mode optical waveguide. A thickness of 560 nm can be used to optimize the grating couplers. A maximal width for single-mode operation of the fully etched waveguides can be determined by sweeping the width. For a thickness of 560 nm, the maximal width for single-mode operation can be determined to be 1000 nm. Alternatively, a design with an 800 nm width can be used to achieve stronger coupling. Because isotropic and low-loss operation is targeted, TM polarization can be selected to minimize the overlap of the optical mode with the sidewalls, as well as enable maximum electro-optic efficiency operation in the Z-cut crystal. FIG. 7A shows the calculated TM effective index of the 800 nm×560 nm optical waveguide as a function of the wavelength.

Figure 7B:
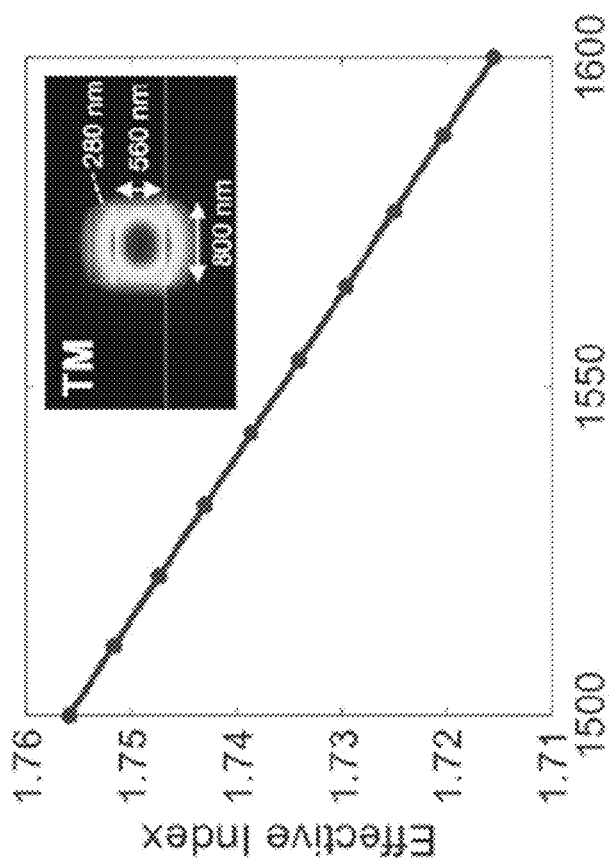
FIG. 7B is a graph that illustrates a calculated group index of the fundamental TM mode according to various embodiments.

FIG. 7B is a graph that illustrates a calculated group index of the fundamental TM mode according to various embodiments. At λ=1550 nm, the effective index is 1.736 and the group index is 2.3614. The waveguide loss of a Z-cut ring resonators for TE polarization is approximately 11 dB/cm. Therefore, a lower loss for TM polarization can be expected (~5-10 dB/cm).

Figure 8B:
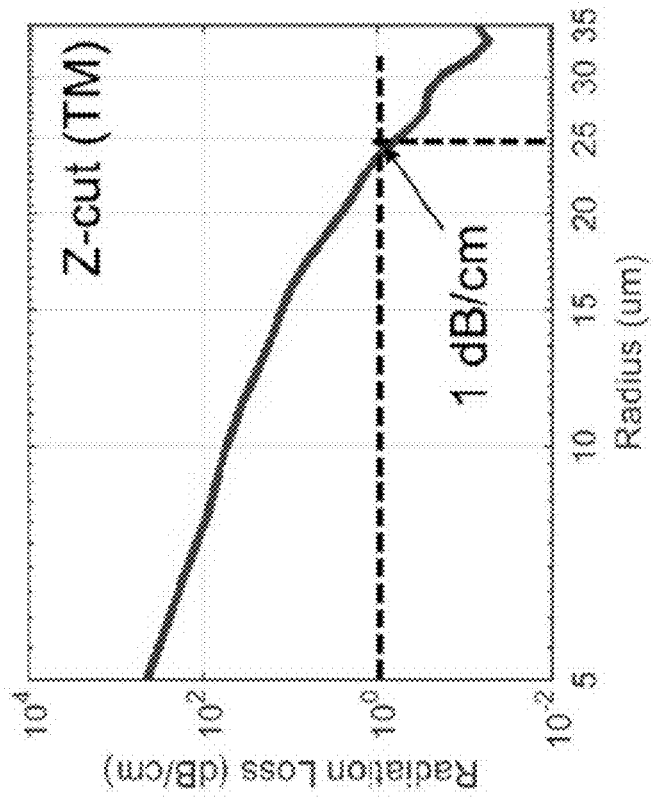
FIG. 8B is a graph that illustrates an estimated radiation loss as a function of radius of a microring resonator according to various embodiments.
Figure 8A:
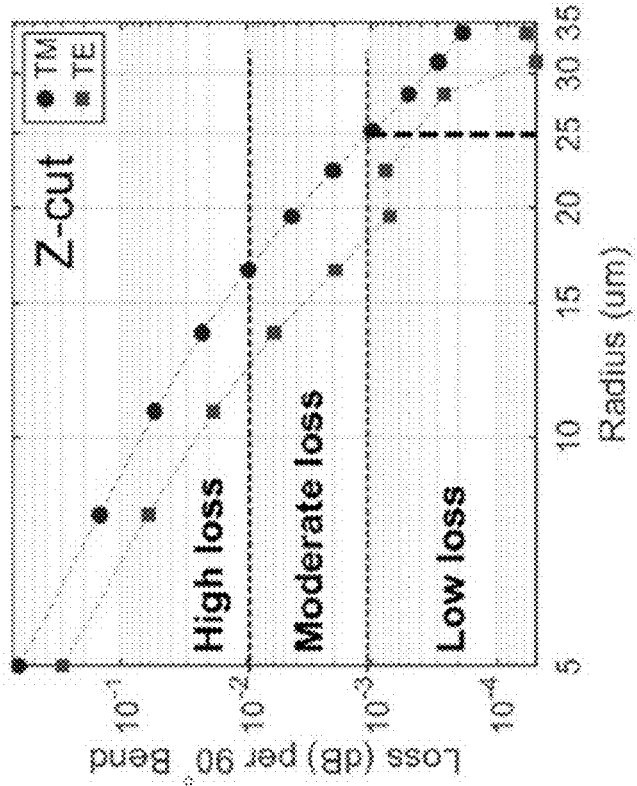
FIG. 8A is a graph that illustrates a calculated bending loss for a 90° bend for transverse electric (TE) and TM polarizations according to various embodiments.

FIG. 8A is a graph that illustrates a calculated bending loss for a 90° bend for TE and TM polarizations according to various embodiments. The bending loss includes radiation in addition to mode mismatches. In order to achieve the smallest microring resonator and hence the largest free spectral range (FSR), the bending loss of the optical waveguides can be calculated. FIG. 8A shows the estimated bending loss (radiation loss plus the mode-mismatch loss) per 90° bend for both the TE and TM polarizations in the waveguide.

FIG. 8B is a graph that illustrates an estimated radiation loss as a function of radius of a microring resonator according to various embodiments. The radiation loss is measured in dB/cm. Radiation losses less than 1 dB/cm can be achieved for a radius greater than 25 cm. The TM polarization can show a slightly higher loss due to its lower confinement. Because the mode-mismatch loss may not be present in a fully circular ring, the radiation loss can be extracted by comparing the loss of a 90° bend to the loss of a 180° bend. The result (in dB/cm unit) is plotted in FIG. 8B for the TM polarization. It should be noted that 1 dB/cm loss can be achieved at a radius of 25 μm. Hence, selecting the radius to be 30 μm can result in a negligible radiation loss (~0.2 dB/cm).

Based on the group index and the radius, the FSR can be estimated from $$FSR_{nm} = \frac{\lambda_{nm}^2}{2\pi R_{nm} n_g} \quad (1)$$

to be approximately 5.26 nm around λ=1550 nm.

It is worth noting that the radius of the microring discussed herein is chosen for exemplary purposes, and in other embodiments, the range of possible radii can be wide. Smaller radius values can have higher bending losses and may not be ideally suited for LN, but could be well-suited for higher contrast semiconductors (e.g., silicon). Larger values can perform better for many applications because the full width at half max can be smaller due to the lower optical loss but at the expense of a smaller free spectral range that may be less desirable for some applications. In general, and depending on materials and applications, the radius of the microring resonator may be between approximately 1 μm and 1000 μm.

Figure 9B:
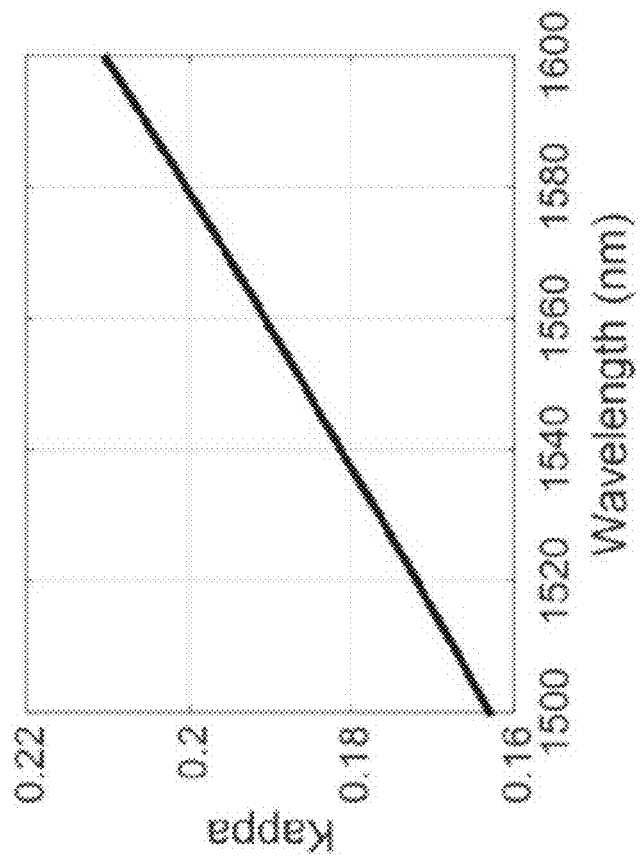
FIG. 9B is a graph that illustrates calculated coupling coefficients for TM polarization as function of wavelength for a gap of 400 nanometers (nm) between the optical waveguide and the microring resonator according to various embodiments.
Figure 9A:
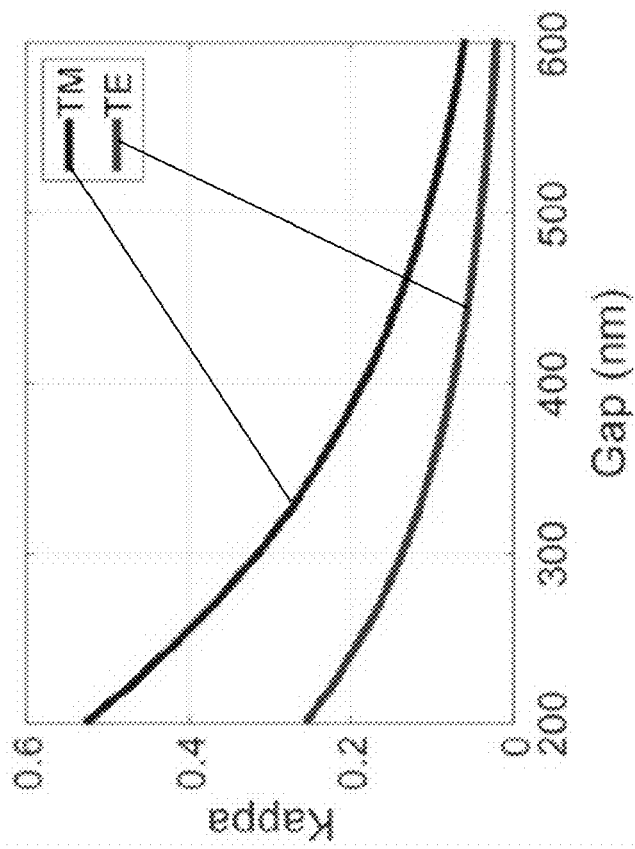
FIG. 9A is a graph that illustrates finite-difference time-domain (FDTD) simulation results of the coupling of a Z-cut optical waveguide to a microring resonator according to various embodiments.

FIG. 9A is a graph that illustrates finite-difference time-domain (FDTD) simulation results of the coupling of a Z-cut optical waveguide to a microring resonator according to various embodiments. In some embodiments, the microring resonator can have a 30 μm radius at λ=1550 nm for both TE and TM polarizations. Based on a predicted loss of less than 10 dB/cm for the TM microring resonators, a coupling between the Z-cut optical waveguide and microring resonator can be designed by running an FDTD simulation and sweeping the coupling gap. An analytic approach based on optical super-modes can also be utilized to estimate the coupling coefficients. FIG. 9A shows the simulation results of the field cross coupling (kappa) as a function of the coupling gap at λ=1550 nm.

FIG. 9B is a graph that illustrates calculated coupling coefficients for TM polarization as function of wavelength for a gap of 400 nm between the optical waveguide and the microring resonator according to various embodiments. In embodiments, the gap may range between 100 nm to 4000 nm. In particular FIG. 9B shows the cross coupling for TM polarization as a function of the wavelength for a 400 nm coupling gap (measured gap in the fabricated structures). At λ=1550 nm, the field coupling can be estimated to be approximately 0.19 and the power coupling can be estimated to be 3.6%.

Figure 10B:
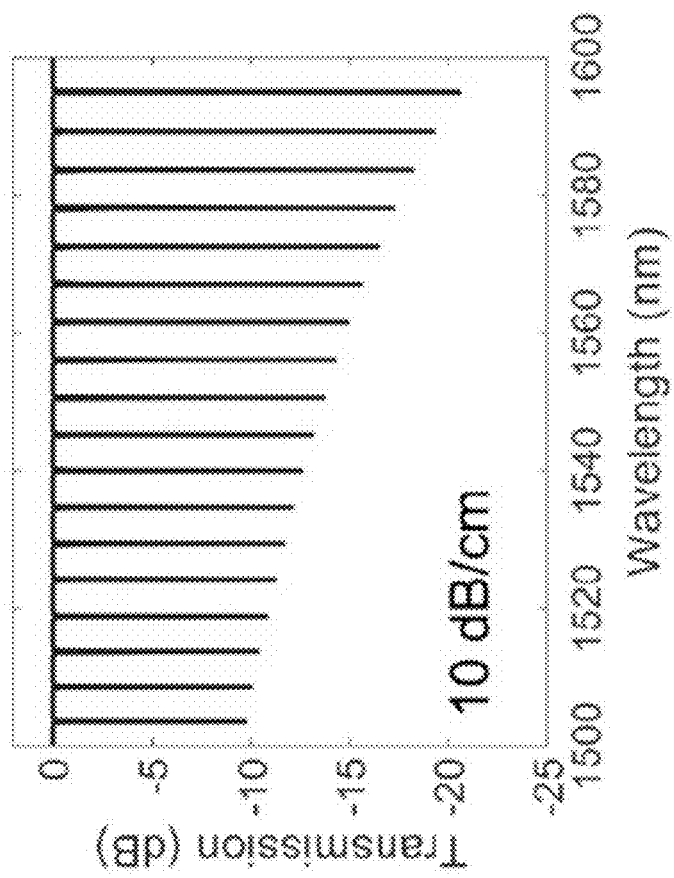
FIG. 10B is a graph that illustrates a calculated wavelength spectrum of an all-pass microring resonator with a 10 dB/cm loss and a 400 nm coupling gap according to various embodiments.
Figure 10A:
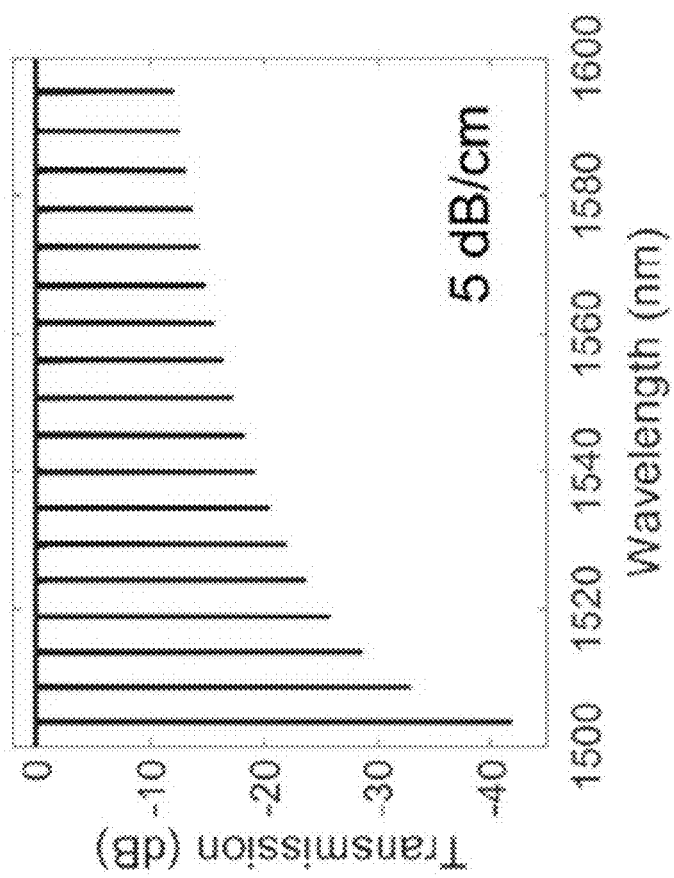
FIG. 10A is a graph that illustrates a calculated wavelength spectrum of an all-pass microring resonator with a 5 dB/cm loss and a 400 nm coupling gap according to various embodiments.

FIG. 10A is a graph that illustrates a calculated wavelength spectrum of an all-pass microring resonator with a 5 dB/cm loss and a 400 nm coupling gap according to various embodiments. The wavelength spectra of the all-pass microring resonator can be estimated from $$T(\lambda) = \frac{t^2 + A - 2t\cos(\phi)}{1 + t^2 A - 2\cos(\phi)} \quad (2)$$

where $t = \sqrt{1-K^2(\lambda)}$, A is the round-trip power attenuation, and $$\phi = \frac{2\pi}{\lambda} n_{eff}(\lambda) \times 2\pi R$$

is the round-trip phase accumulation inside the microring. The critical coupling condition occurs close to resonances for which $\approx \sqrt{A}$. The wavelength spectrum can be calculated by assuming a 5 dB/cm loss inside the microring and a coupling gap of 400 nm.

FIG. 10B is a graph that illustrates a calculated wavelength spectrum of an all-pass microring resonator with a 10 dB/cm loss and a 400 nm coupling gap according to various embodiments. The non-equal resonance extinctions can be caused by the dependence of the coupling coefficient on wavelength. For a 5 dB/cm loss, the critical coupling can happen close to Δ=1550 nm, and for a 10 dB/cm loss, the critical coupling can happen beyond Δ=1600 nm. Based on a predicted loss of less than 10 dB/cm, a gap size (e.g., of 400 nm) can result in the critical coupling condition occurring in the 1500-1600 nm wavelength range.

Figure 11B:
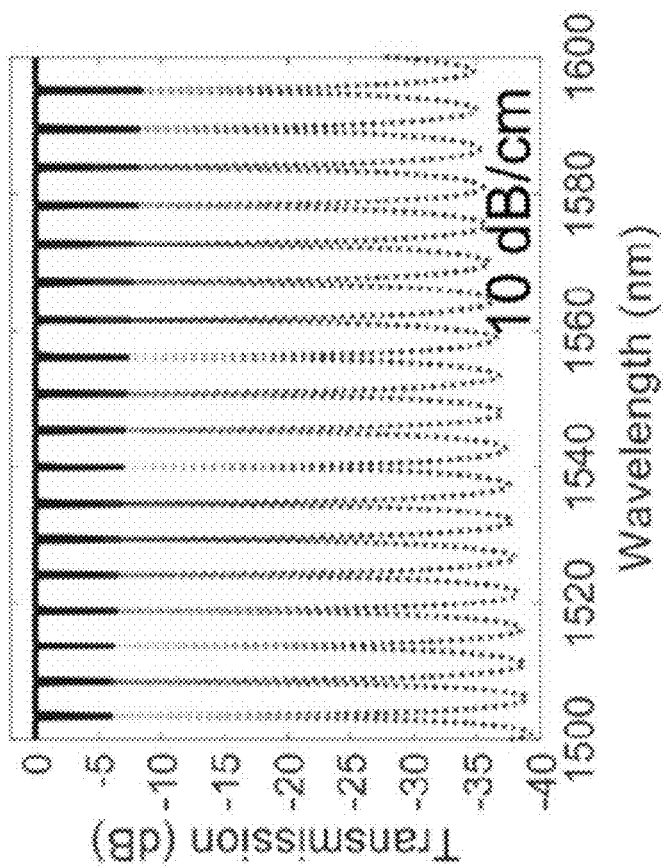
FIG. 11B is a graph that illustrates a calculated wavelength spectrum of an add-drop microring resonator with 10 dB/cm of loss according to various embodiments.
Figure 11A:
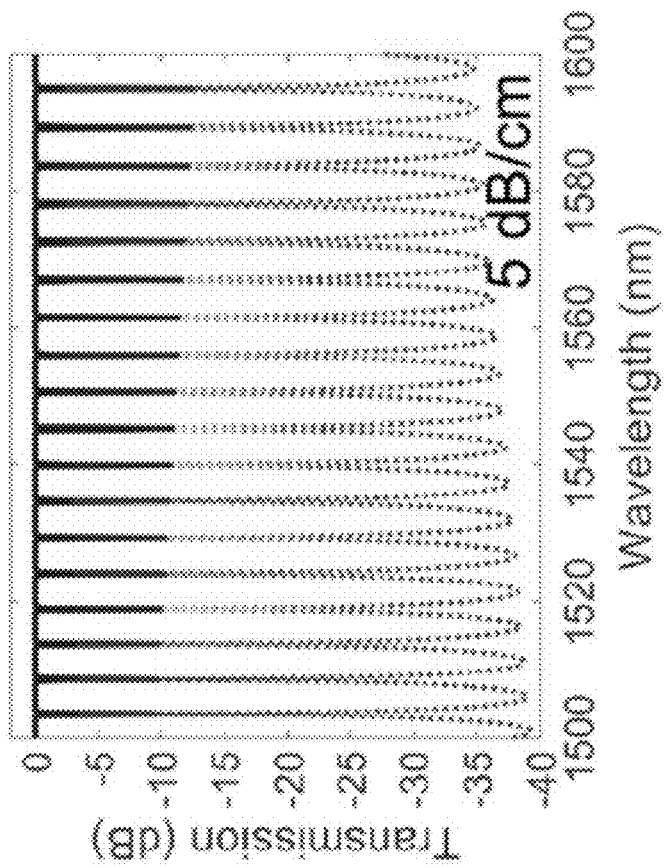
FIG. 11A is a graph that illustrates a calculated wavelength spectrum of an add-drop microring resonator with 5 dB/cm of loss and 400 nm coupling gaps according to various embodiments.

FIG. 11A is a graph that illustrates a calculated wavelength spectrum of an add-drop microring resonator with 5 dB/cm of loss and 400 nm coupling gaps according to various embodiments. The add-drop microring resonator can be designed with equal gaps at the input and drop ports so that the structures are perfectly symmetric. This can help ensure that the round-trip loss and the coupling coefficients can be extracted from the drop wavelength spectrum with minimal ambiguity or without any ambiguity. The wavelength spectra of add-drop microring resonator can be calculated from $$T(\lambda) = \frac{\kappa_1^2 \kappa_2^2}{1 + t_1^2 t_2^2 A - 2t_1 t_2 \cos(\phi)} \quad (3)$$

where $\kappa_1$ and $\kappa_2$ are the coupling coefficients of the input and drop ports, respectively. FIG. 11A shows the simulated wavelength spectra of the add-drop microring resonator with 400 nm gaps and 5 dB/cm of loss. The extinction of the through path (e.g., the extinction of the resonance spectrum) is approximately 10 dB and the extinction of drop path is approximately 37 dB.

FIG. 11B is a graph that illustrates a calculated wavelength spectrum of an add-drop microring resonator with 10 dB/cm of loss according to various embodiments. For the simulated wavelength spectra of FIG. 11B, the extinction of the through path is reduced to approximately 5 dB and the extinction of the drop path is approximately 33 dB.

Figure 12B:
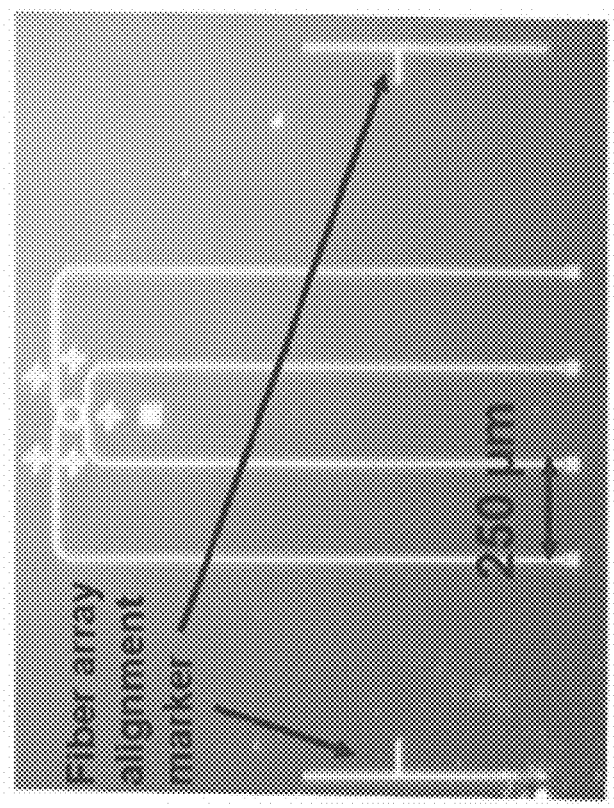
FIG. 12B is an optical microscope image of an add-drop microring resonator on the chip according to various embodiments.
Figure 12A:
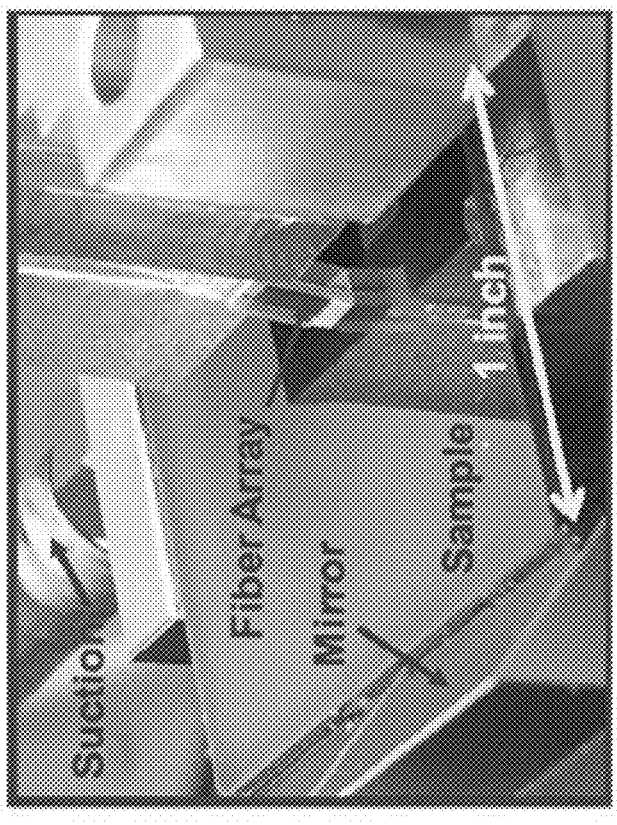
FIG. 12A is an image of a measuring stage according to various embodiments.

FIG. 12A is an image of a measuring stage according to various embodiments. A 1 inch×1 inch sample can be mounted on an XYZ stage and a fiber array (e.g., including four fibers with 250 µm pitch) can be used. Side mirrors can be used to view the height of the fiber array during alignment. The measuring stage can be used to obtain measurement results of the fabricated microring resonator. An analysis of the acquired data can be done to confirm the loss and coupling coefficients of the microring resonator. FIG. 12A shows a close-up image of the measuring stage with a sample (e.g., a fabricated 1 inch×1 inch sample) mounted on an XYZ stage with vacuum suction. The fabricated sample can have several all-pass microring resonators and several add-drop microring resonators with various coupling gap sizes. A four-fiber V-groove array with a pitch of 250 µm can be used for coupling light from single-mode fibers into the grating couplers. The vertical alignment can be done with assistance from the side mirrors, and the in-plane alignment can be done with assistance from the alignment markers that are placed on the LN sample. The marker positions can be based on the dimensions of the fiber array as shown in FIG. 12B.

FIG. 12B is an optical microscope image of an add-drop microring resonator on the chip according to various embodiments. The fiber alignment markers are also shown. A continuous wave (CW) tunable laser (e.g., a Santec 710 TSL) accompanied by a polarization controller (PC) can be used to control the wavelength, power, and polarization of the light inside the incoming fiber. The output lights from the through path and the drop path go to photodiodes. The generated photocurrents can be amplified by log-amplifier circuits and voltages can be read out by a data acquisition device, such as a National Instrument data acquisition device (NI DAQ), and imported into a software, such as LabView software. The output power of the laser can be set to 10 dBm, and the sweep range can be set from 1500 nm to 1600 nm. The number of samples is 50,000 which can yield a resolution of 2 pm for the sweep. This sweep resolution can be sufficient to resolve resonances with quality factors less than 50,000. The polarization controller can be set such that the output power from the through path of the microring resonator is maximized at an off-resonance wavelength.

Figures 13A, 13B:
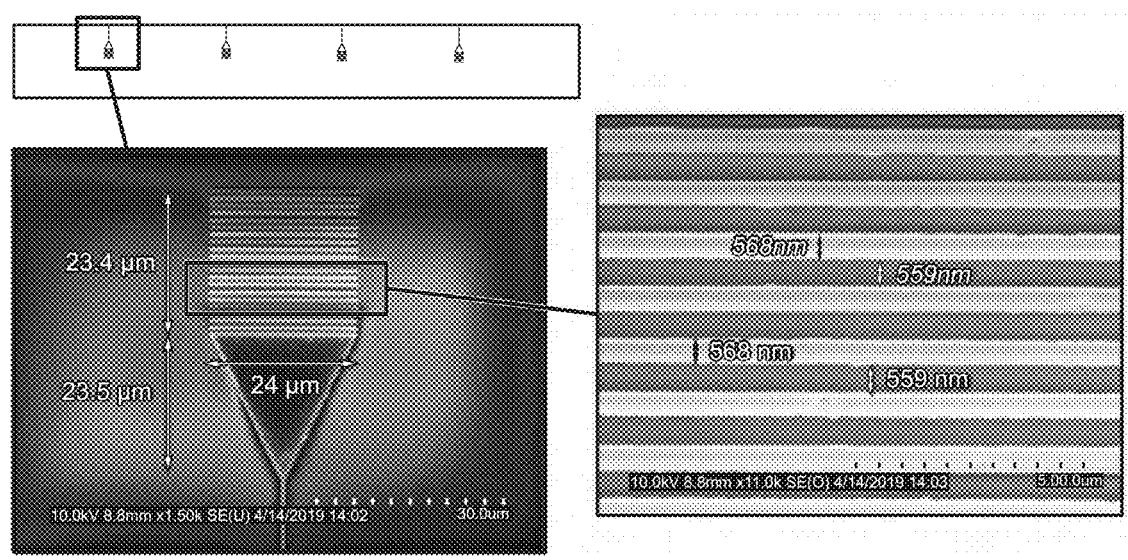
FIG. 13A is an SEM image of a top view of an array of four grating couplers according to various embodiments.
FIG. 13B is a zoomed-in view of the SEM image of a first grating of the array of four grating couplers according to various embodiments.

FIG. 13A is an SEM image of a top view of an array of four grating couplers according to various embodiments. FIG. 13B is a zoomed-in view of the SEM image of a first grating of the array of four grating couplers according to various embodiments. The pitch of fabricated grating is 1.127 µm and the number of grating periods is 20. Vertical grating couplers can be designed for TM polarization and fabricated to enable optical coupling to the chip. The pitch of the grating is 1.127 µm after fabrication, and the duty cycle is 50.4%.

Figure 14:
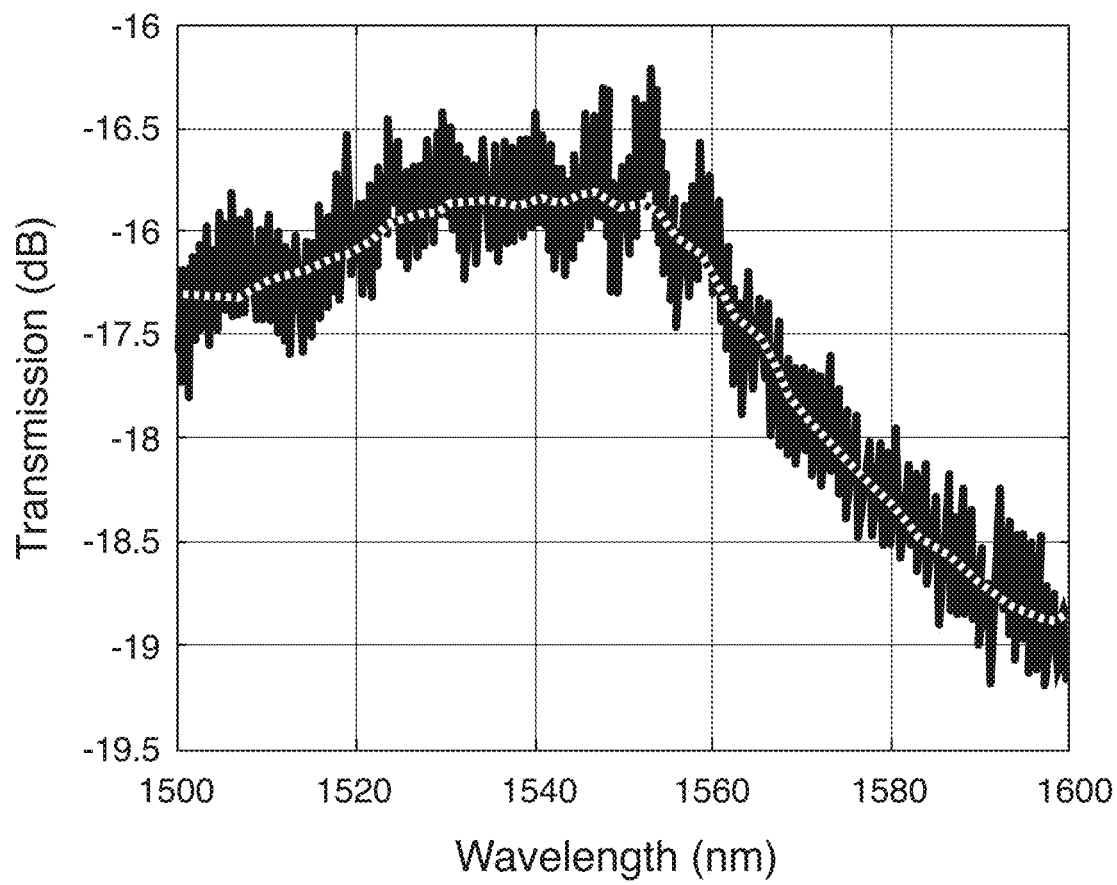
FIG. 14 is a graph that illustrates a measured coupling efficiency of one grating coupler according to various embodiments.

FIG. 14 is a graph that illustrates a measured coupling coefficient of one grating coupler according to various embodiments. A smoothed data curve is also shown as a guide for the eye. FIG. 14 shows the coupling efficiency of the grating coupler extracted from the transmission of two back-to-back gratings. Each grating can exhibit approximately 16.8 dB of loss at 1550 nm which can differ from the design due to fabrication errors that can alter the pitch and duty cycle from their design values. The 1 dB bandwidth of the fabricated gratings is greater than 60 nm, and the 3 dB bandwidth is greater than 100 nm. High coupling loss can be expected from the grating couplers because they are all fully etched. Grating couplers with a partial etch can exhibit better coupling coefficients.

FIG. 15A is an SEM image of a fabricated all-pass microring resonator according to various embodiments. Two back-to-back grating couplers 1500 are also included to extract the coupling loss of gratings.

FIG. 15B is a zoomed-in SEM image of the microring resonator and optical waveguide according to various embodiments. FIG. 15C is a zoomed-in SEM image of the coupling gap between the microring resonator and the optical waveguide according to various embodiments. The coupling gap between the optical waveguide and the microring is estimated to be 420 nm, which is 20 nm larger than a design value of 400 nm.

Figure 15D:
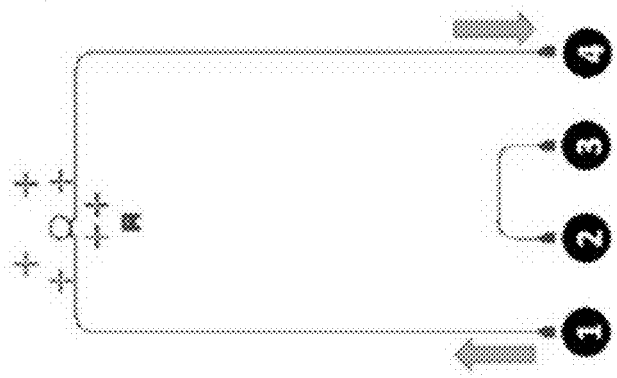
FIG. 15D is a schematic diagram of a microring resonator structure with the input and output paths of light according to various embodiments.

FIG. 15D is a schematic diagram of a microring resonator structure with the input and output paths of light according to various embodiments. The layout of the structure indicates that the light can be coupled into the chip from port 1 and can be measured at port 4.

Figure 16B:
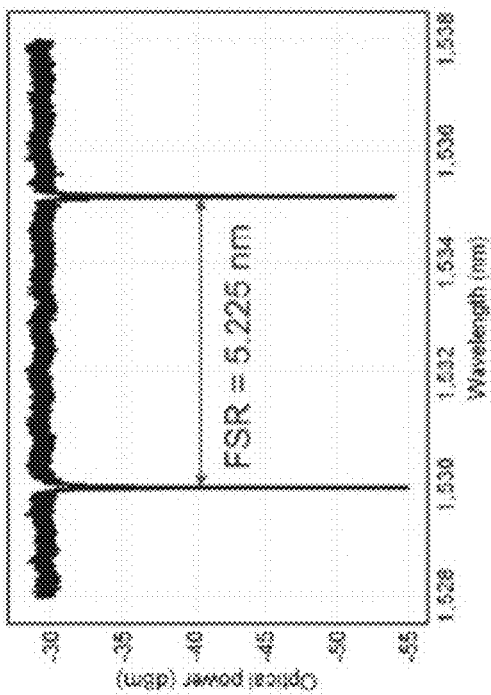
FIG. 16B is a graph that shows a zoomed-in view of the two resonances of FIG. 16A with the highest extinction according to various embodiments.
Figure 16A:
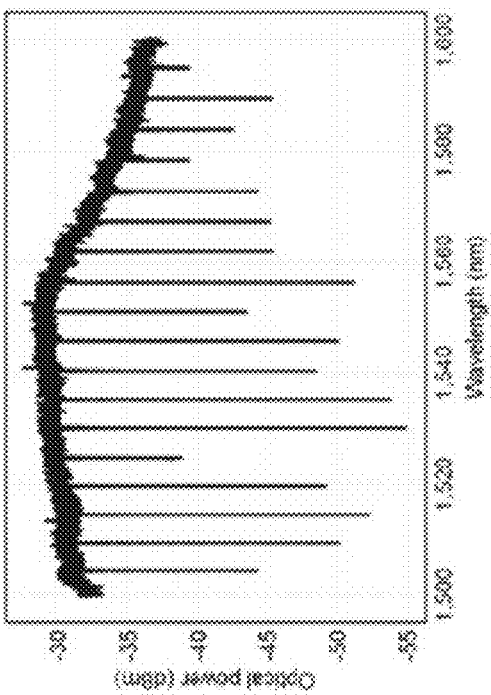
FIG. 16A is a graph that illustrates a measured wavelength spectrum of a fabricated microring resonator according to various embodiments.

FIG. 16A is a graph that illustrates a measured wavelength spectrum of a fabricated microring resonator according to various embodiments. It can be seen that the resonances of the microring resonator show very high extinction (of approximately 15-25 dB) with the highest extinction ratio (of approximately 25 dB) around 1530 nm.

FIG. 16B is a graph that shows a zoomed-in view of the two resonances of FIG. 16A with the highest extinction according to various embodiments. The FSR can be measured to be 5.225 nm. FIG. 16B shows denser sweep with a sweep resolution of 0.2 pm on the two resonances with the highest extinctions. The measured FSR is approximately 5.225 nm, which is slightly smaller than the design value of 5.26 nm. This reduction can indicate that the width of the LN optical waveguides might be slightly smaller than 800 nm. The width can be estimated to be approximately 790 nm.

Figures 17A, 17B:
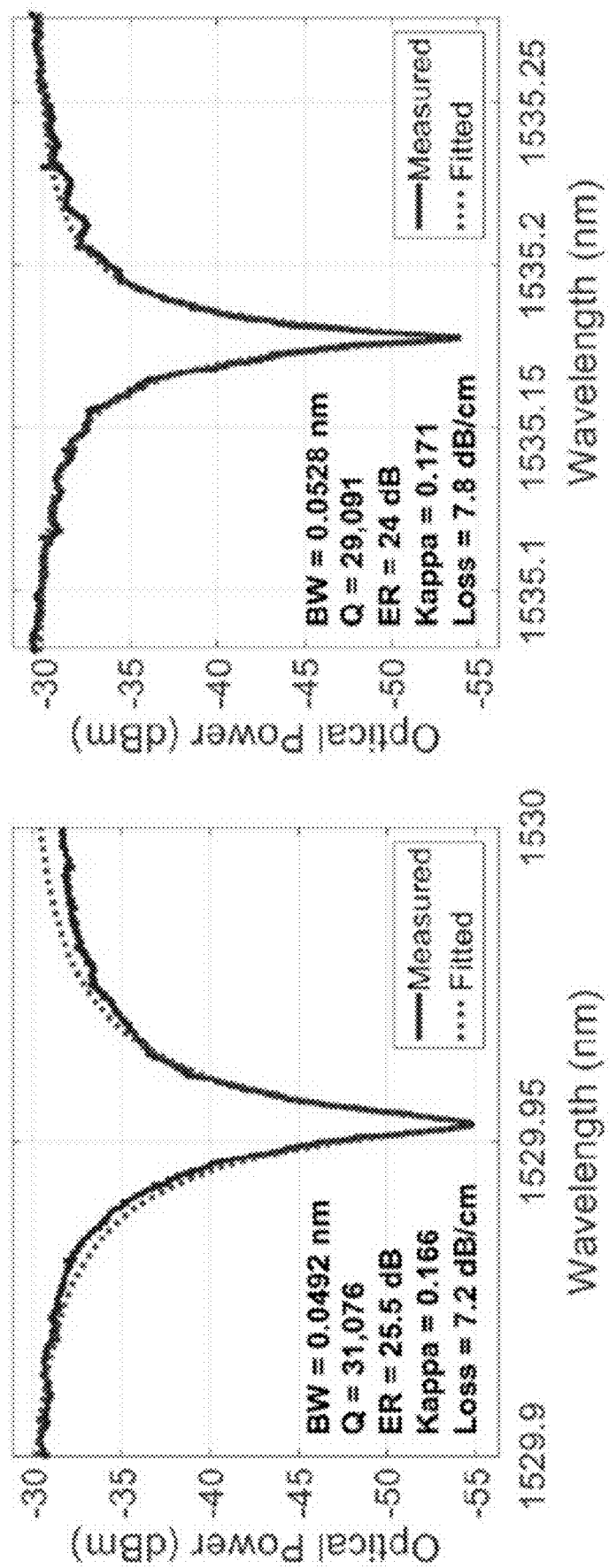
FIG. 17A is a graph that illustrates resonance attributes of the fabricated microring resonator close to 1530 nm according to various embodiments.
FIG. 17B is a graph that illustrates resonance attributes of the fabricated microring resonator close to 1535 nm according to various embodiments.

FIG. 17A is a graph that illustrates resonance attributes of the fabricated microring resonator close to 1530 nm according to various embodiments. The resonance can exhibit a high extinction of up to 25 dB. The spectral parameters (3-dB bandwidth, Q factor, kappa, round trip loss) can be extracted by matching Eq. (2) to the resonances at 1530 nm and 1535 nm, which have the highest extinction. FIG. 17A shows the result for the resonance close to 1530 nm. The extracted 3 dB bandwidth is 0.0492 nm (~6 GHz) and the quality factor is 31,000. The coupling coefficient is 0.166, which is very close to the analytic prediction of 0.165 at 1530 nm for TM polarization. The extracted loss of the microring resonator is approximately 7 dB/cm, which can be considered a reliable estimate of the loss due to the excellent match of the coupling coefficient. By assuming that this resonance is exactly at the critical coupling, the condition t≈ √A can result in a loss of 6.4 dB/cm. This result is in good agreement with the transmission wavelength spectra plotted in FIGS. 10A-10B.

FIG. 17B is a graph that illustrates resonance attributes of the fabricated microring resonator close to 1535 nm according to various embodiments. The resonance can exhibit a high extinction of up to 25 dB. FIG. 17B shows a result of a Lorentzian fitting to the resonance close to 1535 nm. The extracted bandwidth can be slightly increased to 0.0528 nm (~6.6 GHz), and the coupling coefficient can be increased to 0.171, which is in agreement with the analytic value of 0.168. The coupling coefficient increases with the wavelength. The extracted loss is approximately 7.8 dB which is slightly higher than the previous resonance. An average value of 7.5 dB/cm can be used as the loss of the fabricated microring resonator.

Figure 17C:
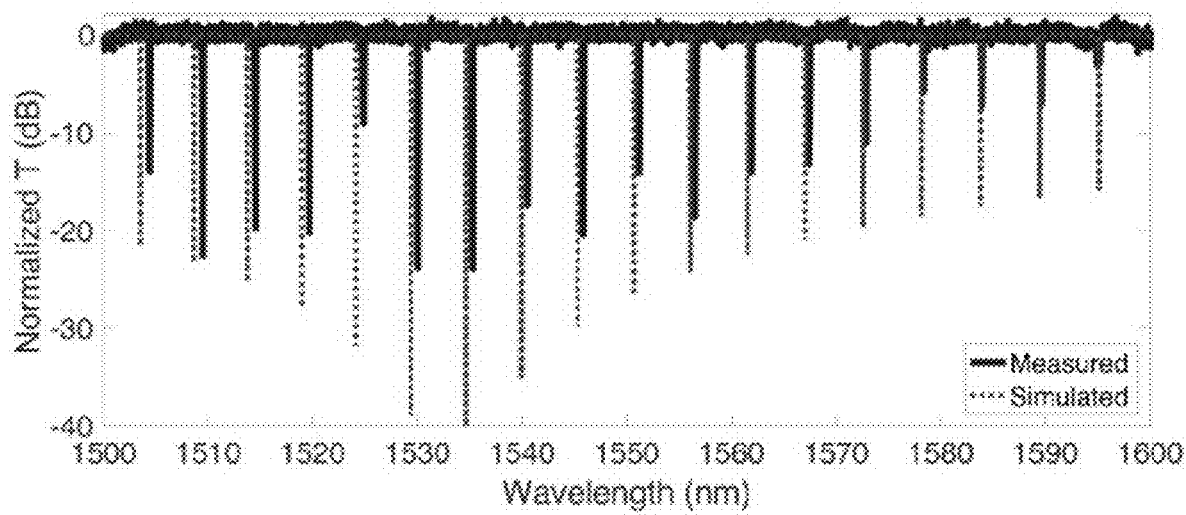
FIG. 17C is a graph that illustrates a comparison of a normalized measured wavelength spectrum with a simulated wavelength spectrum, assuming that critical coupling occurs around A=1530 nm (with a loss of approximately 6.5 dB/cm) according to various embodiments.

FIG. 17C is a graph that illustrates a comparison of a normalized measured wavelength spectrum with a simulated wavelength spectrum, assuming that critical coupling occurs around λ=1530 nm (with a loss of approximately 6.5 dB/cm) according to various embodiments. The normalized measured wavelength spectrum (obtained by removing the envelope due to the optical responses of the grating couplers) can be compared with the simulated wavelength spectrum, assuming that the critical coupling occurs close to λ=1530 nm. The results are plotted in FIG. 17C. Although the measured wavelength spectrum shows a smaller extinction than the simulated one, the reduction in the extinction of resonances away from λ=1530 nm on both sides agrees well with the observed behavior in the measured wavelength spectrum. As can be seen, the fully etched LNOI microring resonator has a good performance and operates in accordance with the design targets.

Figures 18A, 18B, 18C:
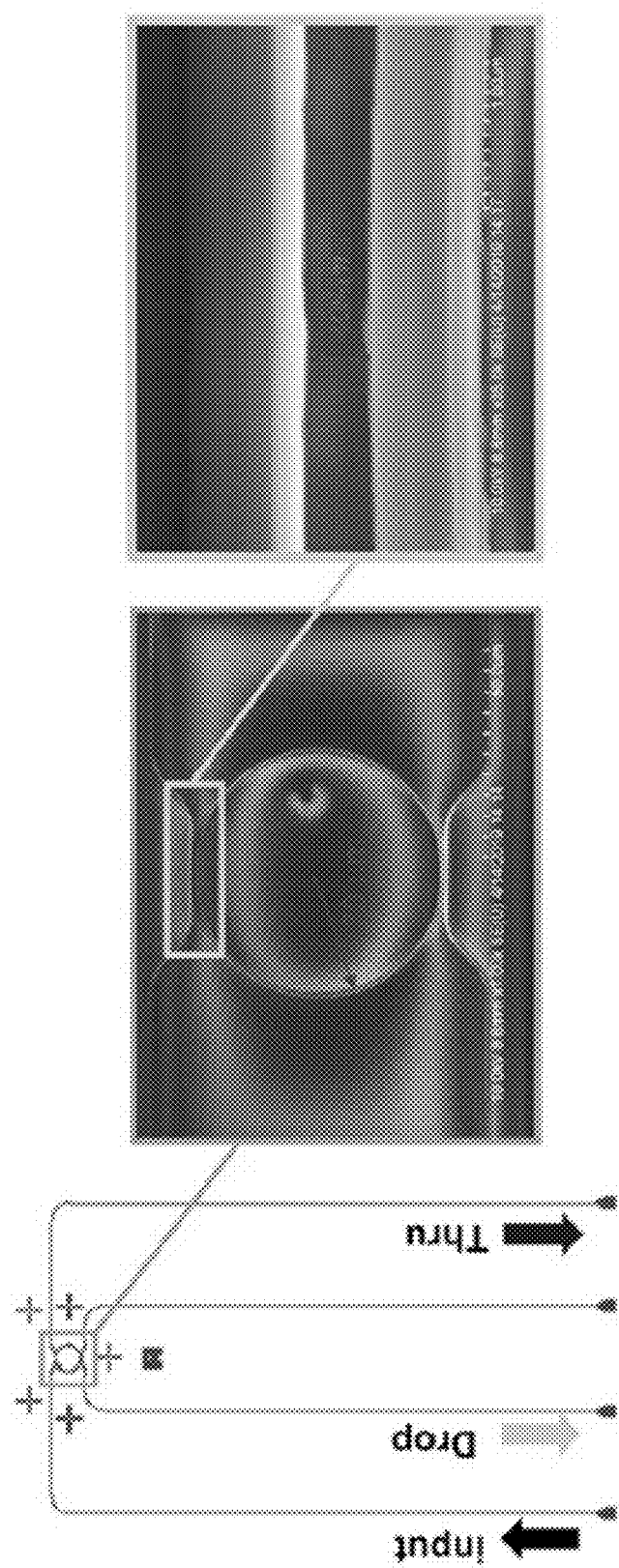
FIG. 18A is a schematic layout of the add-drop microring resonator according to various embodiments.
FIG. 18B is an SEM image of the add-drop microring resonator according to various embodiments.
FIG. 18C is a zoomed-in SEM image of the coupling gap between the top waveguide and the ring of an add-drop microring resonator according to various embodiments.

FIG. 18A is a schematic layout of the add-drop microring resonator according to various embodiments. The pitch of grating array is 250 μm. Symmetric add-drop structures can be designed for TM polarization and fabricated to further investigate the impact of coupling on the wavelength spectral response. Because symmetric add-drop microring resonator may never reach the critical coupling condition, extraction of coupling coefficients and the round-trip loss of the microring resonator from the drop wavelength spectrum is possible. FIG. 18A shows the layout of the add-drop microring resonator with 400 nm coupling gaps at the input and drop ports. The fiber array can be aligned with the four gratings and the drop and through wavelength spectra can be simultaneously captured by sweeping the tunable laser with 2 pm resolution.

FIG. 18B is an SEM image of the add-drop microring resonator according to various embodiments. FIG. 18C is a zoomed-in SEM image of the coupling gap between the top waveguide and the ring of an add-drop microring resonator according to various embodiments. The size of the gap can be estimated to be 405 nm. The estimation of the coupling gap of 405 nm, is very close to the original design of 400 nm.

Figure 19A:
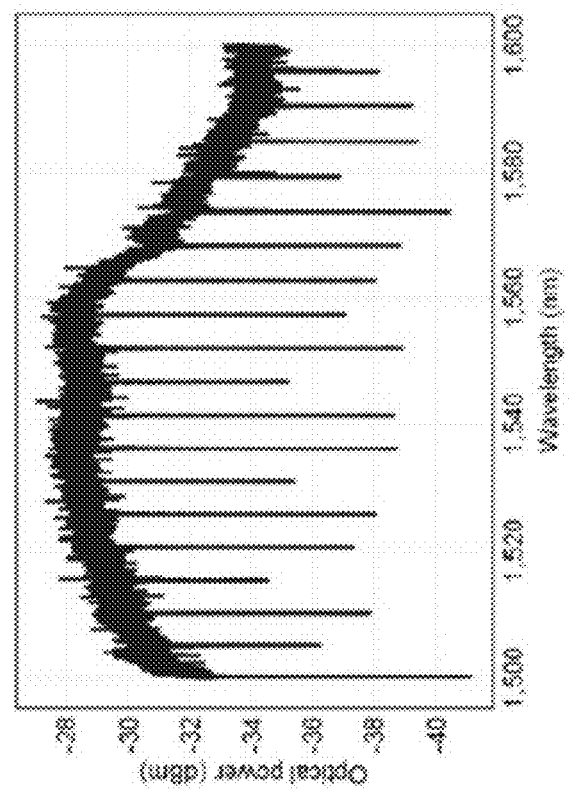
FIG. 19A is graph that illustrates a measured wavelength spectrum of the through path of the add-drop microring resonator according to various embodiments.

FIG. 19A is graph that illustrates a measured wavelength spectrum of the through path of the add-drop microring resonator according to various embodiments. The through wavelength spectrum exhibits an extinction of approximately 10 dB. An extinction much less than 30 dB can be expected for the through path because the all-pass microring resonator is close to the critical coupling whereas the add-drop microring resonators include an extra coupling that sets it farther from the critical coupling operation (as illustrated in FIG. 19B).

Figure 19B:
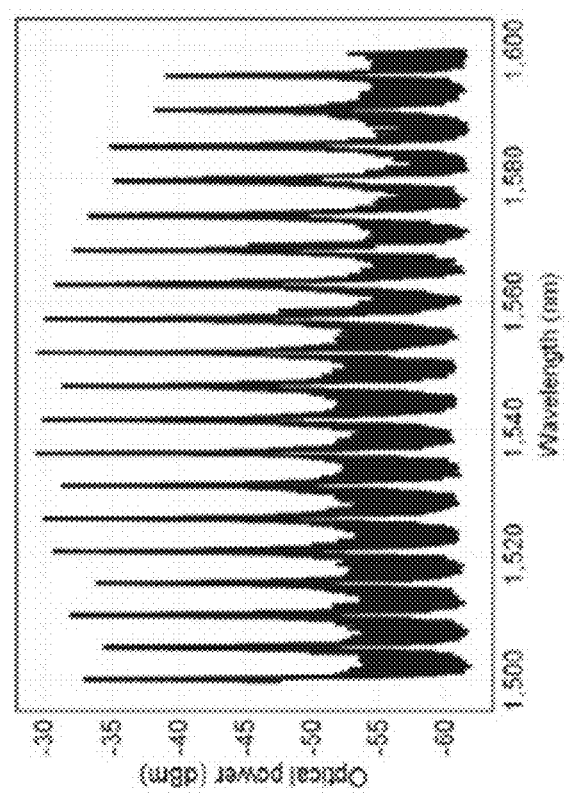
FIG. 19B is a graph that illustrates a measured wavelength spectrum of the drop path of the add-drop microring resonator according to various embodiments.

FIG. 19B is a graph that illustrates a measured wavelength spectrum of the drop path of the add-drop microring resonator according to various embodiments. The drop wavelength spectrum has an extinction of approximately 30 dB. The measured FSR of the add-drop microring resonator is 5.268 nm, which agrees well with the analytical estimation of 5.26 nm for the 800 nm×560 nm waveguide.

Figure 20B:
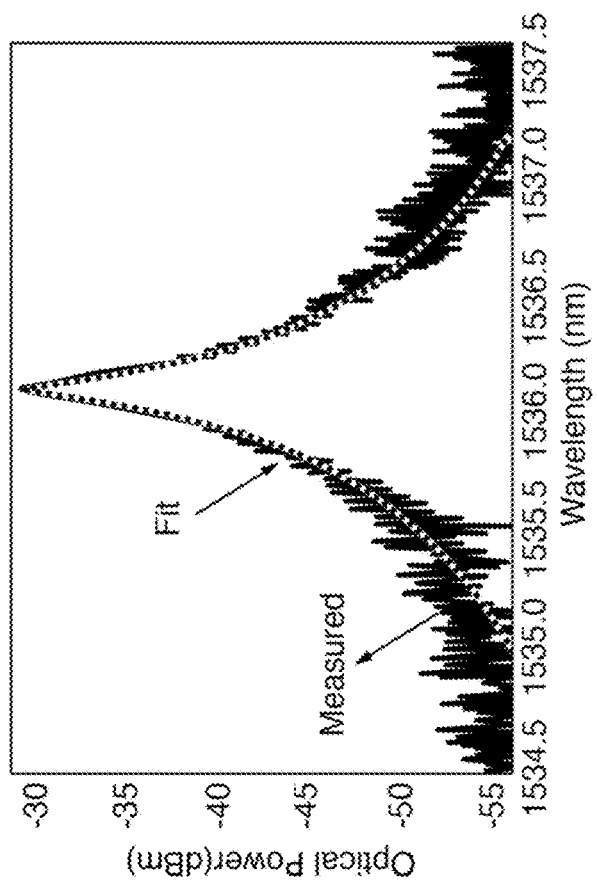
FIG. 20B is a graph that illustrates a zoomed-in view of the resonances of the drop wavelength spectrum of the add-drop microring resonator according to various embodiments.
Figure 20A:
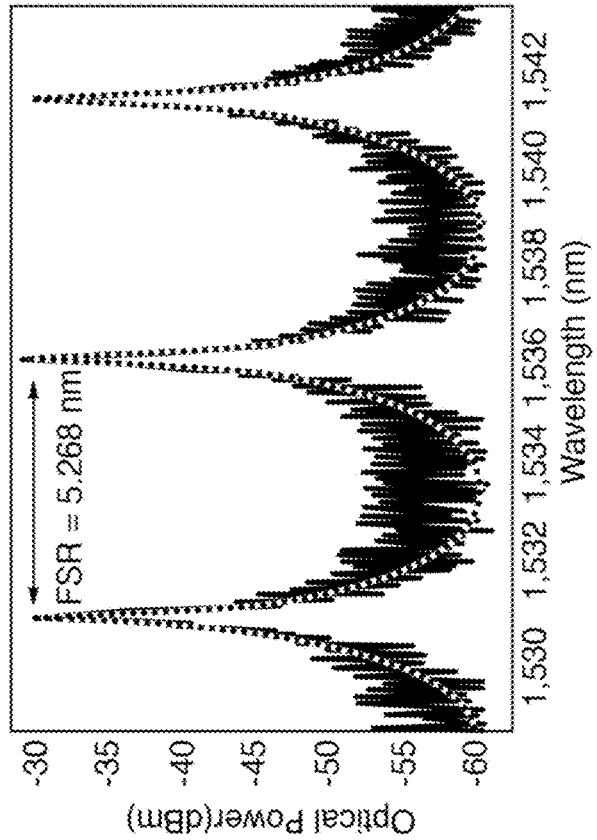
FIG. 20A is a graph that illustrates a measured drop wavelength spectrum of the add-drop microring resonator and a fitted curve according to various embodiments.

FIG. 20A is a graph that illustrates a measured drop wavelength spectrum of the add-drop microring resonator and a fitted curve according to various embodiments. FIG. 20B is a graph that illustrates a zoomed-in view of the resonances of the drop wavelength spectrum of the add-drop microring resonator according to various embodiments.

The FSR is approximately 5.268. The Lorentzian response of Eq. (3) can be matched to the measured wavelength spectrum assuming that the input coupling and drop coupling coefficients are identical. The result of the matching is shown in FIGS. 20A-20B where a good agreement is shown. The bandwidth of the drop resonance can be extracted to be approximately 0.108 nm (at approximately 13.5 GHz) which is approximately twice the bandwidth of its all-pass counterpart (the measured ratio is approximately 2.16). This can be expected because the bandwidth of the all-pass structure is given by $$FWHM_{all-pass} \approx \frac{FSR_{nm}}{2\pi}(2\pi R\alpha + \kappa^2) \qquad (4)$$

and the bandwidth of the add-drop structure is given by $$FWHM_{add-drop} \approx \frac{FSR_{nm}}{2\pi}(2\pi R\alpha + \kappa_1^2 + \kappa_2^2) \qquad (5)$$

where α is the power attenuation inside the ring (units of cm$^{-1}$). Therefore, setting α≈1.65 cm$^{-1}$ (equivalent to 7 dB/cm), K=0.166 (e.g., the simulated coupling of the all-pass microring resonator with a 420 nm gap), $\kappa_1$=$\kappa_2$≈0.2 (e.g., the simulated coupling of an add-drop microring resonator with a 400 nm gap), and the respective measured FSR values (5.225 nm for the all-pass and 5.268 nm for the add-drop) yields a bandwidth ratio of 2.05 which again agrees well with the measured ratio.

Figure 20D:
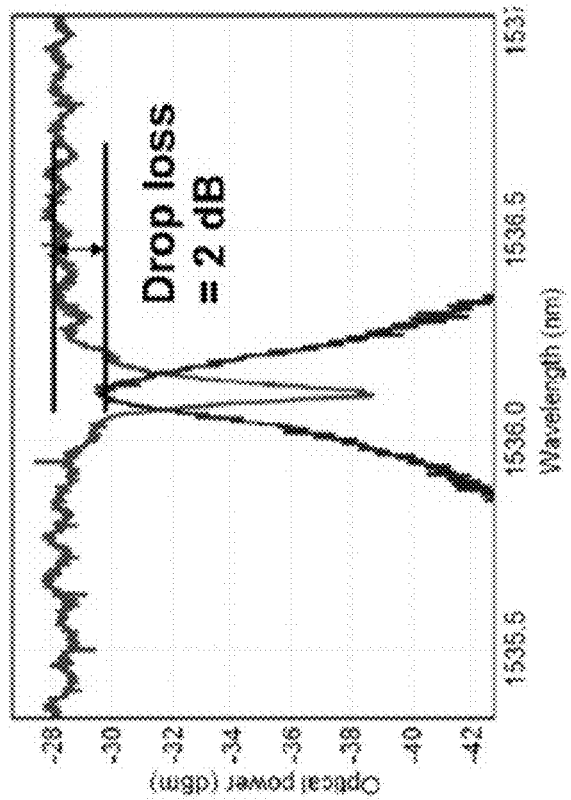
FIG. 20D is a graph that illustrates a zoomed-in view of the through and drop wavelength spectra of the add-drop microring resonator according to various embodiments.
Figure 20C:
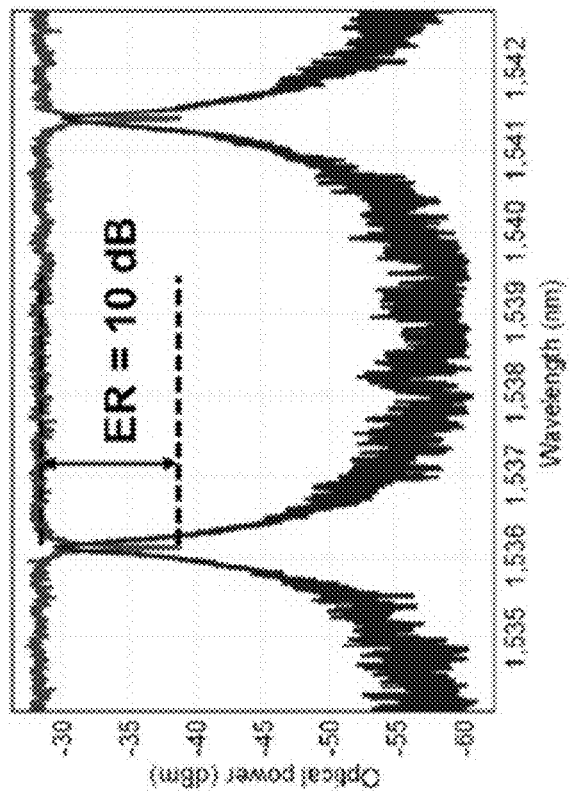
FIG. 20C is a graph that illustrates both the through wavelength spectrum and drop wavelength spectrum of the add-drop microring resonator according to various embodiments.

FIG. 20C is a graph that illustrates both the through wavelength spectrum and drop wavelength spectrum of the add-drop microring resonator according to various embodiments. The extinction of the through path is approximately 10 dB. This agrees well with the plot presented in FIG. 11A.

FIG. 20D is a graph that illustrates a zoomed-in view of the through and drop wavelength spectra of the add-drop microring resonator according to various embodiments. The relative loss of the drop path at the resonance is approximately 2 dB. FIG. 20D shows that the relative loss of drop path compared to the through path is approximately 2 dB, which is slightly better than the predicted 3 dB of loss in the simulations.

The grating response envelope in the measured wavelength spectrum of the through path in FIG. 19A can be removed and compared to the simulated wavelength spectrum with approximately 7 dB/cm of round-trip loss. The result is plotted in FIG. 21, showing that the observed approximately 10 dB of extinction is expected from the simulations.

Figure 21:
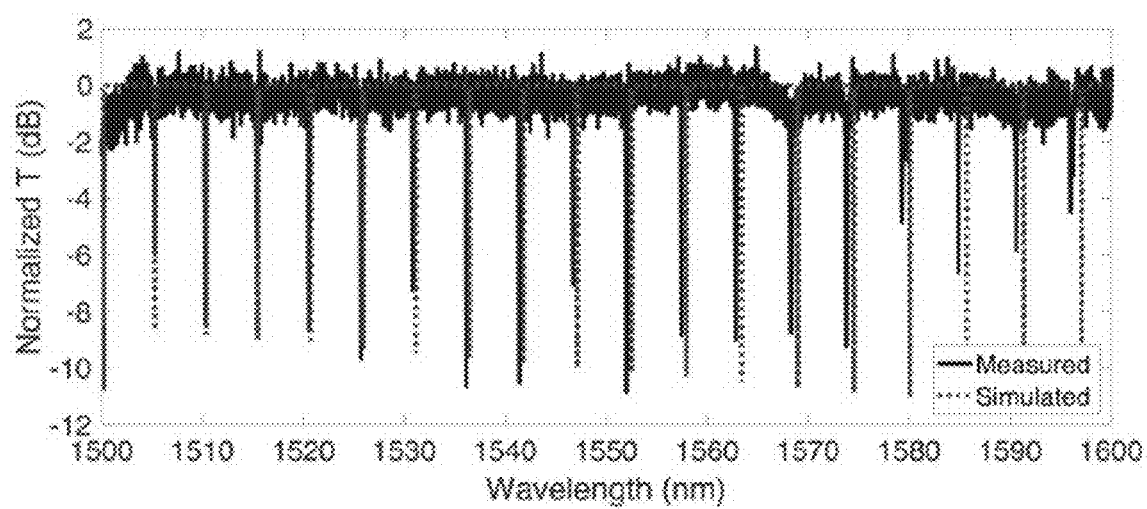
FIG. 21 is a graph that illustrates a comparison of the normalized measured wavelength spectrum of the through path of the add-drop microring resonator with the simulated wavelength spectrum according to various embodiments.

FIG. 21 is a graph that illustrates a comparison of the normalized measured wavelength spectrum of the through path of the add-drop microring resonator with the simulated wavelength spectrum according to various embodiments. A good agreement is observed in the extinctions of the resonances (— 10 dB). The microring resonator design is a fully isotropic (no sensitivity to in-plane orientation) microring resonator in thin-film lithium niobate (Z-cut) on insulator in the form of all-pass and add-drop structures based on fully-etched single-mode (TM polarization) strip waveguides (800 nm×560 nm). Vertical grating couplers can be designed and fabricated on the chip to enable optical input-output. The observed loss of microring resonators was is approximately 7 dB/cm with the critical coupling occurring around a coupling gap of 400 nm between the ring and waveguide. The fabricated all-pass microring resonator can have an extinction of approximately 25 dB (close to critical coupling), an optical bandwidth of approximately 6 GHz with an FSR of approximately 5.23 nm while the add-drop microring resonator can have an extinction of approximately 10 dB and bandwidth of approximately 13 GHz. The predicted wavelength spectral parameters of the microring resonators match well with the measured results which can indicated the consistency in the fabrication and the high accuracy of the modeling. Compact and fully isotropic optical modulators in thin-film lithium niobate are highly feasible.

The follow description, with respect to at least FIGS. 22-39 relate to applying the above-described microring resonators in the context of microring modulators. The large electro-optic coefficient, $r_{33}$, of thin-film LNOI allows it to be used for high-efficiency optical modulators. Using the fundamental TM optical mode in Z-cut LN can enable isotropic in-plane devices; however, realizing a strong vertical electric field to capitalize on $r_{33}$ can be challenging. One solution may be to implement a symmetric electrode configuration to boost the vertical field strength inside a fully-etched single-mode LN waveguide, also referred to as a microring resonator herein. Such a design can allow for an ultra-compact fully isotropic microring modulator with a high electro-optic tuning efficiency of 9 pm/V, extinction ratio of 20 dB, and modulation bandwidth beyond 28 GHz. Under quasi-static operation, the tuning efficiency of the modulator can reach 20 pm/V. In addition to fast, efficient, high-contrast modulation, benefits to optical communication systems include large quasi-static efficiency. Such benefits can enable post-fabrication trimming, thermal compensation, and even complete reconfiguration of microring-based sensor arrays and photonic integrated circuits.

As discussed above, LN, especially thin-film LN, may offer advantages towards integrated photonics. Due to the higher optical index of LN compared to silicon oxide ($n_{LN} \approx 2.2$, $n_{SiO_2} \approx 1.44$), LN-based waveguides can provide strong optical confinement when surrounded with either air or $SiO_2$. This can enable a transition from traditional etchless LN waveguides (e.g., titanium diffused or proton exchange) with low index contrast and large mode field diameter (MFD) to fully or partially etched subwavelength waveguides with dimensions of less than 1 μm over the optical S-, C-, and L-bands ($\lambda=1460$-1625 nm). The inertness of LN to etching can result in necessity of the use of hybrid waveguides with micro-machined silicon (Si), silicon nitride (SiN), or tantalum pentoxide ($Ta_2O_5$) for mode confinement. The hybrid approach can eliminate the need for etching LN, but may result in low optical confinement in the LN and degrade the electro-optic performance.

Some electro-optics implement in LN on insulator. Some examples are listed. First, partially etched Z-cut LN waveguides with top and bottom electrodes. These typically require a very large footprint and a metal electrode underneath the buried oxide layer. Although good optical confinement for the transverse magnetic (TM) mode in LN can require a thick buried oxide layer (e.g., greater than 2 μm), these devices can exhibit poor electro-optic efficiency (1.05 pm/V, 3 pm/V). Second, partially etched X-cut LN waveguides can be designed with side electrodes directly placed on the LN waveguide with no buffer layer in between. The use of X-cut thin films can restrain the orientation of the electrodes and impose a fundamental limit on the electro-optic performance of microring modulators. Third, proton-exchanged X-cut LN waveguides can be designed with side electrodes. Low optical confinement and the use of X-cut LN (e.g., orientation dependence) limit the capabilities of this approach. Fourth, hybrid (heterogeneous) X-cut or Z-cut waveguides can be designed. However, this approach does not involve etching of LN, hence prohibiting the highest possible optical confinement in LN. Furthermore, the demonstrated fabrication process is complex and requires multiple materials such as Si, BCB, and Nickel silicide.

In contrast, a symmetric electrode design paradigm to realize strong vertical fields in monolithic Z-cut thin-film LN electro-optic devices may be implemented. Such design does not require a metal plane beneath the buried oxide or any additional material besides $SiO_2$ for the cladding and metals for the electrodes. Hence, it provides the advantage of a straightforward fabrication process that does not require patterning prior to the LN film transfer. Further, the designed microring resonator allows for a modulator that can exhibit the following approximate characteristics: 20 pm/V of quasi-static resonance tunability, a 20-dB extinction ratio, a very small 60-μm diameter footprint, a capacitance as low as 39 fF, and a modulation bandwidth exceeding 28 GHz. Such characteristics indicate a wide tuning range, which can allow for a high performance, monolithic, isotropic, thin-film LN platform.

The design efficient electro-optic microring modulators can be considered into two parts as described below. A first part includes designing of passive structures without the electrodes. The single-mode operation of the fully etched waveguides (e.g., for maximum optical confinement) can be achieved by selecting the thickness of the LN thin-film to be about 560 nm (e.g., between approximately 500 nm and 600 nm) and the waveguide width to be 1 μm (e.g., between approximately 0.8 μm and 1.5 μm). A width of 850 nm can be used, and further verified by scanning electron microscopy (SEM) to be 800-900 nm. Grating couplers can also be designed and implemented with fully etched gratings and a short taper appendix to allow vertical coupling of light, which can facilitate die-level testing of multiple devices. The coupling efficiency is −16 dB per coupler. The bending radius threshold of waveguides for very low radiation loss (<1 dB/cm) can be calculated to be ~25 μm; hence, a 30-μm radius is used as an illustrative example. This small radius can result in a free spectral range (FSR) of ~5.5 nm at $\lambda=1550$ nm. The propagation loss of the fully etched waveguides, as well as the passive ring resonator, was measured to be ~7-10 dB/cm. Using this value, the coupling between the ring and the bus waveguide can be designed (~400-nm gap) such that the critical coupling is reached at $\lambda=1550$ nm.

Figure 22A:
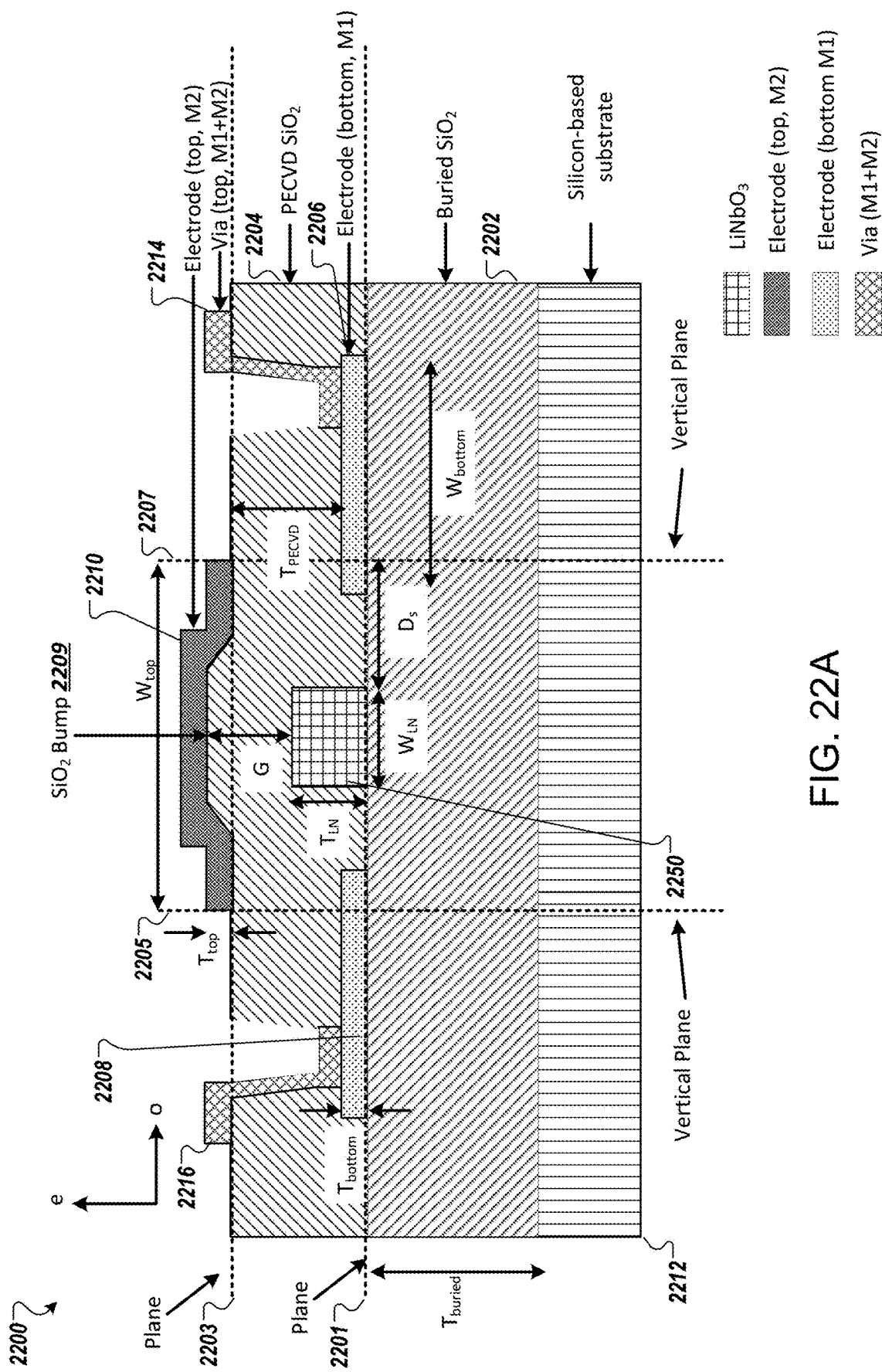
FIG. 22A is a schematic diagram of a cross-section 2200 of the microring modulator according to various embodiments.

FIG. 22A is a schematic diagram of a cross-section of the microring modulator 2200 according to various embodiments. As described in more detail below, the microring modulator 2200 or a system including the microring modulator 2200 may include a buried oxide layer 2202, a microring resonator 2250, an optical waveguide 2230 (FIG. 22B), an oxide layer 2204, and a set of electrodes (including at least an inner electrode 2206, an outer electrode 2208, and a top electrode 2210). The buried oxide layer 2202 may be disposed on a substrate 2212. The microring resonator 2250 and the optical waveguide 2230 may be disposed on the buried oxide layer 2202 and within the oxide layer 2204, which in one embodiment, is a bonded semiconductor layer.

In some embodiments, the optical waveguide 2230 is optically coupled to the microring resonator 2250, and may input an optical wave into the microring resonator. The optical wave may be generated by an input light source (such as a laser, LED, or other light source). In addition, the oxide layer 2204 may be deposited on top of and bonded to the optical waveguide 2230 and the microring resonator 2250. The oxide layer 2204 (e.g., a top oxide cladding layer) can provide enough spacing between the optical waveguide and the electrodes (2206-2210), such that the electrodes do not produce excessive optical loss due to their proximity to the optical waveguide 2230. Electrodes (top and bottom, as described below) may be located adjacent to the microring resonator 2250, and in response to an electrical signal, the electrodes 2206-2210 can modulate the optical wave into a modulated optical wave of transverse magnetic polarization within the microring resonator 2250 and further output the modulated optical wave to the optical waveguide 2230. The electrodes may then output the modulated optical wave to the optical waveguide 2230.

The electrodes may include an inner electrode 2206, an outer electrode 2208, and a top electrode 2210. The inner electrode 2206 and the outer electrode 2208 may be located on the buried oxide layer 2202 and each offset from the microring resonator 2250 (e.g., the inner electrode 2206 may be offset from an inside of the microring resonator; and the outer electrode may be offset from an outside of the microring resonator). The top electrode 2210 may be located on top of the deposited oxide layer and centrally above the microring resonator 2250. Each of the electrodes may be configured in a circular pattern for the microring modulator.

The inner electrode 2206, the outer electrode 2208, and the microring resonator 2250 may be concentric in a first plane 2201 and the top electrode 2210 may be located in a second plane 2203 that is parallel to the first plane 2201. A first via 2215 may be deposited between the inner electrode 2206 and a top of the bonded semiconductor layer, e.g., the oxide layer 2204. And second via 2216 may be deposited between the outer electrode 2208 and the top of the bonded semiconductor layer. The first and second vias 2215 and 2216 may be coupled to a ground potential and the top electrode 2210 may be coupled to a signal terminal. The electrodes may be made of gold or other conductive material. The first and second vias may bring the electrical contact of the inner and outer electrodes to the second plane.

Figures 22B, 22C:
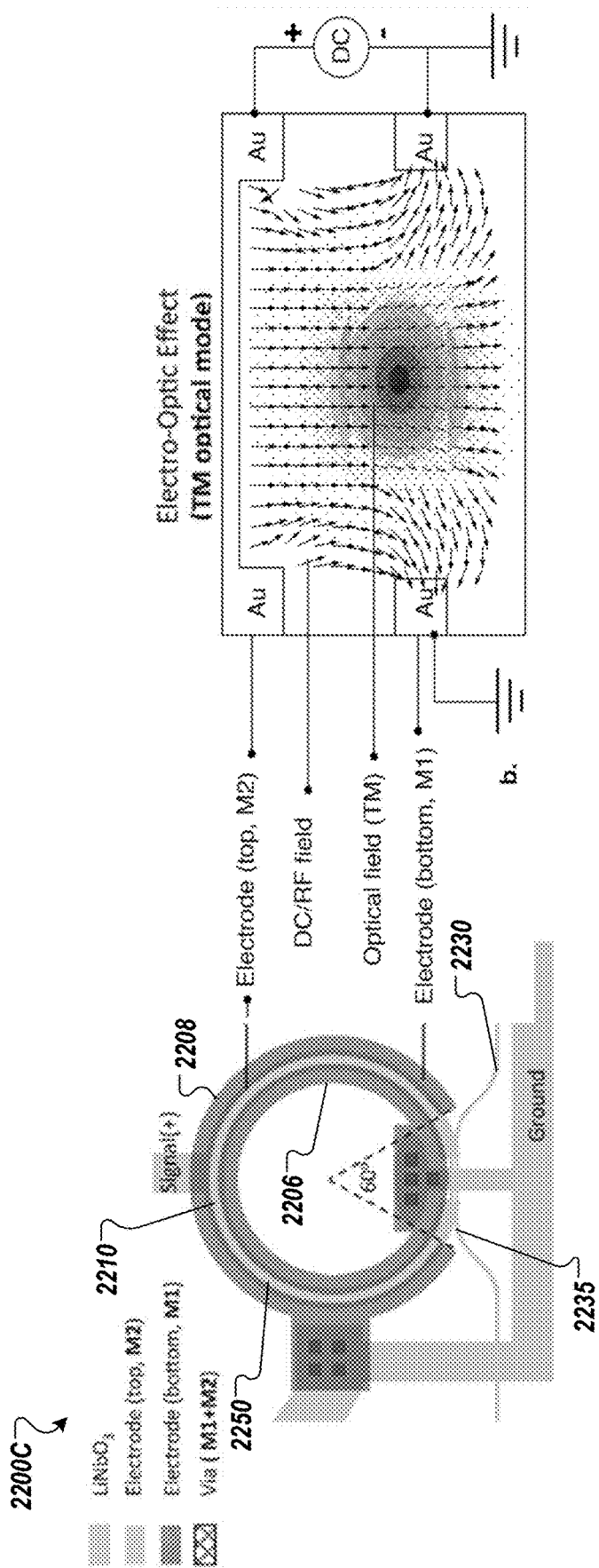
FIG. 22B is a graph that illustrates the electric field profile of the optical TM mode of the microring resonator and the arrow plot of the DC field induced between the top and bottom electrodes of FIG. 22A according to various embodiments.
FIG. 22C is a schematic diagram of an isotropic microring modulator with the inclusion of metallic vias so that the inner M1 electrode can be connected to the outer M1 electrode according to various embodiments.

Further, inner sidewalls and outer sidewalls of the top electrode 2210 may be located within a first vertical plane 2205 and a second vertical plane 2207 respectively. The inner sidewall of the outer electrode 2208 may extend past the first vertical plane 2205 toward the second vertical plane 2207, and the outer sidewall of the inner electrode 2206 extend past the second vertical plane 2207 toward the first vertical plane 2205. A height (e.g., thickness) of the inner and outer electrodes may be between approximately a quarter and a half of a height of the microring resonator. By designing bottom electrodes (e.g., the inner and outer electrodes) to include a portions that are directly beneath the top electrode, vertical electric fields, as depicted in FIG. 22B can be generated.

The optical waveguide 2230 may include a protruded portion 2235 that is optically coupled to the microring resonator 2250. In some embodiments, the inner electrode 2206, the outer electrode 2208, and the microring resonator 2250 are circular, or substantially circular, in shape. In some embodiments, a portion of the inner electrode 2206 may not complete a full circle, and the portion includes a gap that may be occupied by the protruded portion 2235 of the optical waveguide. The microring resonator 2250 and the top electrode 2210 may be separated by a distance of between approximately 200 nm and 2000 nm, and the inner and outer electrodes may be separated from each other by a distance between approximately 500 nm and 5000 nm.

There may also be at least one light source that generates the optical wave. A first grating coupler (e.g., a vertical grating coupler) may be coupled between the light source and an input of the optical waveguide, and may provide the optical wave from the light source to the optical waveguide. A second grating coupler may be coupled to an output of the optical waveguide to output the modulated optical wave.

The thickness T buried of the buried oxide layer situated above a silicon-based substrate can be between 2 μm and 3 μm (e.g., 2 μm, 2.5 μm, 3 μm, etc.) over a wafer. Electrodes may allow for the structure to be implemented as an electro-optic phase shifter. As shown in FIG. 22A, a symmetric electrode arrangement including two metal strips on the sides (bottom metal layer) and one metal strip on the top (top metal layer) can be used to generate a near-vertical DC or RF field is induced inside the LN microring resonator 2250 when an external voltage is applied. The thickness of the bottom metal electrode (M1) can be between approximately 100 nm and 200 nm (e.g., 100 nm, 150 nm, 200 nm, etc.). The thicknesses of the top metal (M2) $T_{top}$ can be between approximately 250 nm and 350 nm (e.g., 250 nm, 300 nm, 350 nm, etc.). A width $W_{Top}$ of the top metal can be between approximately 4 μm and 6 μm (e.g., 4 μm, 5 μm, 6 μm, etc.). There may be a gap G between the microring resonator 2250 and the top electrode, which may be between approximately 200 nm and 2000 nm (e.g., 200 nm, 700 nm, 2000 nm, etc.) A thickness T buried of the buried oxide layer can be between 2 μm and 3 μm (e.g., 2 μm, 2.5 μm, 3 μm, etc.). The waveguide can have a width $W_{LN}$ between approximately 0.6 μm and 1.2 μm (e.g., 0.6 μm, 0.85 μm, 1.2 μm, etc.). The waveguide can have a thickness $T_{LN}$ between approximately 400 nm and 800 nm (e.g., 400 nm, 550 nm, 560 nm, 580 nm, 680 nm, etc.). A thickness $T_{PECVD}$ of the PECVD SiO$_2$ layer can be between approximately 0.5 μm and 1.5 μm (e.g., 0.5 μm, 0.95 μm, 1.5 μm, etc.). Each edge of the microring resonator 2250 can be separated from a corresponding adjacent bottom electrode by a distance Ds between approximately 0.25 μm and 2.5 μm (e.g., 0.25 μm, 0.55 μm, 2.5 μm, etc.). A radius of the microring resonator 2250 may be between approximately 1 μm and 1000 μm (e.g., 1 μm, 30 μm, 1000 μm, etc.).

In some embodiments, the microring modulator 2200 is an optical modulator and may include an optical waveguide 2230 and a microring resonator 2250 located on a buried oxide layer. The microring resonator 2250 may be optically coupled to the optical waveguide 2230. The optical modulator 2200 may include vertical grating couplers. One vertical grating coupler may be coupled to an input port of the optical waveguide and also to an optical source. The optical source may generate a first optical wave. Another vertical grating coupler may be coupled to an output port of the optical waveguide 2230 to output a second optical wave that is a result of an interaction between the first optical wave and the microring resonator. In some embodiments, the first and second optical waves have TM polarization.

In some embodiments, the optical modulator 2200 includes an all-pass microring resonator. In other embodiments, the optical modulator may include an add-drop microring resonator. Additionally or alternatively, the optical modulator 2200 may include a second optical waveguide that is optically coupled to the microring resonator. The optical modulator may include an additional (third) vertical grating coupler coupled to the second optical waveguide to output a third optical wave, which results from an interaction between the first optical wave and the microring resonator.

In some embodiments, the first optical waveguide may be coupled to the microring resonator at one point of the microring resonator. In the case where there exists a second optical waveguide, it may be coupled to the microring resonator at a second point of the microring resonator. In some embodiments the second point is located opposite (e.g., across a diameter) from the first point of the microring resonator. In some embodiments, the first and/or second optical waveguides may be otherwise coupled to the microring resonator (e.g., coupled via a portion of the microring resonator). For example, they can be coupled via point coupling, extended coupling, inverted coupling (e.g., the gap between the microring resonator and optical waveguide is smaller than in the case for point coupling), vertical coupling (e.g., the microring resonator is on a different plane than the optical waveguide), etc.

FIG. 22B is a graph that illustrates the electric field profile of the optical TM mode of the microring resonator 2250 and the arrow plot of the DC field induced between the top and bottom electrodes of the microring modulator 2200 of FIG. 22A according to various embodiments. FIG. 22C is a schematic diagram of an isotropic microring modulator 2200C with the inclusion of metallic vias so that the inner M1 electrode can be connected to the outer M1 electrode according to various embodiments. The microring modulator 2200C may be the same as or similar to the microring modulator 2200 of FIG. 22A, as noted by similar reference numbers. Therefore, ~60 degrees of the modulator may not be covered by the symmetric phase shifter. This region still may have an inner bottom electrode and make a slight contribution to the tuning efficiency. The effective filling ratio may be approximately 91%. In some embodiments, the electrical pads and the metal routings are designed on the M2 layer.

The inclusion of metals and their distance to the waveguide may lead to some optical loss to the microring resonator, which may affect performance. Therefore, an optimal trade-off may be made in the design between the electro-optic tuning efficiency and the loss of the resonator. The electro-optic design of the modulator may be simulated, for example in COMSOL Multiphysics. The tuning efficiency of the microring can be simulated by setting up electrostatic physical conditions and coupling it to a frequency-domain optical eigenmode analysis for the fundamental TM polarization. The optical loss due to the metallic (gold) electrodes can be simulated by defining the metal as a negative complex dielectric, as further described with respect to FIGS. 31-39.

The design space of the modulator can be characterized so that the microring modulator can operate close to critical coupling (extinction>20 dB) after placement of metals and provide >5 dB of modulation depth when performing on-off keying with 4 V of peak-to-peak voltage at a speed of 10 GHz. The selected design as shown in FIG. 22A has 550 nm of clearance to the microring resonator 2250 for the bottom electrodes and approximately 700 nm of clearance for the top electrode. In some embodiments, the clearances can range from approximately 500 nm-600 nm, and approximately 650 nm-850 nm, respectively. The simulated electro-optic effect for the described values yields 8.45 pm/V for the tunability. A total excess optical loss of ~5 dB/cm can be estimated for the target design after depositing the electrodes, hence the total optical loss of the microring is estimated to be in the range of approximately 12-15 dB/cm. The width of the electrodes can be set to 5 μm so that the total capacitance of the modulator is less than approximately 50 fF. The capacitance of the symmetric phase shifter is simulated to be ~187 pF/m and the calculated total capacitance of the microring modulator is ~35 if.

FIGS. 23A-23E are microscopic images of a microring with the top and bottom electrodes and vias according to various embodiments. FIGS. 23B-23E are focused ion beam (FIB) images showing cross-section views of the microring before depositing the top metal; a deposited via and its sidewall coverage; the microring and its bus waveguide; and the bus waveguide with top $SiO_2$ cladding respectively.

The first part of the fabrication process may include patterning the passive LN structures including the grating couplers and the microring resonator using electron beam (E-beam) lithography. The Z-cut thin-film LN wafers (nominal thickness of approximately 560 nm) on 2.5 μm thick $SiO_2$ on a silicon substrate may be used. The thickness of the buried oxide may be used such that the leakage of the optical mode into the substrate for both TE and TM polarizations is negligible. A ~700 nm layer of $SiO_2$ may be used as the hard mask for dry-etching LN, and was deposited using standard PECVD (~113 nm/min). 300 nm of photoresist (PMMA) may be spin-coated at 2000 rpm for 1 minute and electron beam lithography (EBL) may be performed on the sample. A 120-nm thick chromium (Cr) layer patterned via evaporation and lift-off may be used as the mask for etching $SiO_2$ ($SiO_2$:Cr etch rate~20:1). Next, the $SiO_2$ layer and then the LN layer was dry-etched using a Plasma-Therm ICP-RIE system. The $SiO_2$ may be etched using $CHF_3$ (20 sccm) and $O_2$ (5 sccm) gases with ICP power of 800 W and RIE power of 100 W. The LN may be etched using $Cl_2$ (5 sccm), $BCl_3$ (15 sccm), and Ar (18 sccm) gases under a chamber pressure of 5 mT and with ICP and RIE powers of 800 W and 280 W, respectively. The etch rates of $SiO_2$ and LN in the LN etching step are 140 nm/min and 200 nm/min, respectively, corresponding to the selectivity of approximately 1.43:1. The thickness of the remaining $SiO_2$ after fully etching LN was measured to be ~280 nm.

The second part of the fabrication process includes adding the bottom and top electrodes to the microring resonator. Gold electrodes may be deposited using evaporation and lift-off. To facilitate lift-off of the bottom electrodes, the thickness may be set to 150 nm. Thinner bottom electrodes may also help to create a better vertical DC field inside the microring resonator 2250 by pulling the DC field down near the vertical edges of the microring resonator 2250. After deposition of the bottom electrodes, the oxide cladding (PECVD $SiO_2$) may be uniformly deposited to achieve ~700 nm of oxide on top of the microring resonator 2250. Because the growth rate of the oxide on the LN regions was observed to be slower than in other places, the deposited oxide may end up with a larger thickness on top of the bottom electrodes (~900 nm). This provides advantages by helping to partially planarize the oxide cladding. Next, vias may be patterned and etched before the top electrodes are finally deposited. Test structures may also be fabricated to ensure that vias work properly. FIG. 23A shows the top-view SEM image of the fabricated device. Top and bottom metals, as well as vias, may be clearly seen in this picture. FIGS. 23B-23E show the FIB cut images taken of one of the dummy samples in the fabrication process to ensure that the thickness of the oxide cladding is consistent at different places. As expected, the contour of oxide cladding in FIG. 23B is adequately smooth. However, there may be about 50-200 nm of misalignment for the left and right electrodes in different samples, which may cause the optical loss of the bottom electrodes to increase from its designed value of 2.5 dB/cm in simulations to a value of 6 8 dB/cm. Other parts of the device, including vias and their sidewall coverage shown in FIG. 23C, straight sidewall definition of microring resonators shown in FIG. 23D, and cladding over the microring and waveguides shown in FIG. 23E, may be fabricated as designed.

FIG. 24A is a schematic illustration of the layout of the passive microring (e.g., with no electrodes) with its ports numbered from left to right according to various embodiments. A four-fiber linear array with a pitch of 250 μm may be used for coupling light from fibers into the grating couplers. In some embodiments, the pitch may be between 200 μm and 300 μm. The vertical alignment may be assisted with the side mirrors, and the in-plane alignment is assisted with the alignment markers that are placed on the LN die. A continuous-wave (CW) tunable laser (Santec 710 TSL) accompanied by a polarization controller (PC) may be used to control the wavelength, power, and polarization of the light inside the incoming fiber. The light may be injected in port 1 and detected at port 4. The output light from the through path may go to the photodiode (Thorlabs DET08CFC). The generated photocurrents may be amplified by a log-amplifier circuit (ADL5310 from Analog Devices) and voltages are read out by a National Instrument data acquisition device (NI DAQ model USB-6009) and imported into LabVIEW software. This configuration may be limited to low-frequency measurements (<10 kHz). The long waveguide (~1.5 mm) connecting each grating coupler and the microring may create enough space for the placement of a fiber array and a GSG electrical probe.

FIG. 24B is a graph that illustrates the measured optical spectrum of the passive device without any metal electrodes according to various embodiments. The maximum extinction may be 25 dB which meets the design target of >20 dB.

FIG. 24C is a graph that illustrates the measured optical spectrum after deposition of the bottom electrodes and before deposition of oxide cladding according to various embodiments. The extinction of resonances may be reduced to 10 dB. This may be mainly caused by increased metal loss due to the slight misalignment of the bottom electrodes. Simulations show that an extra 6.5 dB/cm loss (added to 7 dB/cm of the passive ring) may reduce the extinction of resonance from 25 dB to 10 dB, which is consistent with the measured results.

FIG. 24D is a graph that illustrates the measured optical spectrum after the deposition of the top oxide cladding according to various embodiments. The deposition of the oxide cladding may reduce the confinement of the optical mode inside the microring resonator 2250 and increase the coupling strength between the microring and the bus waveguide. This may help reduce the imbalance between the loss and coupling of the resonator and restores the extinction ratio and even increases it to 30 dB. The top oxide cladding may also significantly boost the grating coupler efficiency at longer wavelengths, which may result in the peak red-shifting to ~1620 nm.

FIG. 24E is a graph that illustrates the optical spectrum of the finished device after the deposition of the top electrode according to various embodiments. Because the estimated loss of the top metal is ~2 dB/cm, the extinction of resonances may be expected to experience only a small reduction. This may be clearly observed in the measurement where a consistent 20 dB of extinction is observed. It is worth noting that the noise floor of our optical measurement is −62 dBm; hence, the observed extinction of the resonances at the shorter wavelengths may be limited by the noise floor.

Figure 25:
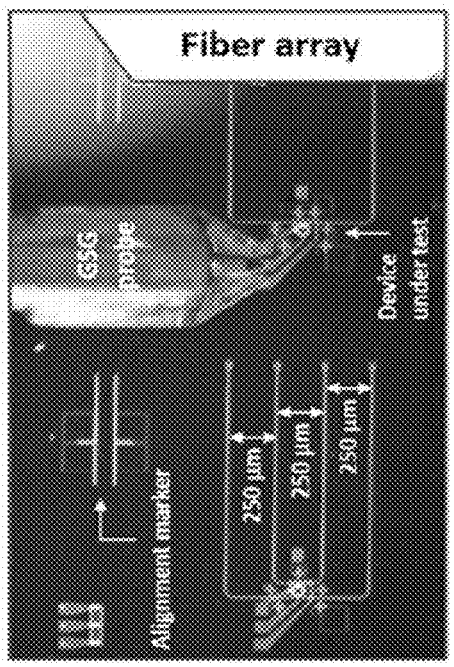
FIG. 25 is a device testing setup with the mounted fiber array and the electro-optic measurement using a GSG probe according to various embodiments.

FIG. 25 is a device testing setup with the mounted fiber array and the electro-optic measurement using a GSG probe according to various embodiments. FIG. 25 shows the positions of the fiber array and the GSG probe on the LN die. Electro-optic tuning may be performed for both positive and negative voltages up to 30 V. The positive voltage refers to applying a positive voltage to the top electrode and grounding the bottom electrodes.

Figure 26A:
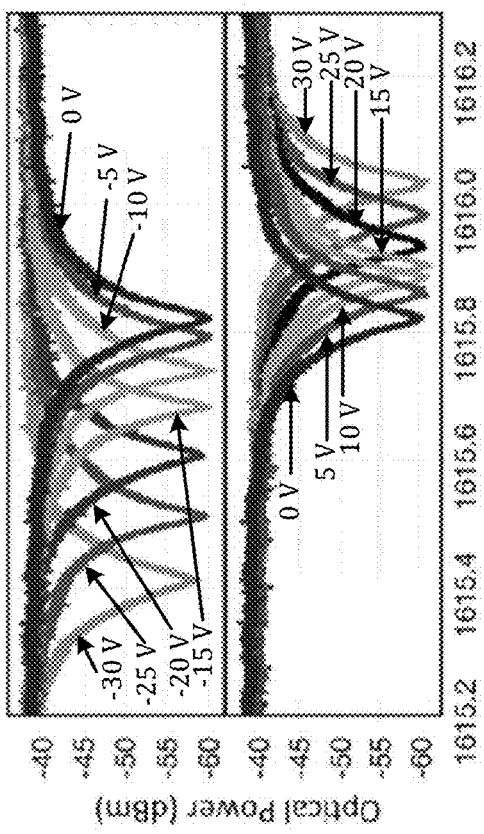
FIG. 26A is a graph that illustrates the measured spectra of one of the resonances for negative (top) and positive (bottom) applied voltages, respectively according to various embodiments.

FIG. 26A is a graph that illustrates the measured spectra of one of the resonances for negative (top) and positive (bottom) applied voltages, respectively according to various embodiments. The observed blue-shift (red-shift) may be expected because the induced DC field is upward (downward) inside the microring resonator 2250 and the positive direction of the extraordinary axis is upward. Hence, the induced index change is negative (positive) which may result in a blue-shift (red-shift) of the resonance.

Figure 26C:
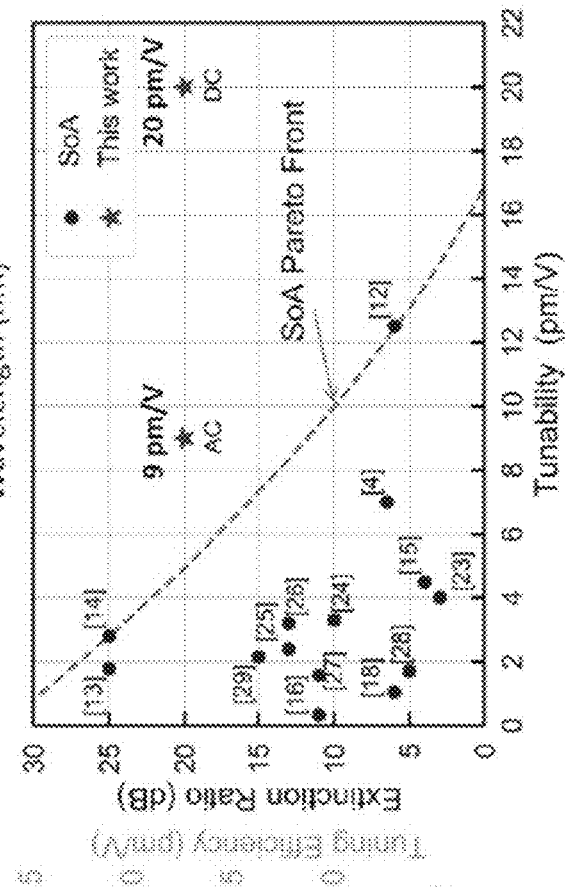
FIG. 26C is a graph that illustrates a comparison of the modulator performance with various LN microring modulators according to some embodiments.
Figure 26B:
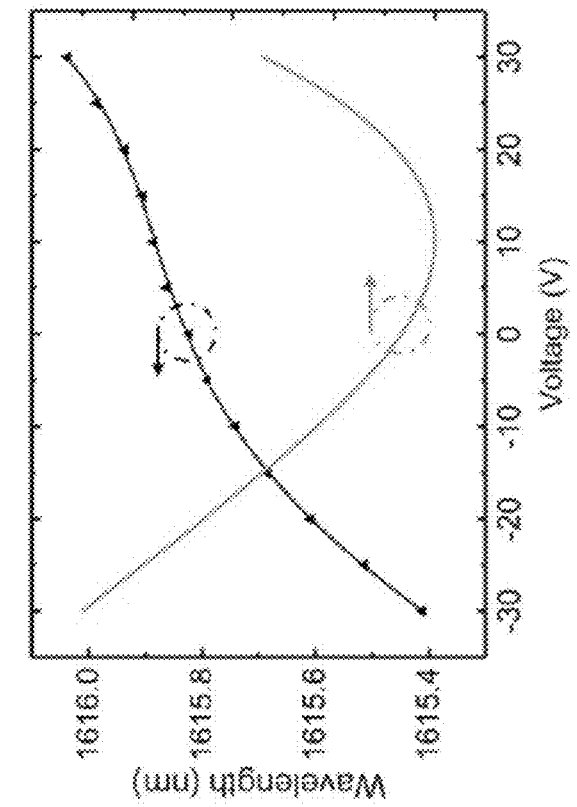
FIG. 26B is a graph that illustrates resonance wavelength versus applied DC voltage according to various embodiments.

FIG. 26B is a graph that illustrates resonance wavelength versus applied DC voltage according to various embodiments. This plot shows a tuning efficiency of 6.7 pm/V at zero voltage, which is somewhat smaller than predicted by the simulation. However, the tuning efficiency may be significantly enhanced for negative voltages. There may be a global tuning efficiency of 13.7 pm/V for 0 V to −30 V and a local tuning efficiency of 20.3 pm/V for −25 V to −30 V. To confirm this better-than-expected behavior, electro-optic measurements may also be conducted on another device and similar results can be observed.

FIG. 26C is a graph that illustrates a comparison of the modulator performance with various LN microring modulators according to some embodiments. In comparison to other works on tunable microring modulators in X-cut, Y-cut, or Z-cut LN as shown in FIG. 26C, the modulator well surpasses the state-of-the-art (SoA) in the trade-off between extinction and tunability of the resonance.

Figure 27:
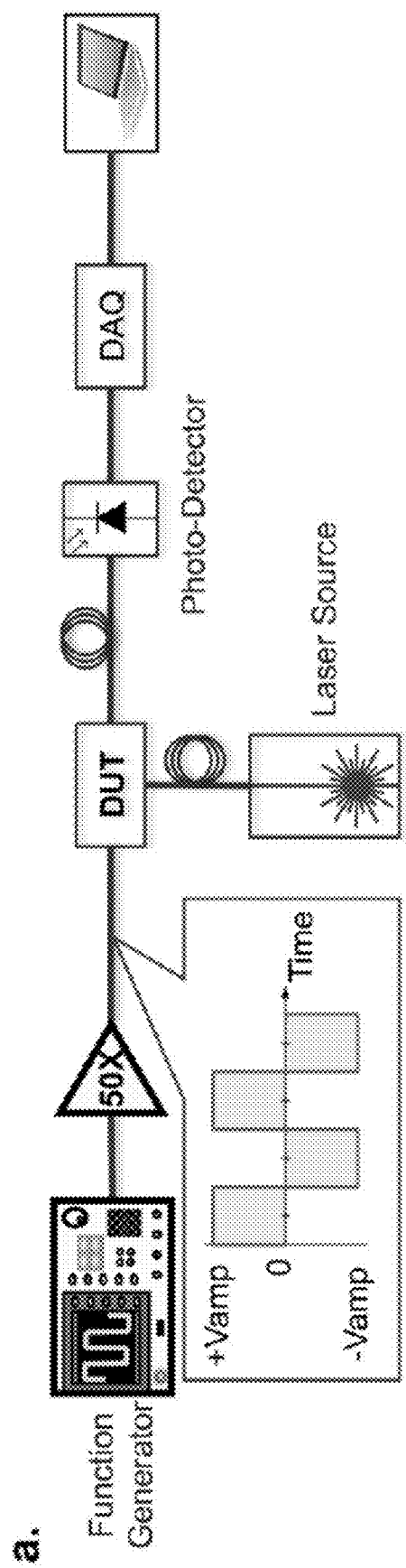
FIG. 27 is a schematic diagram of an experimental setup for measuring the effective electro-optic modulation efficiency of a microring modulator according to various embodiments.

FIG. 27 is a schematic diagram of an experimental setup for measuring the effective electro-optic modulation efficiency of a microring modulator according to various embodiments. A misalignment of the bottom electrodes may compromise the symmetry of the phase shifter and create non-negligible horizontal components of the electro-static E-field inside the microring resonator 2250. However, the presence of such a horizontal field component and its contribution to the electro-optic tunability do not explain the asymmetry of the tunability considering only the linear electro-optic effect. The asymmetry of tunability may not be caused by the $x^{(3)}$ nonlinearity because no resonance shift was observable when the laser power was varied at a fixed applied voltage. Simulations of the strength of the static E-field inside the microring resonator 2250 also show that the E-field may remain well below the coercive threshold of LN (184 V to produce >21 MV/m); hence, no ferroelectric domain reversal should happen up to 30 V. Therefore, the asymmetry in the static electro-optic tunability of the fabricated microring modulators may be due to a slow charging process (Maxwell-Wagner effect) that takes place at the interface of microring resonator 2250 and its surrounding $SiO_2$.

Figure 28A:
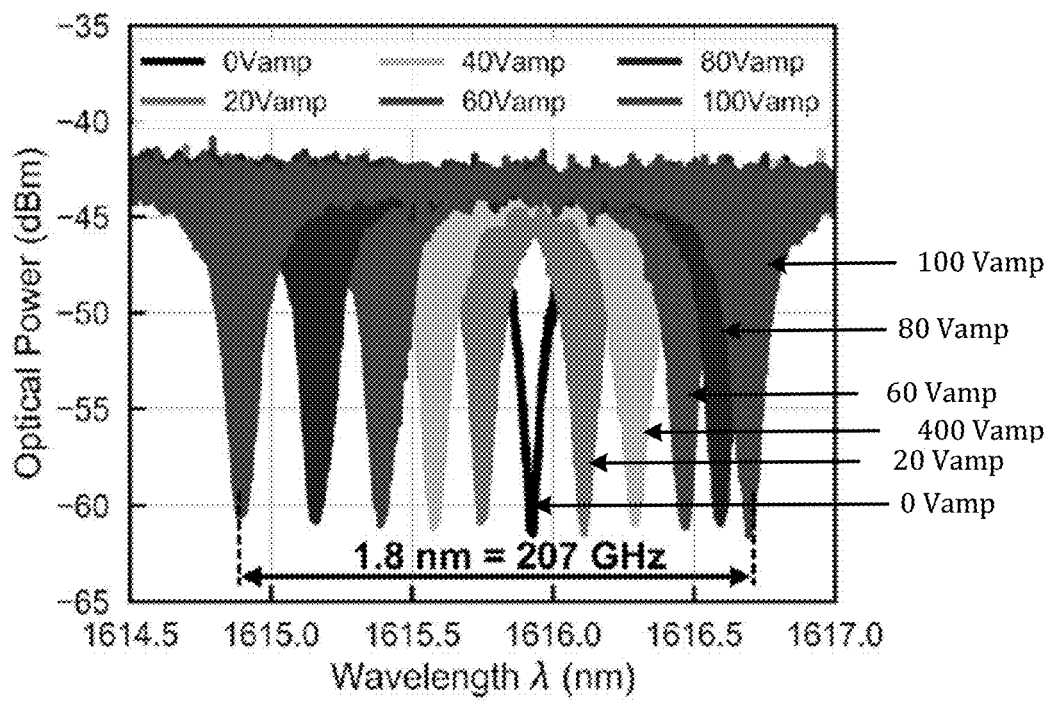
FIG. 28A is a graph that illustrates captured spectra over a period of time under square-wave biasing according to various embodiments.

FIG. 28A is a graph that illustrates captured spectra over a period of time under square-wave biasing according to various embodiments. To confirm the description with respect to FIG. 27 and measure the effective AC electro-optic tunability, an alternating polarity square-wave with a frequency of 1 kHz as shown in FIG. 27. may be applied to the modulator and the output optical spectrum may be measured for different pulse amplitudes as shown in FIG. 28A. Because the frequency of the electrical signal is much faster than the speed of the wavelength sweep (1 nm/sec), two stable resonances may be observed, each corresponding to the negative and positive portions of the applied voltage. An extremely wide total tuning range of 1.8 nm, i.e., 207 GHz may be achieved.

Figure 28B:
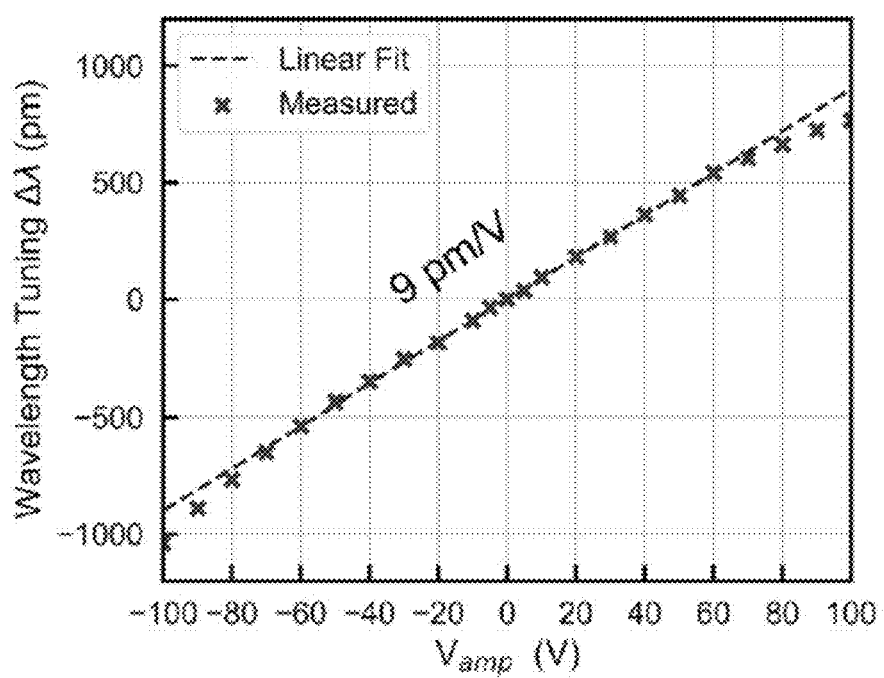
FIG. 28B is a graph that illustrates resonance shifts as a function of square-wave amplitude according to various embodiments.

FIG. 28B is a graph that illustrates resonance shifts as a function of square-wave amplitude according to various embodiments. In particular, FIG. 28B shows the measured effective resonance shift as a function of the amplitude of the pulse. It demonstrates a symmetric and linear trend of 9 pm/V up to 60 V for both the positive and negative voltages. At voltages beyond ±60 V, a nonlinear behavior can emerge which can still be attributed to the charging effects. The nonlinearity may become stronger at lower pulse frequencies.

Figure 29:
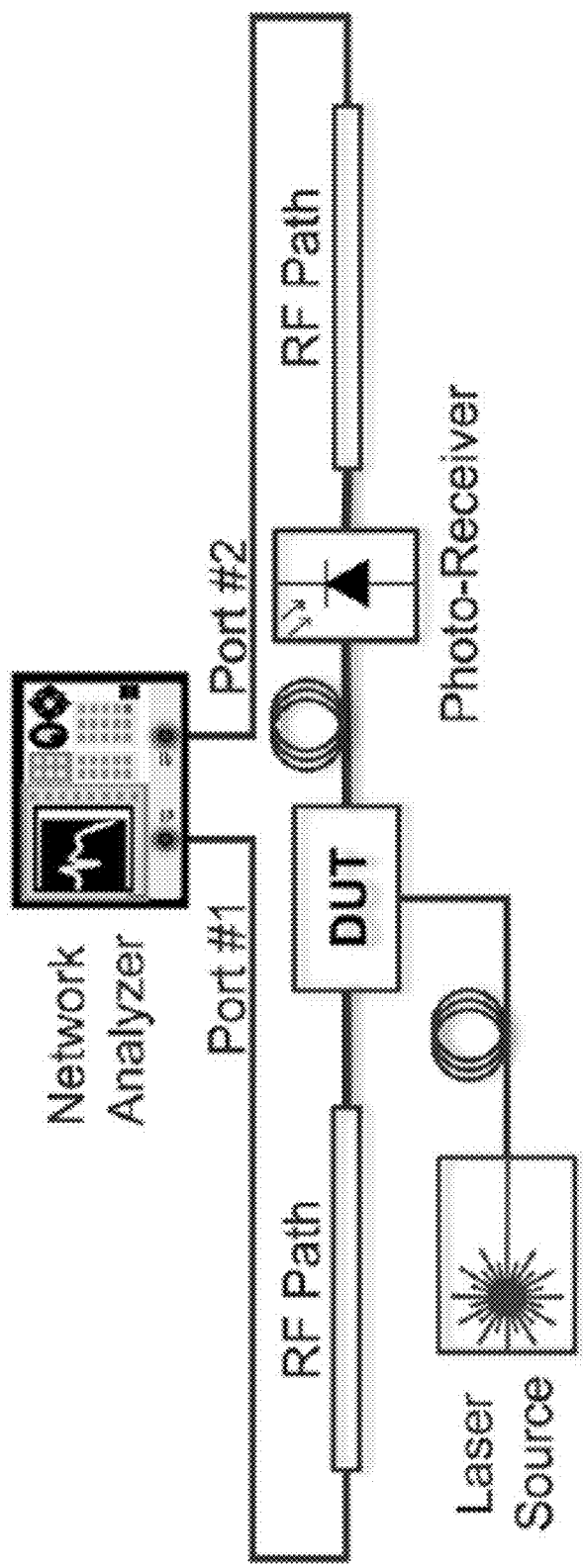
FIG. 29 is a schematic diagram of an experimental setup for measuring electro-optical modulation frequency response of the microring modulator according to various embodiments.

FIG. 29 is a schematic diagram of an experimental setup for measuring electro-optical modulation frequency response of the microring modulator according to various embodiments. High-speed measurements may be done using a network analyzer (Agilent N5230A) from 100 MHz up to 28 GHz as shown by placing a GSG probe on the electrical pads after aligning the fiber array with the gratings. Port 1 may be used as the RF source that generates the modulation signal applied on the electro-optic modulator with RF power of 1 dBm. Port 2 can measure the RF signal from the photo-receiver (Thorlabs RXM40AF). In order to reduce the effects of the measurement setup, especially the frequency-dependent RF attenuation, the measurement reference planes may be moved to the RF probe and the output port of the photo-receiver by performing calibration with the SLOT mechanical calibration kit (Keysight 3.5 mm 85052D).

Figures 30A, 30B:
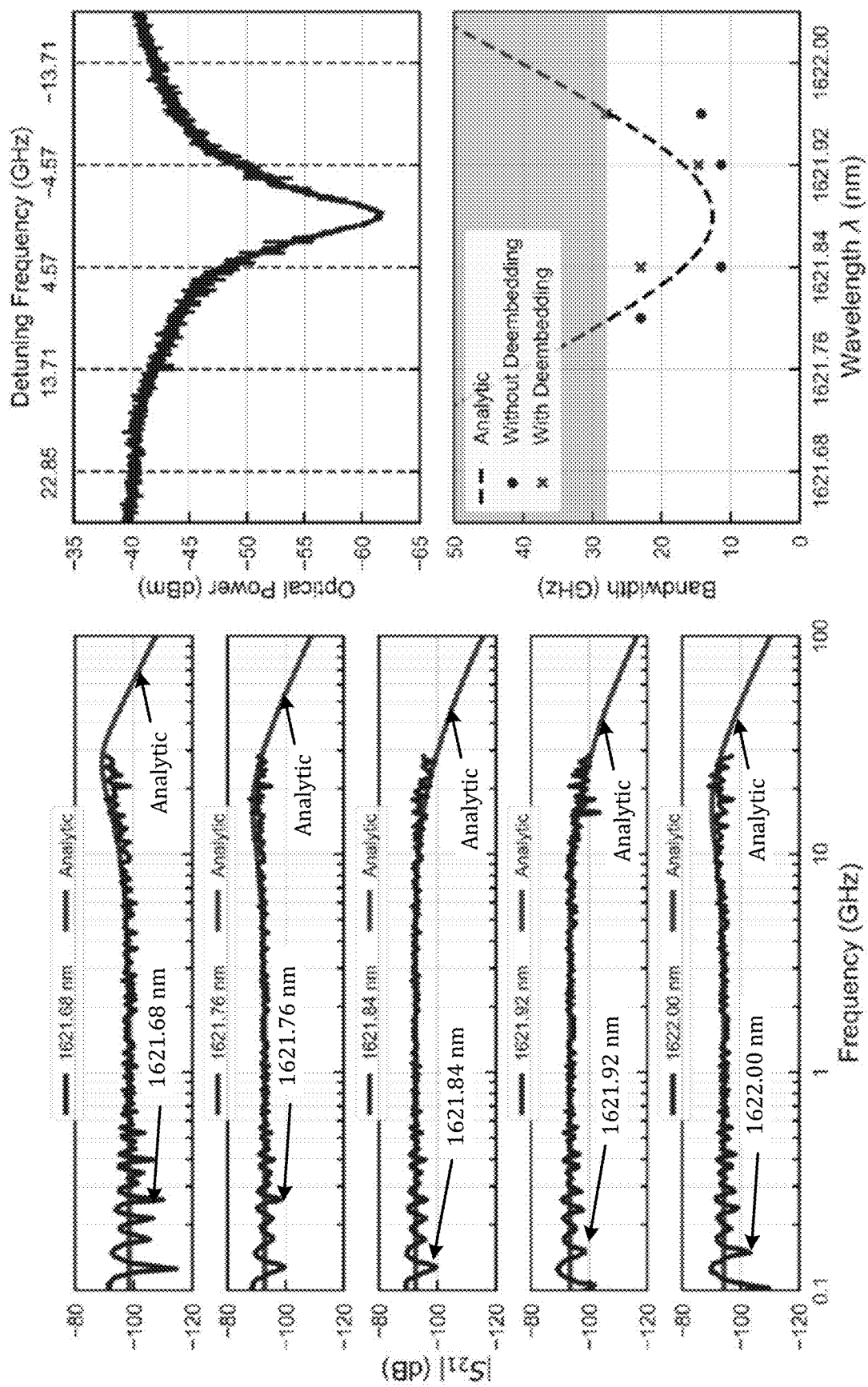
FIG. 30A are graphs that illustrate measured electro-optic amplitude $|S_{12}|$ of the microring resonator at different resonance detunings according to various embodiments.
FIG. 30B are graphs illustrating measured bandwidth as a function of optical detuning of the laser according to various embodiments.

FIG. 30A are graphs that illustrate measured electro-optic amplitude $|S_{12}|$ of the microring resonator at different resonance detunings according to various embodiments. The high-frequency electrical S-parameter measurement of the microring modulator (RF $S_{11}$) may result in a measured total capacitance of 69.4 fF for the device of which 29.8 fF may be measured to be the parasitic capacitance from the electrical pads and metal traces on the chip. Hence, the capacitance of the modulator may be ~39.6 fF. This is slightly higher than the design target (~35.1 IF) for the perfectly symmetric electrode arrangement. The difference can be attributed to the variation in the thickness of the oxide cladding and the misalignment of the bottom electrodes.

The electro-optical modulation frequency response (EO $S_{21}$) of the microring modulator may be measured using the 40 GHz photo-receiver according to the setup in FIG. 29. The RF path may be characterized beforehand for later de-embedding. The frequency response of the photo-receiver may be de-embedded to unmask the frequency response of the electro-optic modulator. The measured frequency response may be limited to 28 GHz because the observed noise floor of the network analyzer increases significantly for higher frequencies. FIG. 30A shows the $S_{21}$ after de-embedding the frequency response of the photo-diode and the RF path. Each curve corresponds to a particular detuning between the input laser and the microring resonance (measured value of 1621.88 nm). The optical detuning was performed in steps of 40 pm (4.57 GHz). Based on a rigorous RF harmonic analysis the $S_{21}$ may be also analytically estimated and plotted in FIG. 30A. It shows a good agreement with the measurements. Both the simulations and the measurements may indicate frequency peaking for larger resonance detunings. This peaking can be explained using a system-level perspective in which the small-signal EO response behaves like an under-damped second order linear system.

FIG. 30B are graphs illustrating measured bandwidth as a function of optical detuning of the laser according to various embodiments. Greater than 10 GHz of modulation bandwidth at zero detuning and greater than 28 GHz of modulation bandwidth at greater than 10 GHz are illustrated. FIG. 30B shows the detuning range of the resonance and the plot of the modulation bandwidth as a function of the optical detuning (both before and after de-embedding), which demonstrates an increase in the electro-optical modulation bandwidth with the detuning. The results of the analytical modeling also agree well with this observation and predict modulation bandwidth in excess of 30 GHz for detunings greater than 10 GHz.

The symmetric electrode design with optimized spacing between the electrodes and the microring core may result in strong vertical electrical field strength in Z-cut LN without significant optical loss for the TM mode. By conducting detailed static and dynamic electrical and optical multiphysics modeling studies and by developing well-controlled fabrication techniques that were aided by FIB, SEM, and microscope inspection and device characterization after critical processing steps, high performance modulators may be demonstrated which match predictions in almost every regard.

Figure 31A:
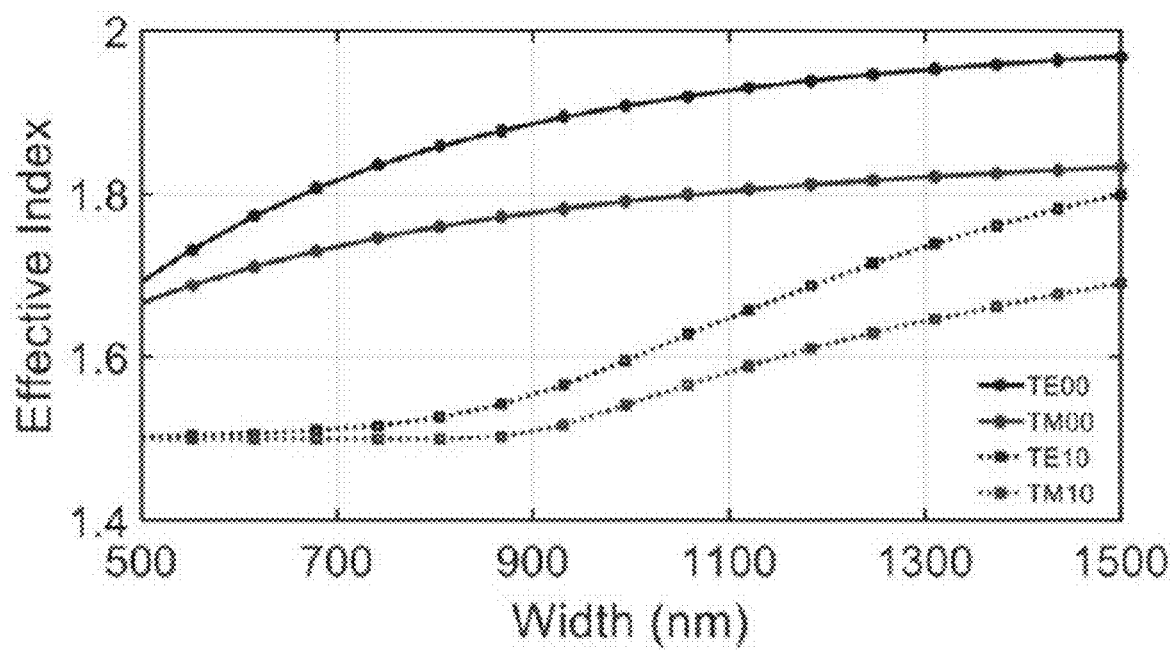
FIG. 31A is a graph that illustrates calculated effective index of the optical modes to determine the single-mode operational region of the waveguide according to various embodiments.

FIG. 31A is a graph that illustrates calculated effective index of the optical modes to determine the single-mode operational region of the waveguide according to various embodiments. The electro-optic design of the modulator may be performed in the COMSOL Multiphysics software by defining an electro-static physics (solving Laplace's equation) and coupling its results to an optical eigenmode solver.

The maximum width for single-mode operation of the waveguide may be determined by sweeping the width and solving an optical eigenmode problem in the frequency domain. FIG. 31A shows the calculated modes for a waveguide (including the effect of metals but no DC field) with a thickness of 560 nm. The thickness may be chosen in the range of 400 nm 600 nm to optimize the coupling efficiency of the fully etched grating. It is worth noting that because COMSOL solves the 2D simulation in the x-y cross-section whereas for the Z-cut LN crystal the cross-section is assumed to be x-z, the notation of 1, 2, 3 instead of x, y, z to refer to the components of the electric fields in the principal axes of the crystal may be used. Therefore, $E_1$ is the in-plane horizontal component (ordinary direction), $E_2$ is the out-of-plane component (ordinary direction), and $E_3$ is the in-plane vertical component (extraordinary). A constant effective index for the $TM_{10}$ equal to that of the oxide cladding below a width of 900 nm may be observed. Thus, the fully etched waveguide may be single-mode up to this width. In order to achieve the highest optical confinement and highest overlap with the DC field, a nominal width of 900 nm may be used for the waveguides. After the etching of LN in the fabrication, a reduction of the width of the waveguide from 900 nm to ~850 nm due to the slight undercutting of the etch mask may be observed.

Figure 31B:
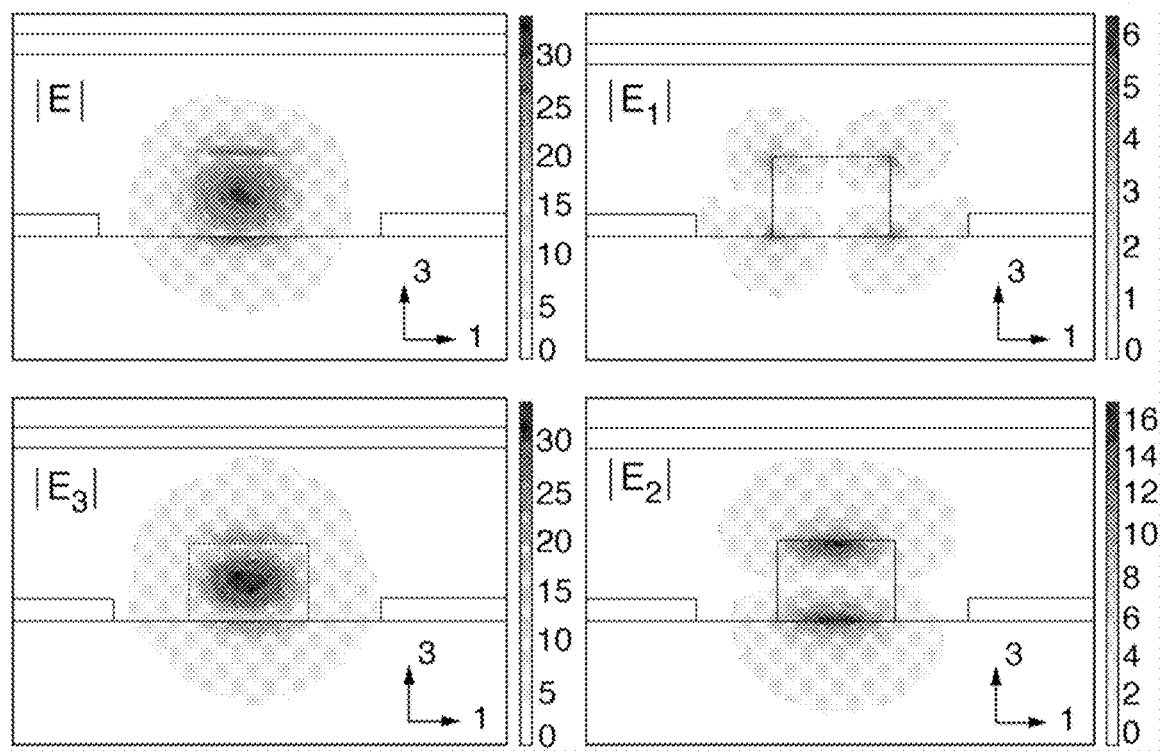
FIG. 31B are graphs illustrating electric field profiles of the optical fundamental TM mode according to various embodiments.

FIG. 31B are graphs illustrating electric field profiles of the optical fundamental TM mode according to various embodiments. The extraordinary direction is indicated by 3, as described above. FIG. 31B shows the electric field profile of the optical $TM_{00}$ mode. As expected, the vertical component in the extraordinary direction ($E_3$) is the strongest and may be the main component that interacts with the DC field inside the microring resonator 2250. The wavelength may be swept to find the effective index and group index of an 850 nm×560 nm waveguide. The effective and group indices may be subsequently used in the design of the microring modulator.

Figures 32E, 32F:
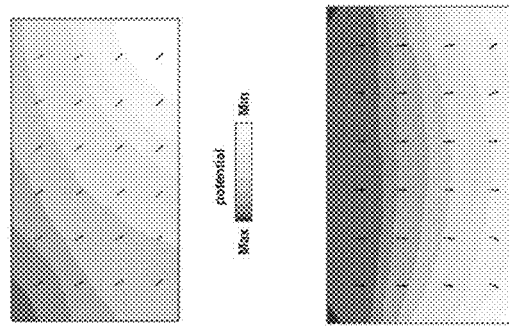
FIGS. 32E-32F are graphs that illustrate the direction and relative magnitude (size of the arrows) of the electrostatic field at each point inside the waveguide according to various embodiments.
Figures 32C, 32D:
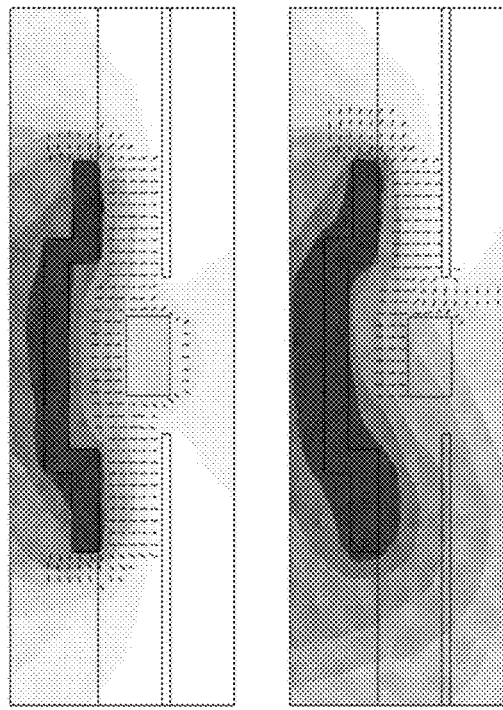
FIGS. 32C-32D are graphs that illustrate the simulated profile of the electrostatic microring modulators according to various embodiments.
Figures 32A, 32B:
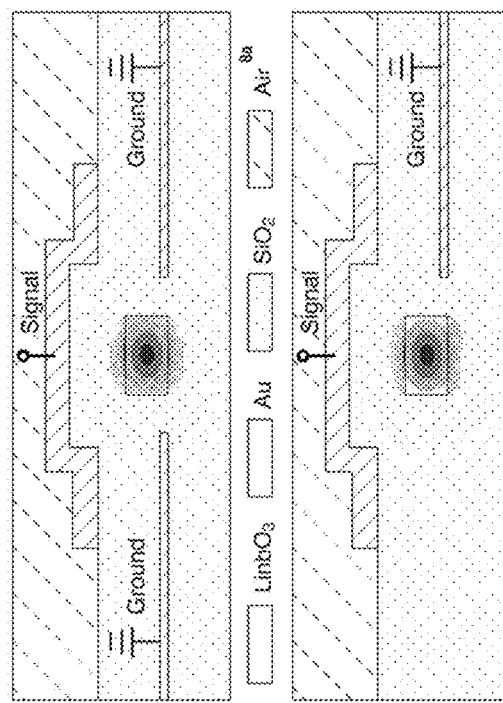
FIGS. 32A-32B are representations of the optical TM mode for symmetric and single-pair electrode microring modulators, respectively, according to various embodiments.

FIGS. 32A-32B are representations of the optical TM mode for symmetric and single-pair electrode microring modulators, respectively, according to various embodiments. In order to find the DC E-field, the electrostatic physics may be setup in COMSOL. The permittivities of the materials may be set to their corresponding values at DC (or low frequency). It is worth noting that there is a large difference between the permittivity of LN at DC and at optical frequencies. The permittivity of LN material is set up according to a diagonal tensor:

$$\epsilon_{LN} = \begin{pmatrix} \epsilon_\theta^{DC} & 0 & 0 \\ 0 & \epsilon_\theta^{DC} & 0 \\ 0 & 0 & \epsilon_\theta^{DC} \end{pmatrix} \quad (6)$$

where $\epsilon_o$ and $\epsilon_e$ are the ordinary and extraordinary permittivities, respectively. The bottom electrodes may be set to ground (zero voltage, ground potential, etc.) and a constant voltage ($V_{dc}$) may be applied to the top electrode. The boundary conditions of the simulation region may be set to "zero charge" (i.e., $\hat{n}\cdot\vec{D}=0$) to mimic an infinitely long region by enforcing no charge accumulation on the boundary.

FIGS. 32C-32D are graphs that illustrate the simulated profile of the electrostatic microring modulators according to various embodiments. In particular, they show the optical TM mode for the symmetric and single-pair electrode structures, respectively. Further, they show the simulated profile of the electrostatic potential upon applying 1 V to the top electrode of the symmetric design and the single-pair electrode design, respectively. The simulations include the effect of $SiO_2$ cladding contour.

FIGS. 32E-32F are graphs that illustrate the direction and relative magnitude (size of the arrows) of the electrostatic field at each point inside the waveguide according to various embodiments. As expected, the structural symmetry may enforce a near-perfect vertical field inside the microring resonator 2250.

Figure 33:
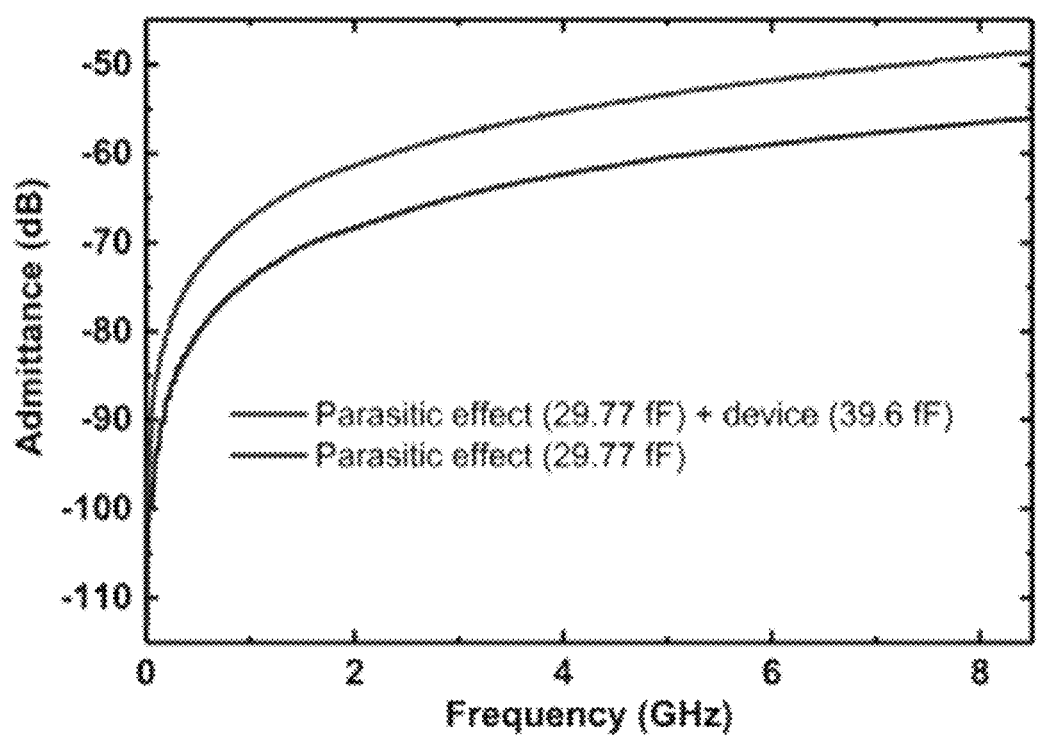
FIG. 33 is a graph that illustrates the Y-parameter according to various embodiments.

FIG. 33 is a graph that illustrates the Y-parameter according to various embodiments. After solving the electro-static simulation for $V_{dc}$=1 V, the static capacitance per unit length can be calculated by integrating the surface charge ($\rho_s=\hat{n}\cdot\vec{D}$) density over the top electrode:

$$Q = \iint \rho_s dS \rightarrow C_l = \frac{Q}{V_{dc}} \quad (7)$$

The result is $C_l$=186.22 pF/m. The total electrode capacitance of the microring modulator is $C_{tot} \approx C_l \times 2\pi R$ which gives a value of $C_{tot}$=35.1 fF. The capacitance of the modulator may be extracted by measuring the $Y_{11}$ parameter from the GSG pads up to 8.5 GHz as shown in FIG. 33. The structure (including pads and metal traces) have a total capacitance of 69.38 fF of which 29.77 fF may be from the pads and metal traces. Therefore, the capacitance of the modulator itself may be ~39.6 fF, which has a good agreement with the simulation. The 3-dB electrical RC bandwidth of the modulator is $$f_{3dB}[\text{electrical}] \approx \frac{1}{2\pi R_\Omega C_{tot}} \quad (8)$$

where $R_\Omega \approx 50\Omega$ is considered the source impedance. Based on the total capacitance of 35.1 fF, the electrical bandwidth is estimated to be ~90 GHz. Therefore, the speed of our microring modulator is not limited by the electrical effects but rather by the photon lifetime of the resonator.

In order to find the electro-optic response, the results of the electro-static simulation may be coupled to the optical eigenmode calculation using the electro-optical coefficients of the lithium niobate. The electro-static simulation may be solved in COMSOL and the optical permittivity of LN as $\epsilon_{LN}=\epsilon_{LN,0}\Delta\epsilon$ may be defined where $\Delta\epsilon$ is calculated using the DC field.

Figure 34B:
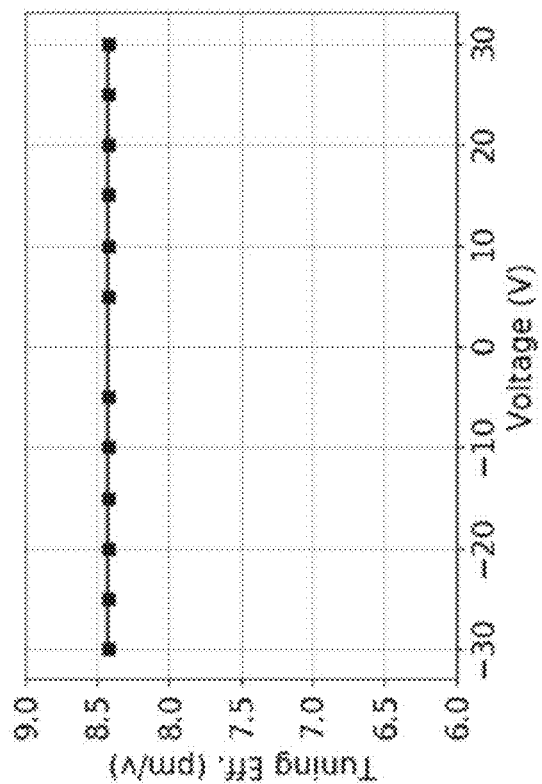
FIG. 34B is a graph that illustrates calculated electro-optic tuning efficiency of the microring modulator according to various embodiments.
Figure 34A:
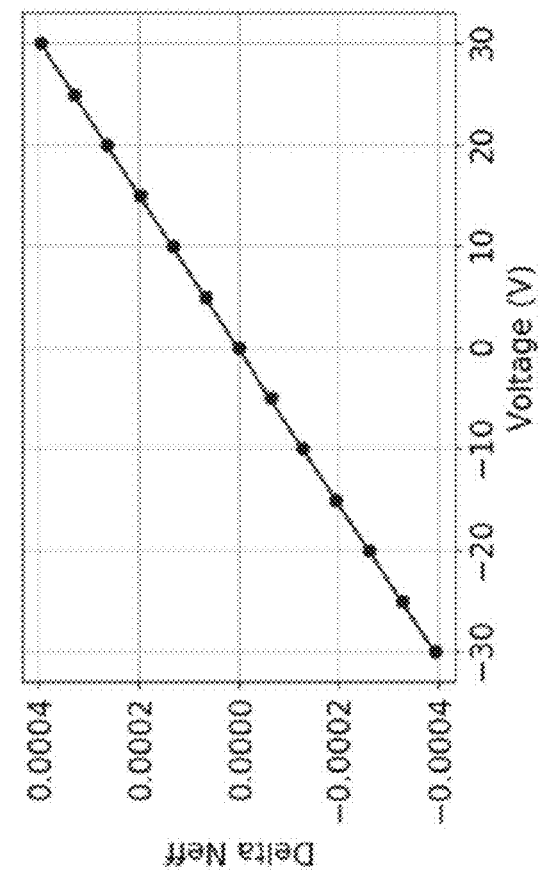
FIG. 34A is a graph illustrating the result of perturbation of the optical effective index due to an applied DC voltage for the symmetric electrode design according to various embodiments.

FIG. 34A is a graph illustrating the result of perturbation of the optical effective index due to an applied DC voltage for the symmetric electrode design according to various embodiments. A slope of the linear behavior can be found to be $\Delta E_{\text{eff}}$ (per volt)$\approx 1.3\times 10^{-5}$. The single-pair electrode design may exhibit an electro-optical efficiency of $\Delta n_{\text{eff}}$ (per volt)$\approx 8.3\times 10^{-6}$.

The condition for the resonance of the ring resonator is that the round-trip phase is an integer multiple of $2\pi(\phi(\lambda)=2m\pi)$. Therefore:

$$\delta\phi = 0 \rightarrow \frac{d\psi}{d\lambda} \times \delta\lambda_{res} + \Delta\phi_{EO} = 0 \quad (9)$$

where, $\Delta\phi_{EO}$ is the phase shift perturbation due to the electro-optic effect:

$$\phi(\lambda) = \frac{2\pi}{\lambda} n_{\text{eff}}(\lambda)L \rightarrow \frac{d\phi}{d\lambda} = \frac{2\pi L}{\lambda^2}(-n_g) \quad (10)$$

If ff (fill factor) is the fraction of the ring that is impacted by the electro-optic effect, then $$\frac{\delta\lambda_{res}}{\delta V_{DC}} = ff \times \frac{\lambda_{res}}{n_g} \times \Delta n_{\text{eff}}(\text{per volt}) \quad (11)$$

The group index of the fully etched waveguide has a simulated value of $n_g$=2.29 at $\delta$=1600 nm. Hence, the free spectral range is estimated to be 6.06 nm for a ring with a radius of 30 μm. This may lead to a maximum tuning efficiency (ff=1) of 9.26 pm/V for our microring resonator.

FIG. 34B is a graph that illustrates calculated electro-optic tuning efficiency of the microring modulator according to various embodiments. Due to the presence of vias for the connection of the top metal to the inner bottom electrode and the coupling of the bus waveguide to the ring (see FIG. 23B), the symmetric electrode arrangement may not cover the entire resonator. The electrodes mat be designed such that the symmetric electrodes cover approximately 300° of the ring, hence the filling factor is ~83% for the symmetric part. The single-pair top-bottom electrode also covers ~40° of the rest of the modulator. Therefore, the symmetric electrode tuning efficiency may be effectively applied to −91% of the structure. As such, the microring modulator may be expected to exhibit an electro-optic tunability of ~8.45 pm/V as shown in FIG. 34B. This is in agreement with the 9 pm/V observed for low frequency (1 kHz) square wave modulation in FIG. 28A.

Figures 35A, 35B:
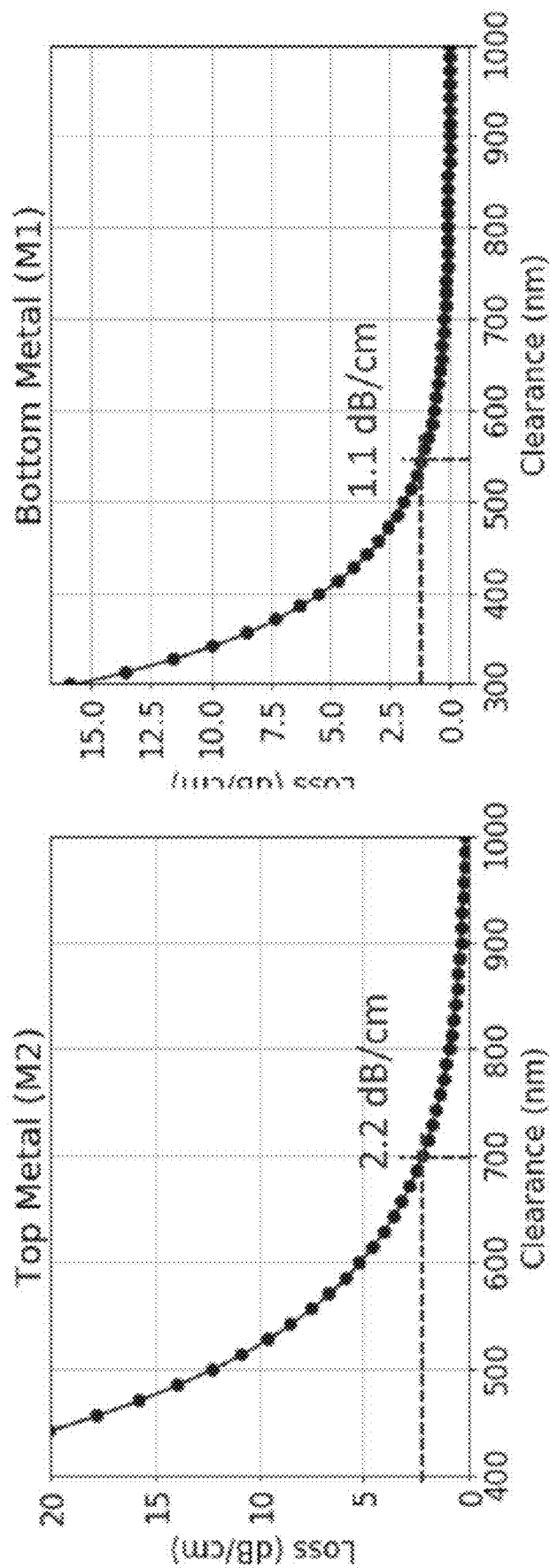
FIGS. 35A-35B are graphs that illustrate optical losses according to various embodiments.

FIGS. 35A-35B are graphs that illustrate optical losses according to various embodiments. FIG. 35A illustrates optical losses due to the top electrode as a function of its vertical distance from the upper edge of the waveguide. FIG. 35B illustrates optical losses due to each of the bottom electrodes as a function of its lateral distance from the waveguide sidewall. The proximity (clearance) of the top and bottom metal electrodes to the waveguide can induce some optical loss. The optical loss due to the metallic (gold) electrodes may be simulated by defining the metal as a negative complex dielectric ($\epsilon_{metal}=-115,13-11.26j$). In order to estimate the loss (in dB/cm) of the optical mode, the attenuation coefficient (damping factor) of the electric field ($\alpha_E$ in units of $m^{-1}$) may be calculated in COMSOL and converted into optical power attenuation (dB/cm) using the following equation:

$$\alpha\left[\frac{dB}{cm}\right] = \alpha_E[m^{-1}] \times 2 \times 0.0434 \qquad (12)$$

Desired operating points are approximately indicated in FIGS. 35A-35B.

Figure 36A:
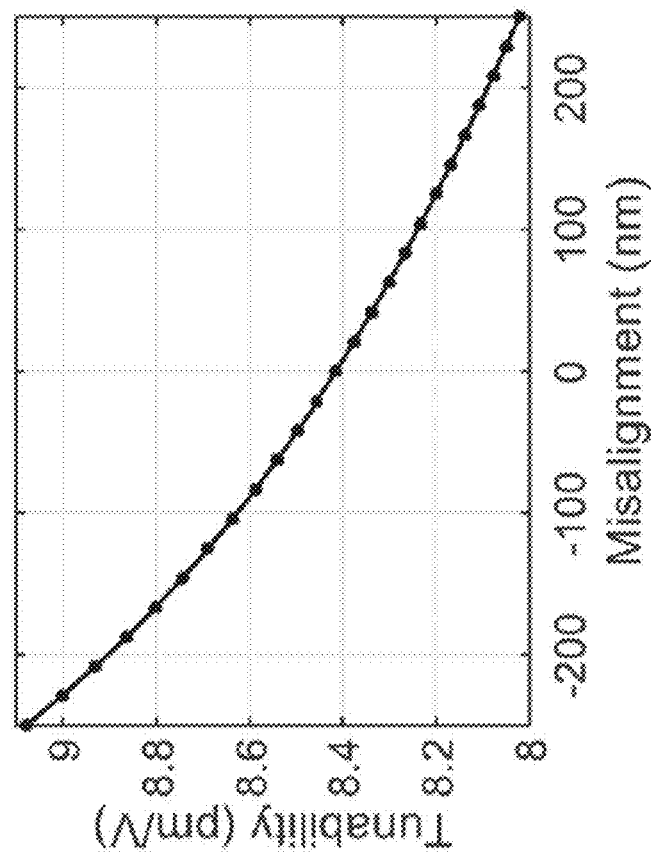
FIGS. 36A-36B are graphs that illustrate impacts of misalignment of a bottom electrode on the optical mode and the resonance tenability, respectively, according to various embodiments.
Figure 36B:
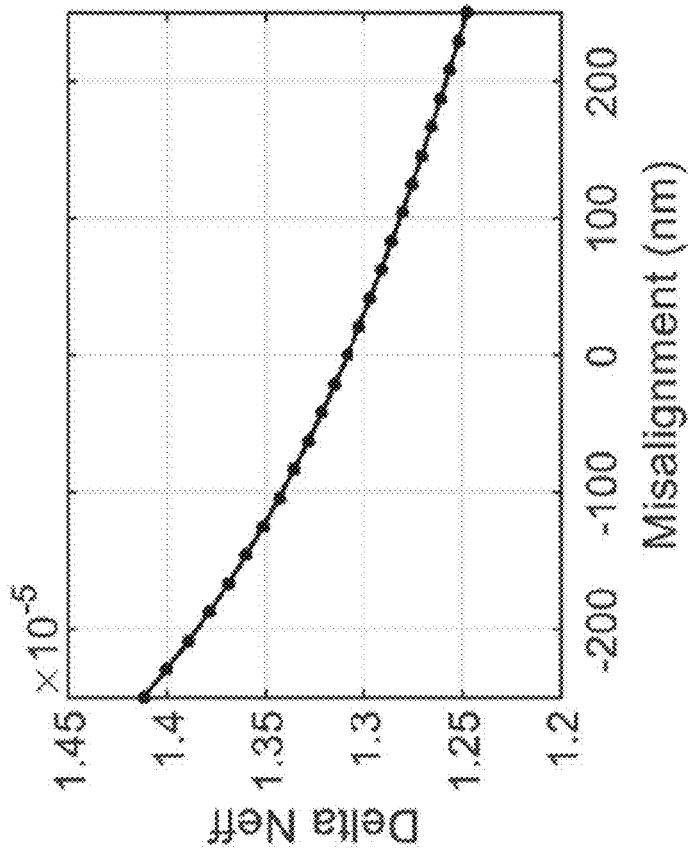

FIGS. 36A-36B are graphs that illustrate impacts of misalignment of a bottom electrode on the optical mode and the resonance tenability, respectively, according to various embodiments. Misalignments can happen during the E-beam lithography for the patterning of the bottom or top electrodes. Because the width of the top electrode is 5 µm, the electro-optic performance may not experience a change for large misalignments of the top electrode (even for 1-µm misalignment). The fabricated devices display ~50 200 nm of misalignment (decrease in the clearance for one of the bottom electrodes). The misalignment of the bottom electrodes to the microring resonator 2250 is the combined result of the angular and linear misalignments, which may be expected to vary slightly around the ring. Nonetheless, such bottom electrode misalignment can affect both the optical loss and the electro-optic tunability because it places the metal closer to the optical mode and compromises the symmetry of the induced DC field. The change in the optical loss can be extracted from FIG. 36B.

The impact of the misalignment of one of the bottom electrodes on the optical effective index is shown in FIG. 36A and is converted to the resonance tunability in FIG. 36B. A negative misalignment can indicate that the bottom electrode is closer to the microring resonator 2250. However, such impact is not significant on tunability.

Figure 37:
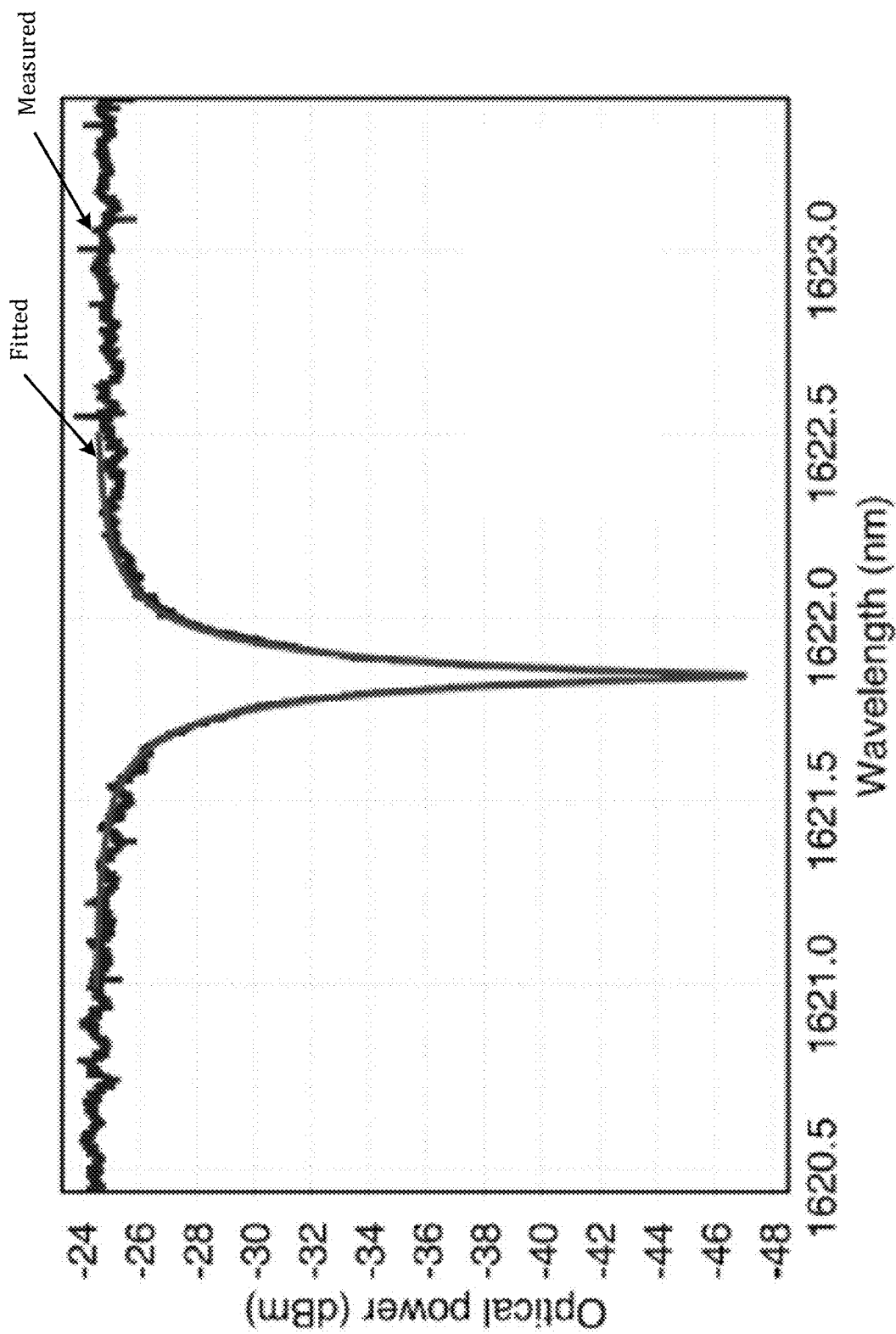
FIG. 37 is a graph that illustrates a Lorentzian fitting of a measured resonance of the microring modulator according to various embodiments.

FIG. 37 is a graph that illustrates a Lorentzian fitting of a measured resonance of the microring modulator according to various embodiments. The optical parameters of the microring modulator after deposition of all the metal layers is fitted to the Lorentzian model to extract the optical parameters at a particular resonance of interest (near 1621.8 nm) as shown in FIG. 37. The extracted parameters are: extinction of resonance (ER)=22.5 dB, loaded quality factor (Q)=5432, free spectral range (FSR)=6.05 nm, E-field coupling coefficient (κ)=0.365, round-trip loss (α)=22 dB/cm. These are in agreement with the predicted value of FSR=6.07 nm and α=15 19 dB/cm. Due to the dependence of the group index of the microring resonator 2250 on wavelength, the FSR may be slightly decreased at shorter wavelengths. In FIG. 24E, we also see that the measured FSR is 5.46 nm near 1550 nm, which is close to the expected value of ~5.5 nm.

Figure 38A:
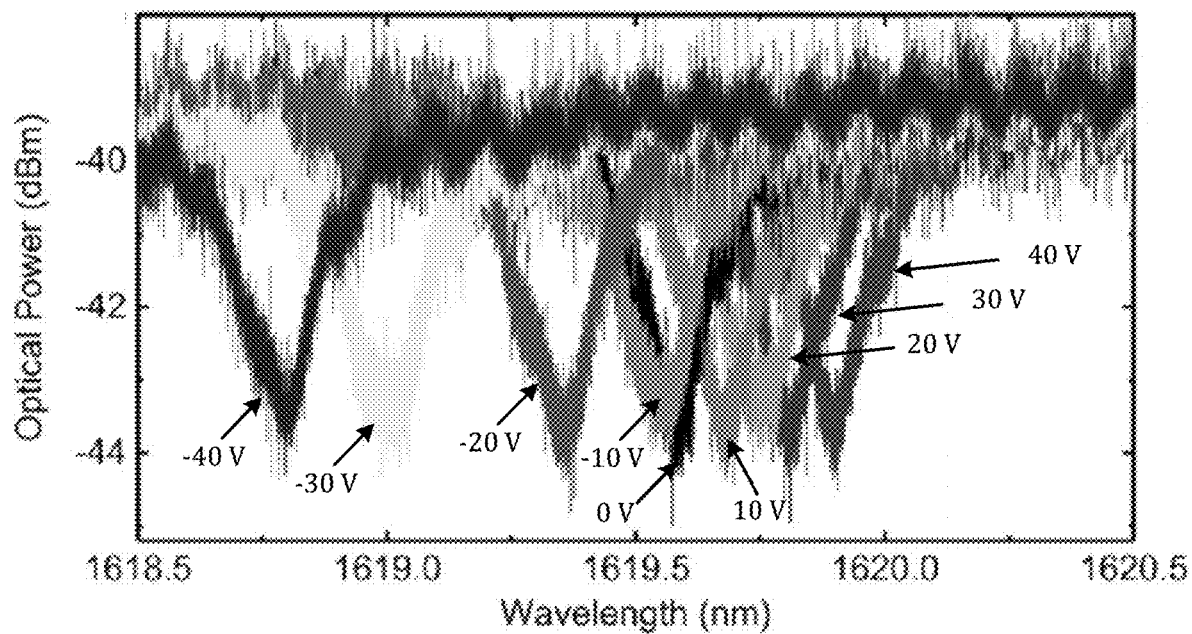
FIG. 38A is a graph that illustrates measured spectra of the low-ER modulator under positive and negative applied voltages according to various embodiments.

FIG. 38A is a graph that illustrates measured spectra of the low-ER modulator under positive and negative applied voltages according to various embodiments.

Figure 38B:
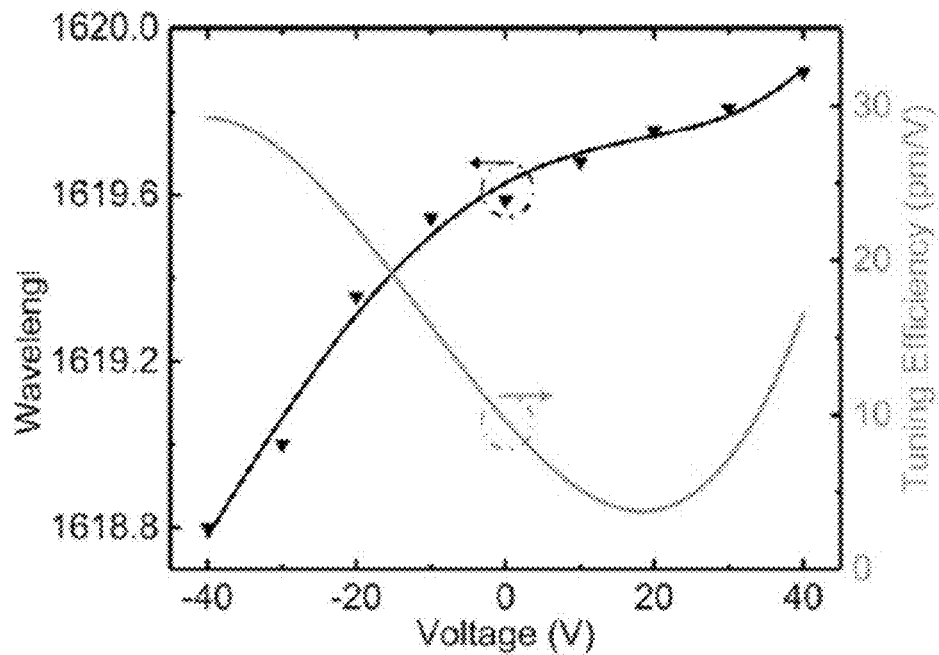
FIG. 38B is a graph that illustrates resonance wavelengths for a wide range of applied voltages according to various embodiments.

FIG. 38B is a graph that illustrates resonance wavelengths for a wide range of applied voltages according to various embodiments. A low-ER under-coupled microring modulator may be designed by setting the coupling gap between the ring and bus waveguide to ~500 nm. FIG. 38A shows the measured spectra under positive and negative applied voltages and FIG. 38B shows the measured values of the resonance wavelength and the tuning efficiency. The outer bottom electrode in this device showed −200 nm misalignment which according to FIG. 36B, should result in a tuning efficiency of ~8.9 pm/V. This is in agreement with the measurement at 0 V.

Figure 39A:
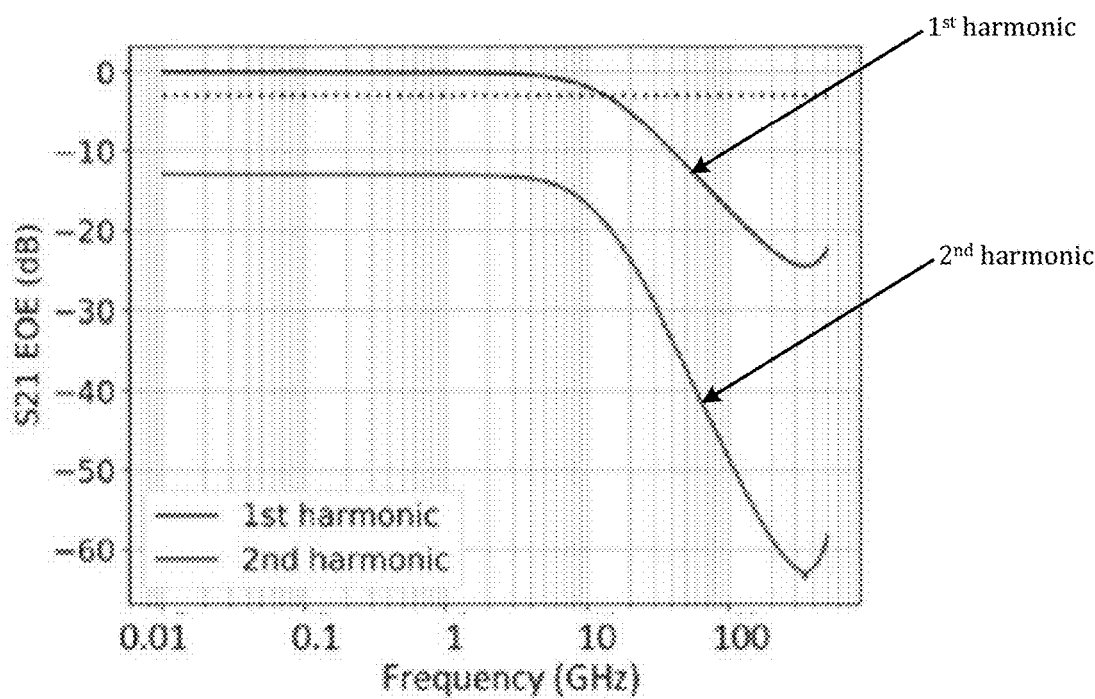
FIG. 39A is a graph that illustrates simulated electro-optical frequency response (first harmonic) and nonlinearity (second harmonic) of the fabricated LN modulator at 1 GHz of optical detuning from the resonance according to various embodiments.

FIG. 39A is a graph that illustrates simulated electro-optical frequency response (first harmonic) and nonlinearity (second harmonic) of the fabricated LN modulator at 1 GHz of optical detuning from the resonance according to various embodiments. A 3-dB bandwidth of >10 GHz is observed for the first harmonic.

Figure 39B:
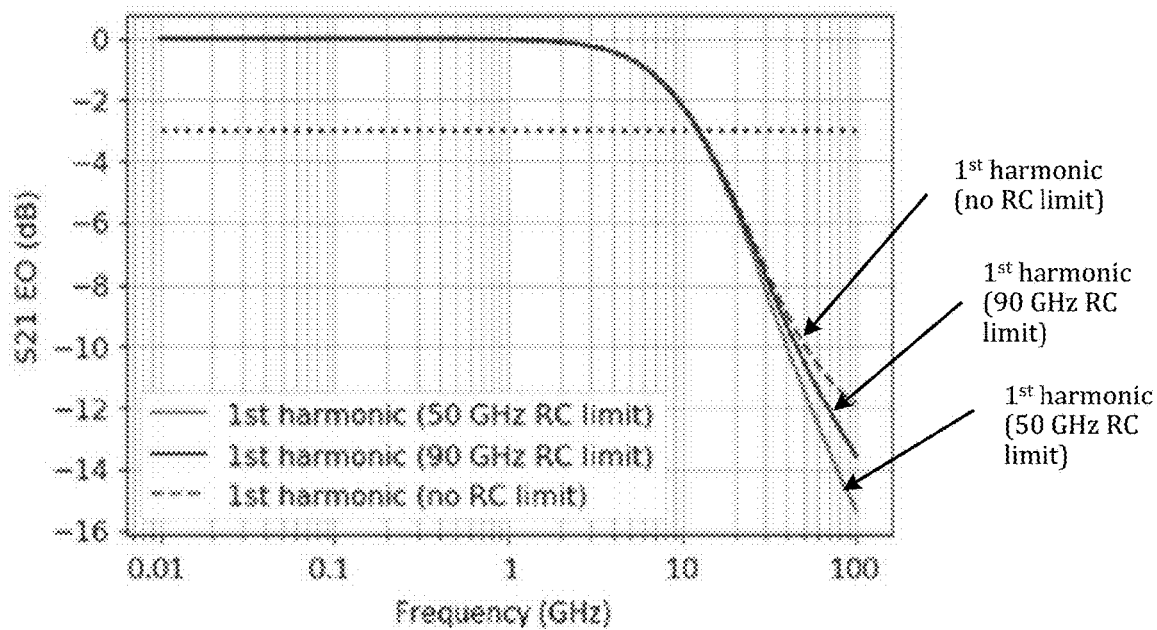
FIG. 39B is a graph that illustrates the impact of the RC bandwidth limitation on the electro-optical frequency response (first radio frequency (RF) harmonic) of the fabricated LN modulator according to various embodiments.

FIG. 39B is a graph that illustrates the impact of the RC bandwidth limitation on the electro-optical frequency response (first RF harmonic) of the fabricated LN modulator according to various embodiments. Considering a phase shifter embedded in a microring resonator, a linear phase relation between applied RF voltage and the electro-optical phase shift in case of a small signal excitation can generally be assumed. If the input light has no RF harmonics, the output light of the modulator may be accompanied by all of the RF harmonics (i.e., modulation sidebands). The theory of RF-optical harmonic coupling can be used to analytically model the electro-optic frequency response of the fabricated microring modulator.

The electro-optical frequency response for the first two RF harmonics (normalized to the first harmonic) may be calculated and plotted in FIG. 39A at 1 GHz of resonance detuning. The electrical power of the first harmonic of the output light may drop to half at 12 GHz, indicating a 3-dB electrical-to-optical-to-electrical bandwidth of >10 GHz. It is worth noting that the definition of linear (small-signal) bandwidth may lose its meaning exactly at the resonance because the optical transfer function of the modulator is quadratic and has zero linear term. Hence, it may not output any 1st-order harmonic. FIG. 39B shows that the bandwidth of our modulator (first RF harmonic) may not experience any change for an RC bandwidth of 90 GHz (Cmod~35.1 fF and resistance=50Ω). Even if the extra 29 fF from the contact pads and metal traces (RC bandwidth of 50 GHz) is considered, the 3-dB electro-optical bandwidth remains nearly unchanged indicating the dominance of the photon lifetime.

A unified theory for analyzing the frequency conversion between an RF voltage and an optical carrier in an electrooptic modulator can be realized. Such a theory can result in the electro-optic coupled harmonic equation (EOCHE) that encompasses the electro-optic behavior of common types of modulators (lumped, traveling wave, resonant, and the like) and provide closed-form solutions for the small-signal frequency response and the large-signal intermodulation effects. In particular, the small-signal electro-optic frequency responses of lumped and traveling-wave Mach-Zehnder modulators, and resonant microring modulators may be derived. It can be shown that the concept of velocity-mismatch applies to cases when designing traveling-wave modulators. Therefore, to generalize the design of electro-optic modulators a universal concept called the "effective RF phase" that governs how the optical power is exchanged between different RF harmonics of light can be applied. Using the EOCHE, a generalization of the widely used transfer matrix method for photonic circuits to fully capture the RF mixing effects in integrated photonic circuits, which is analogous to the steady-state AC analysis of electrical circuits can be implemented. The simplicity and versatility of our approach make it a holistic tool for designing high-speed electro-optic modulators.

High-speed electro-optic modulators can potentially provide advantages to optical communications. Among different structures suitable for amplitude modulation, Mach-Zehnder interferometers (MZIs) in the form of lumped or traveling-wave structures and the resonant microring structures are conventional approaches in various material platforms such as silicon photonics or thin film lithium niobate. Two factors affect performance metrics of a modulator equipped with an optical phase shifter are the phase shifter efficiency per volt ($|\partial \phi_{EO}/\partial v|=\pi/V_\pi$) and the small-signal electro-optic (EO) bandwidth (measured small-signal $S_{21}$ based on the electrical-to-optical-to-electrical conversion). Although the phase shifter efficiency may be straight-forward to calculate based on an electro-static simulation and coupling it to an optical eigen-mode simulation, the calculation of the EO bandwidth may be more difficult. Such difficulty can be attributed to the nonlinear optical transfer function (i.e., optical intensity) of modulators and the fact that RF harmonics of the electric field of light are mixed together once more when transformed into the optical intensity through a photodetector.

The small-signal EO frequency response may be used to rectify the nonlinearity of the optical transfer function and provide insights into the high-speed performance of the EO modulators. A traveling-wave Mach-Zehnder modulator (TWMZM) driven in a push-pull way may be adopted as a structure for lithium-niobate, indium phosphide, and silicon photonics platform. The EO frequency responses of a TWMZM signify the impact of the velocity matching between the optical and RF waves along the structure on the small-signal EO modulation bandwidth. Although the concept of velocity mismatch is usually defined for either the phase velocities of the optical and RF signals, or the group velocities of both, it can be demonstrated, as described herein, that the most accurate definition of the velocity mismatch in the context of EO frequency response is between the phase velocity of the RF wave and the group velocity of the optical wave. The appearance of the optical group velocity in the equations of EO frequency response of TWMZM may be due to a fundamental property of EO phase shifters that cannot be unveiled using the conventional mathematical derivations in the literature for integrated modulators with sub-wavelength dimensions and high optical confinement, but may be conferred by examining the experimental results of integrated optical modulators. It can also be shown that this fundamental property may be present for lumped phase shifters as well and may have a significant impact on the EO frequency response of the resonant modulators. This can be shown by deriving the exact closed-form solution of the EO frequency response of lumped (and traveling-wave) microring modulators in a simple way and showing how the optical group velocity inside the resonator leads to the EO frequency peaking phenomenon that has been experimentally observed. Although the conventional approach based on the perturbation theory has been successful in deriving the small-signal EO frequency response of microring modulators, it may not provide insight into the inter-modulation effects for the higher-order RF harmonics of light, which is a piece of information that may be useful for analog RF photonics applications. It can be shown that inter-modulation effects are an essential part of the theory and naturally appear in our formulation. It can also be shown that the conventional transfer matrix method (TMM) may not be employable to derive the small-signal EO frequency response of photonic circuits because it does not incorporate the mixing of RF harmonics of light. Hence, a generalization of the TMM that fully captures the evolution of RF harmonics inside a photonic circuit may be desirable and may be accomplished via the theory described below.

A unified RF-optical harmonic theory that is applicable to all common types of electro-optic modulators is described. The theory can be summarized into a single differential equation called the electro-optic coupled harmonic equation (EOCHE) for linear EO phase shifters. A variant can be presented for electrically nonlinear phase shifters. One insight from the EOCHE is that the optical power is exchanged between the generated RF harmonics of light via the effective RF phase, from which the concept of velocity mismatch can be derived. EOCHE can be used to develop a generalized transfer matrix method for photonic circuits that can accurately track the evolution of RF harmonics from their point of injection to the output ports. The conventional transfer matrix method for photonic circuits is analogous to the DC analysis of an electrical circuit, while the presently described generalized transfer matrix method is analogous to the large-signal steady-state AC analysis (with the accompanying DC bias solution) of an electrical circuit. Finally, EOCHE may be to derive explicit equations for the EO frequency response of lumped and traveling-wave MZIs as well as lumped and traveling-wave resonant microring modulators.

Throughout this entire disclosure, the following terminology and notation is used: a parameter with bar "–" on top means a per-unit-length quantity; a parameter with hat "∧" means a phasor quantity; a parameter with tilde "∼" means a reduced quantity, i.e., part of a simplified equation; a parameter with "opt" subscript or superscript means an optical quantity; a parameter with "RF" subscript means a large-signal RF quantity; a parameter with "rf" subscript means either a small-signal or a large-signal RF quantity; and an asterisk "*" denotes complex conjugation of a quantity. It is also assumed that all RF frequencies are much smaller than the optical frequency.

Figure 40A:
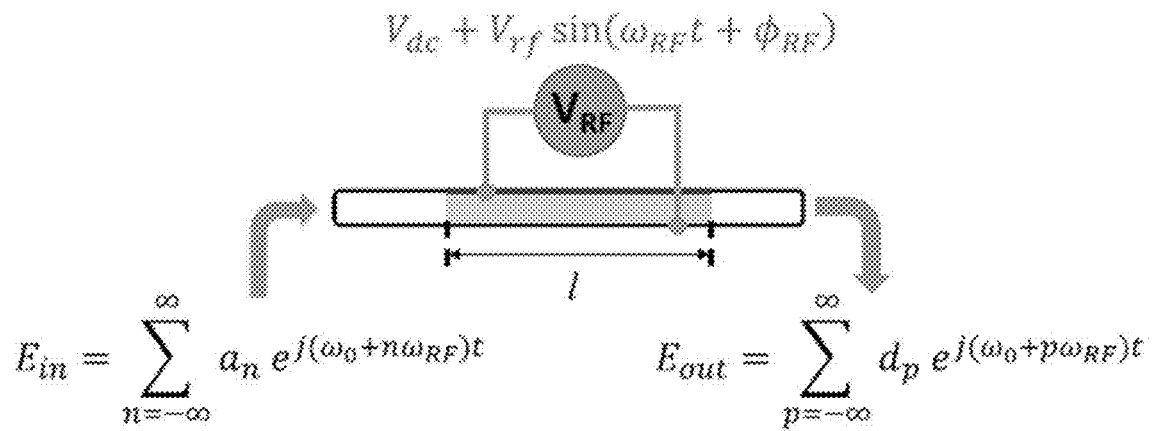
FIG. 40A is a schematic diagram illustrating the most general case of RF mixing into light in a lumped electro optic modulator according to various embodiments.

A lumped and electrically linear EO phase shifter as shown in FIG. 40A can be considered. In the absence of any applied voltage (DC or RF), the phase shifter may add a passive propagation phase delay $\bar{\phi}_{prop}xl$ to the electric field of a monochromatic input light.

FIG. 40A is a schematic diagram illustrating the most general case of RF mixing into light in a lumped electro optic modulator according to various embodiments.

FIG. 40 B is a schematic diagram illustrating discrete-system representation of the lumped EO phase shifter in the steady-state according to various embodiments. The dc response may be characterized by $$\dot{\zeta}_{dc} = \alpha_{opt} + j(\bar{\phi}_{prop}(\omega_0) + \overline{\Delta\phi}_{dc}).$$

and can attenuate it by exp $(-\bar{\alpha}_{opt}l)$. In the presence of an applied voltage, the EO phase shift is given by $$\Delta\phi_{EO} = \Delta\phi_{dc} + \frac{\partial\phi_{EO}}{\partial v}\bigg|_{bias} \times V_{rf}\sin(\omega_{RF}t + \phi_{RF}). \quad (13)$$

For an EU phase shifter, the phase shift per unit length may be a characteristic parameter of the internal workings of the phase shifter, therefore $$\Delta\phi_{dc} = \left(\frac{\Delta\phi_{dc}}{l}\right)l = \Delta\left(\frac{\phi_{dc}}{l}\right) \times l = \overline{\Delta\phi}_{dc} \times l. \quad (14)$$

Using the following definition for the phase modulation efficiency:

$$\gamma_{RF} = -\frac{\partial\phi_{EO}}{\partial v}\bigg|_{bias} V_{rf} = -\frac{\partial}{\partial v}\left(\frac{\phi_{EO}}{l}\right)V_{rf}l = \bar{\gamma}_{RF}l, \quad (15)$$

And the EO phase shift may be given by $$\Delta\phi_{EO} = \overline{\Delta\phi}_{dc}l - \bar{\gamma}_{RF}l\sin(\omega_{RF}t + \phi_{RF}) \quad (16)$$

Now consider the general case in which the input light already carries RF harmonics with frequencies $\omega_n = \omega_0 + n\omega_{RF}$ and complex amplitudes $\alpha_n$ as shown in FIG. 40A. Here, $\omega_0$ $\alpha_n$ is the optical carrier frequency. In this case, the evolution of the input light through the phase shifter is given by $$E_{out} = \left(\sum_{n=-\infty}^{\infty} a_n e^{j\omega_n t} e^{-\bar{\alpha}_{opt}l} e^{-j\bar{\phi}_{prop}(\omega_n)l}\right) \times e^{-j\overline{\Delta\phi}_{dc}l} e^{j\bar{\gamma}_{RF}l\sin(\omega_{RF}t + \phi_{RF})}. \quad (17)$$

The term in parenthesis describes the propagation of each RF harmonic of the input light and the other terms are the effect of the lumped phase shifter. Using the Jacobi-Anger expansion $\exp(j\bar{\gamma}_{RF}l\sin(\omega_{RF}t + \phi_{RF}))$ for and first Taylor series expansion for $\bar{\phi}_{prop}(\omega_0 + n\omega_{RF})$ the output light can be written in terms of the Bessel functions:

$$E_{out} = e^{-\bar{\alpha}_{opt}l} e^{-j\bar{\phi}_{prop}(\omega_0)l} e^{-j\overline{\Delta\phi}_{dc}l} \times \quad (18)$$
$$\sum_{n=-\infty}^{\infty}\sum_{m=-\infty}^{\infty} e^{-jn\omega_{RF}\bar{\tau}_g^{opt}l} a_n J_m(\bar{\gamma}_{RF}l) \times e^{j[\omega_0 + (m+n)\omega_{RF}]t} e^{jm\phi_{RF}}$$

where $\bar{\tau}_g^{opt}$ is the optical group delay per unit length of the phase shifter calculated from the optical group velocity:

$$\bar{\tau}_g^{opt} = \frac{\partial(\bar{\phi}_{prop})}{\partial\omega}\bigg|_{at\omega_0} = \frac{1}{v_g^{opt}}. \quad (19)$$

Using a change of variable p=m+n, the RF harmonics at the output can be regrouped as:

$$E_{out} = \sum_{p=-\infty}^{\infty} d_p e^{j(\omega_0 + p\omega_{RF})t} \quad (20)$$

where $$d_p = e^{-\bar{\zeta}_{dc}l}\sum_{n=-\infty}^{\infty} a_n J_{p-n}(\bar{\gamma}_{RF}l) e^{j(p-n)\phi_{RF}} e^{jn\omega_{RF}\bar{\tau}_g^{opt}l} \quad (21)$$

and $\bar{\zeta}_{dc} = \bar{\alpha}_{opt} + j\bar{\phi}_{prop}(\omega_0 + j\overline{\Delta\phi}_{dc}$ The summation can be viewed as a convolution sum, e.g., $$d_n = e^{-\bar{\zeta}_{dc}l}(a_n e^{-jn\omega_{RF}\bar{\tau}_g^{opt}l}) \otimes (J_n(\bar{\gamma}_{RF}l) e^{jn\phi_{RF}}) \quad (22)$$

Figure 40B:
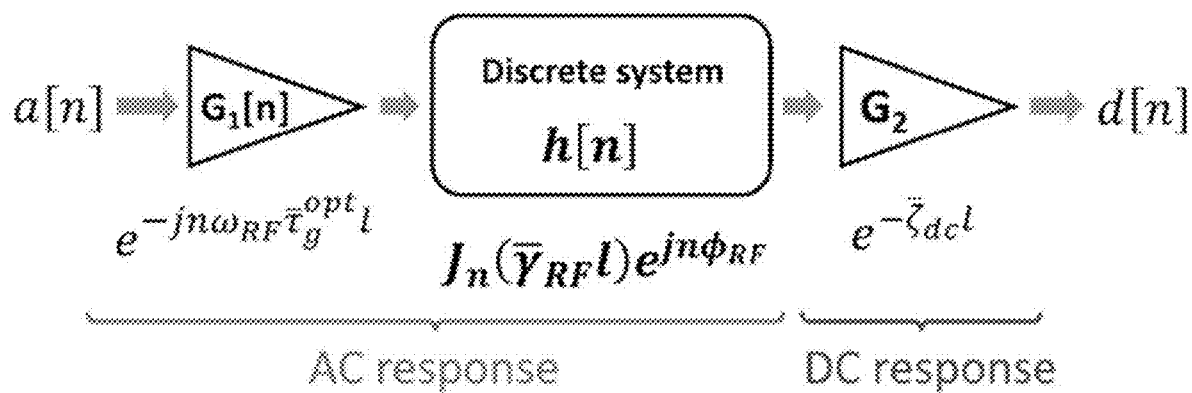
FIG. 40B is a schematic diagram illustrating discrete-system representation of the lumped EO phase shifter in the steady-state according to various embodiments.

As shown in FIG. 40B, the lumped EO phase shifter acts as a cascade of three discrete systems. The first is the harmonic dependent unidirectional gain, the second represents the RF harmonic mixing into light with a discrete impulse response given by $G_1[n] = e^{-jn\omega_{RF}\bar{\tau}_g^{opt}l}$, the second represents the RF harmonic mixing into light with a discrete impulse response given by:

$$h[n] = J_n(\bar{\gamma}_{RF}l) e^{jn\phi_{RF}} \quad (23)$$

and the third is the DC response of the phase shifter at optical frequency $\omega_0$ given by $G_2 = e^{-\bar{\zeta}_{dc}l}$. Note that the output is $G_2h[n]$ when $\alpha_n$ is set to the discrete impulse; e.g., $(a_n = \delta[n])$ when the input $G_1[n]$ $h[n]$ light may not have any RF harmonics. It is worth pointing out that the combination of and blocks in FIG. 40B represents the electro-optic steady-state AC response of the phase shifter which is accompanied by the DC response of the phase shifter. This behavior is interestingly analogous to the AC analysis of electrical circuits.

In general, the internal mechanisms of a lumped EO phase shifter place an RC electrical bandwidth limit on the EO response (due to the capacitive nature of the EU phase shifter). This effect can be readily incorporated in an analysis. The complex frequency response of the RC circuit is then:

$$\bar{\gamma}_{RF} \rightarrow |H_{RC}(\omega_{RF})| \times \bar{\gamma}_{RF} \quad (24a)$$

$$\phi_{RF} \rightarrow \arg(H_{RC}(\omega_{RF})) + \phi_{RF} \quad (24b)$$

The intensity of the modulated light at the output of the phase shifter is given by $$|E_{out}|^2 = \sum_{n=-\infty}^{\infty}\sum_{m=-\infty}^{\infty} d_n d_m^* e^{j(n-m)\omega_{RF}t} \quad (25)$$
$$= \sum_{q=-\infty}^{\infty} I_q e^{jq\omega_{RF}t}$$
$$= I_0 + \sum_{q=1}^{\infty} 2|I_q|\sin\left(q\omega_{RF}t + \phi_q + \frac{\pi}{2}\right)$$

where q=n−m and the coefficients $I_q$ are the convolution sum of the complex amplitudes of the RF harmonics of the optical E-field:

$$I_q = I[q] = d[q] \otimes d^*[-q]. \quad (26)$$

This optical intensity goes through a photodetector (linear transformation into electrical current) and is measured after conversion into voltage. The electrical-to-optical-to-electrical (EOE) conversion efficiency $S_{21}$ for each RF harmonic can then be defined as the ratio between the output electrical power of that RF harmonic to the power of the RF excitation. This EOE efficiency is then typically normalized to its DC (low frequency) value and expressed in dBe unit:

$$\left(S_{21}^{EOE}\right)_{n^{th}-harmonic} = 20\log_{10}\left|\frac{I_n(\omega_{RF})}{I_n(0)}\right| \quad (27)$$

$$= 10\log_{10}\left|\frac{I_n(\omega_{RF})}{I_n(0)}\right|^2$$

Figure 41A:
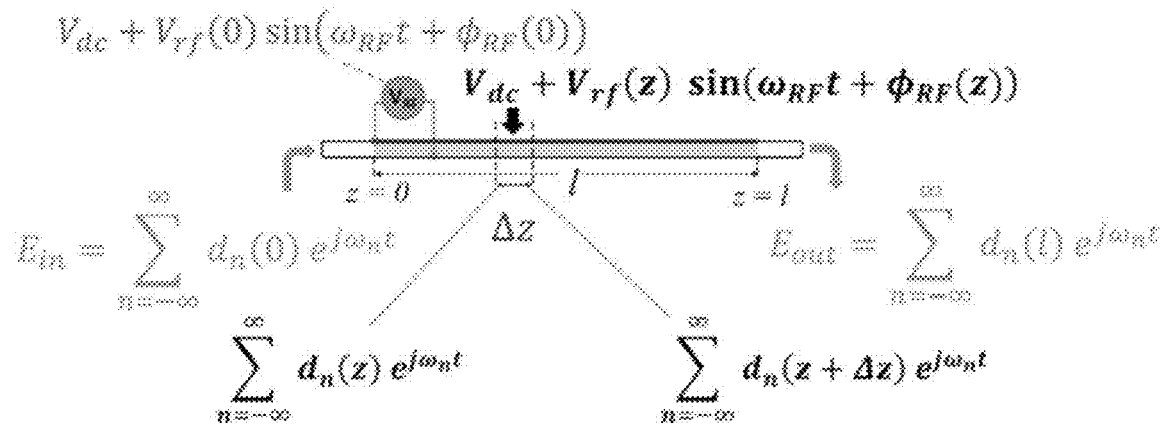
FIG. 41A is a general representation of the evolution of RF harmonics along a traveling-wave phase shifter according to various embodiments.

A traveling-wave phase shifter belongs to a general class of electro-optic phase shifters for which the amplitude and the phase of the sinusoidal RF voltage vary along the phase shifter. It is assumed $\phi_{prop}$ ($\omega_0$) that the DC voltage and the phase shifter's attenuation and phase constant do not vary in z. As shown in FIG. 41A, the RF voltage at each point along the transmission line can be written in terms of the voltage phasor:

$$V_{rf}(z,t) = \text{Re}\left\{\hat{V}_{rf}(z)e^{j\omega_{RF}t}e^{\frac{-j\pi}{2}}\right\} \quad (28)$$

$$= |\hat{V}_{rf}(z)|\sin(\omega_{RF}t + \phi_{RF}(z)).$$

Figure 41B:
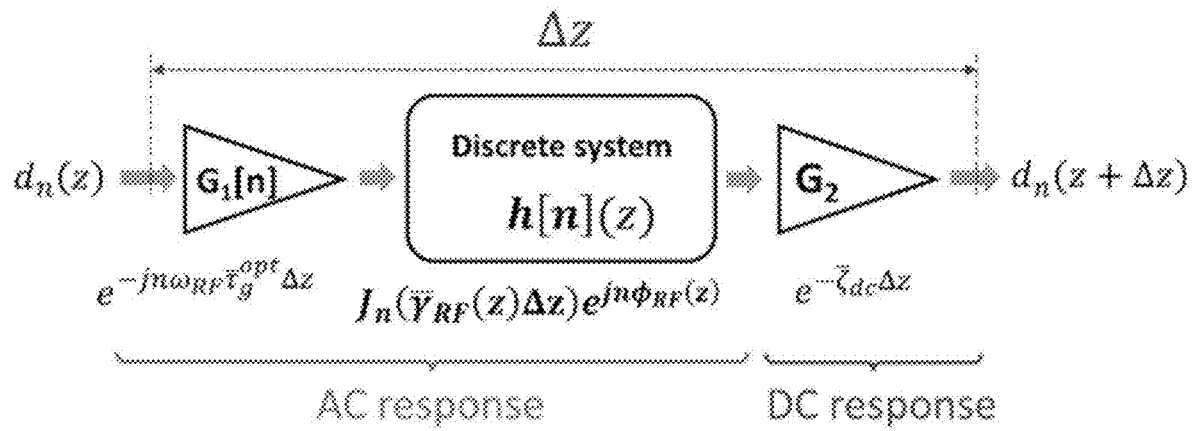
FIG. 41B is a lumped model of a differential segment of the traveling-wave phase shifter according to various embodiments.

In order to investigate the evolution of the RF harmonics of the optical field, the most general representation of the optical field along the phase shifter can be considered as $$E_{opt} = \sum_{n=-\infty}^{\infty} d_n(z)e^{j\omega_n t} \quad (29)$$

where ($\omega_n = \omega_0 + n\omega_{RF}$) for which the complex amplitudes of the RF harmonics of light evolve along the z-axis. As shown in FIG. 41B, over a very small length of the phase shifter (from z to z+$\Delta$ z), it can be considered to be a lumped phase shifter.

FIG. 41A is a general representation of the evolution of RF harmonics along a traveling-wave phase shifter according to various embodiments. FIG. 41B is a lumped model of a differential segment of the traveling-wave phase shifter according to various embodiments.

Figure 42A:
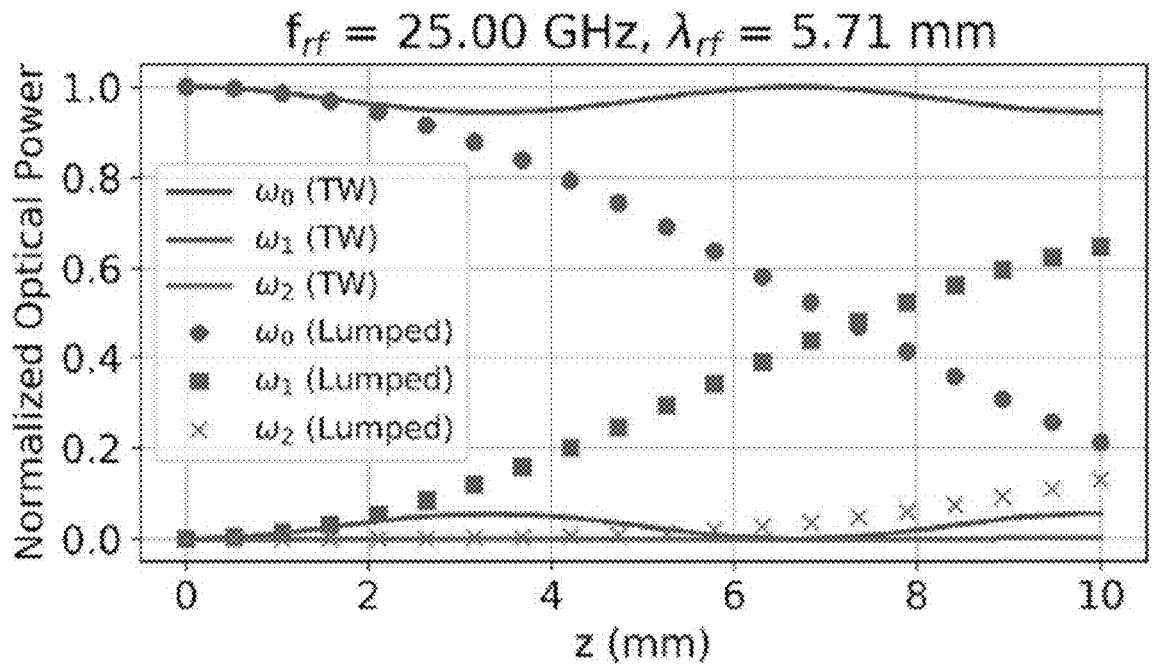
FIG. 42A is a graph that illustrates a comparison of the optical power exchange between RF harmonics for lumped and an impedance-matched traveling-wave (TW) phase shifter with high velocity mismatch according to various embodiments.
Figure 42B:
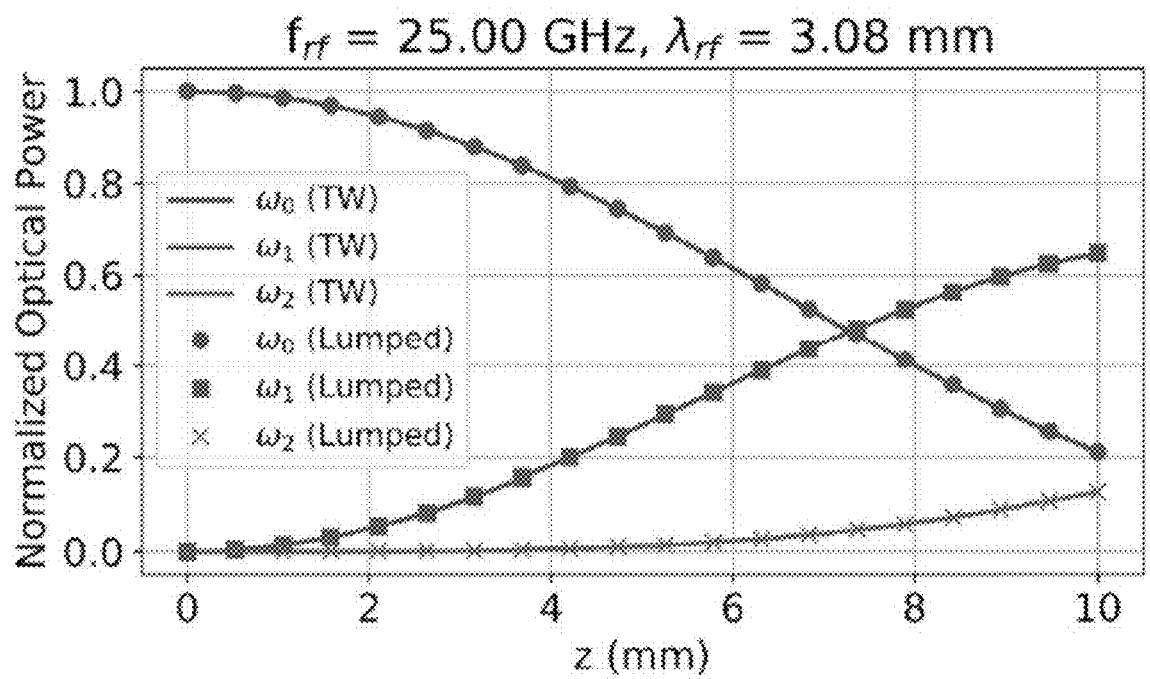
FIG. 42B is a graph that illustrates a comparison of the optical power exchange between RF harmonics for lumped and an velocity-matched traveling-wave (TW) phase shifter according to various embodiments.

FIG. 42A is a comparison of the optical power exchange between RF harmonics for lumped and an impedance-matched traveling-wave (TW) phase shifter with high velocity mismatch and FIG. 42B shows the velocity being matched. The relation between the input and output RF harmonics of this differential segment is $$d_n(z+\Delta z) = (d_n(z)G_1[n] \otimes h[n](z)) \times e^{-\bar{\zeta}_{dc}\Delta z} \quad (30)$$

where the optical group delay for the harmonic-dependent phase delay $G_1[n]$ is calculated from eq. (19). The convolution sum in eq. (23) includes $d_n(z)$, $d(z)$, $G_1[n]$ and the discrete harmonic response of the differential phase shifter obtained from eq. (23):

$$h[n](z) = J_n(\bar{\gamma}_{RF}(z) + \Delta z)e^{jn\phi_{RF}(z)} \quad (31)$$

where the phase modulation efficiency and the RF phase are now clearly both functions of z. Note that RF(z) is $\bar{\gamma}_{RF}^{(z)}$ defined based on the magnitude of the RF voltage phasor $|V_{rj}(z)|$ in eq. (3) so that:

$$\bar{\gamma}_{RF}(z) = -\frac{\partial\left(\frac{\phi_{EO}}{l}\right)}{\partial v}\bigg|_{bias} \times |\hat{V}_{rj}(z)| = -\frac{\pi}{V_\pi L}|\hat{V}_{rj}(z)|$$

Using the first-order Taylor expansion $d_n(z+\Delta z)$ of and small-argument expansion of Bessel functions and letting $\Delta z \to 0$, the following differential equation can be derived:

$$\frac{\partial}{\partial z}d_n(z) = \quad (33)$$

$$-\left(\bar{\zeta}_{dc} + j\frac{n\omega_{RF}}{v_g^{opt}}\right)d_n(z) + \frac{1}{2}\bar{\gamma}_{RF}(z)\left(e^{j\phi_{RF}(z)}d_{n-1}(z) - e^{-j\phi_{RF}(z)}d_{n+1}(z)\right)$$

This method is called electro-optic coupled harmonic equation (EOCHE) for linear EO phase shifters. In order to solve the EOCHE, it can be noted that a change of variable $$d_n(z) = \tilde{d}_n(z) \times e^{-\left(\bar{\zeta}_{dc} + j\frac{n\omega_{RF}}{v_g^{opt}}\right)z} \quad (34)$$

simplifies the equation and results in the reduced electro-optic coupled harmonic equation (R-EOCHE):

$$\frac{\partial}{\partial z}\tilde{d}_n(z) = \frac{1}{2}\bar{\gamma}_{RF}(z) \times \left(e^{j\tilde{\phi}_{RF}(z)}\tilde{d}_{n-1}(z) - e^{-j\tilde{\phi}_{RF}(z)}\tilde{d}_{n+1}(z)\right) \quad (35)$$

where the effective RF phase (reduced RF phase) along the transmission line is defined as $$\tilde{\phi}_{RF}(z) = \phi_{RF}(z) + \frac{\omega_{RF}}{v_g^{opt}}z. \quad (36)$$

The solution of the R-EOCHE conserves the optical power along the phase shifter whereas the solution to EOCHE does not. Physically, the R-EOCHE describes how the optical power is exchanged between different RF harmonics of light as they get generated and propagate inside the phase $d_n(z)$ shifter. It is worth noting that in general EOCHE is valid even if the coefficient of on the right-hand side of eq. (33) varies with z. By knowing the complex amplitudes of the RF harmonics of light at the input of the phase shifter (e.g., z=0), the solution of the EOCHE provides the complex amplitudes of the RF harmonics at the output of the phase shifter. In FIG. 42A, there is a comparison between the solutions of a lumped $d_n(0)=8[n]$, $n_{eff}^{RF}=2.1$ and an $n_g^{opt}=3.9$, $\bar{\alpha}_{RF}=0$, $\bar{\alpha}_{opt}=0$ impedance-matched traveling-wave with strong velocity mismatch (solid curves) for the total optical power of the first three RF harmonics of light ($\omega_0$, $\omega_1$, $\omega_2$) along a 10-mm long waveguide phase shifter with a 25 GHz applied RF voltage (assuming. From FIG. 42A, a travelling-wave phase shifter with mismatched velocities is unable to effectively transfer power from $\omega_0$ to $\omega_1$. FIG. 42B shows that efficient power transfer occurs when the RF phase velocity and optical group velocity are matched $$\left(n\frac{RF}{eff} = 3.9, n\frac{opt}{g} = 3.9\right).$$

Figure 43A:
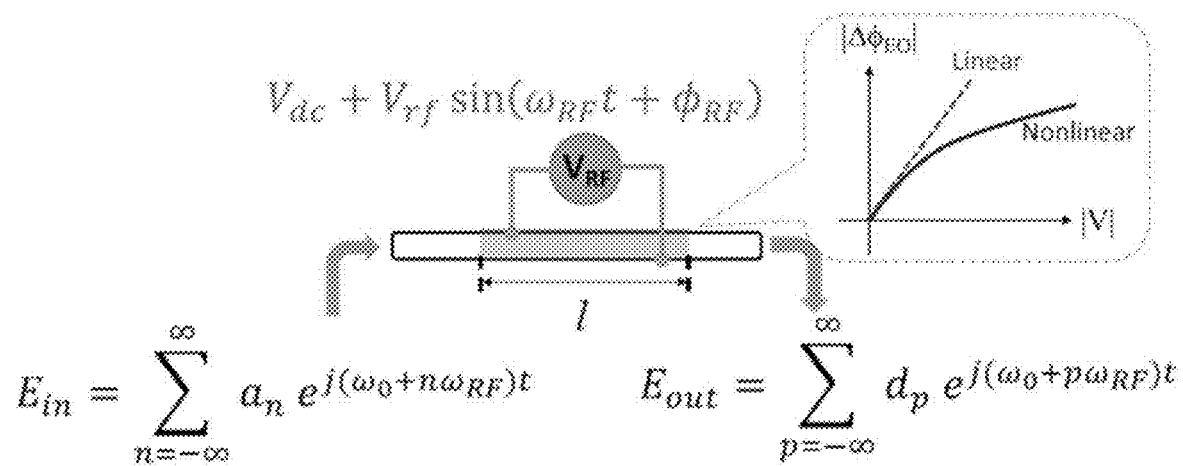
FIG. 43A is a schematic illustration of a lumped nonlinear EO phase shifter according to various embodiments.
Figure 43B:
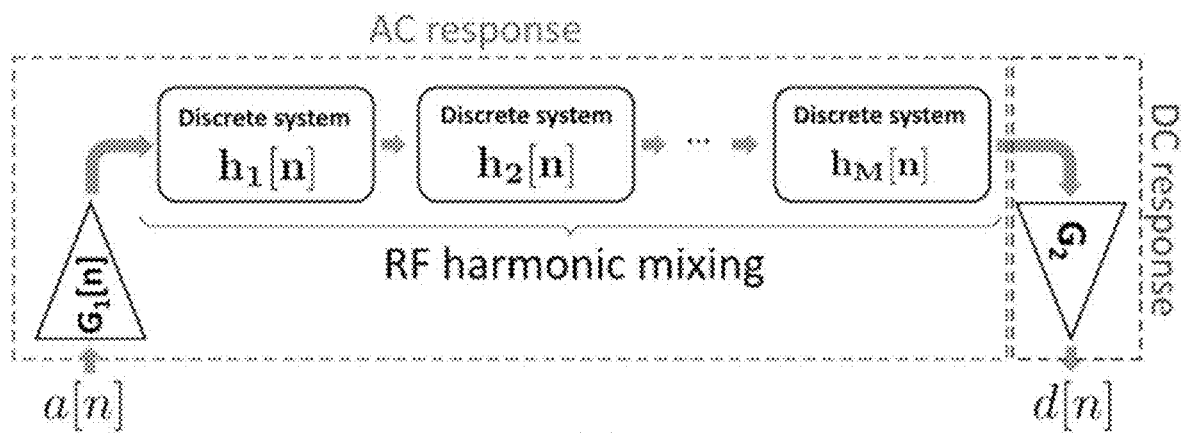

This is because the effective RF phase is zero for FIG. 43A which is a lumped nonlinear EO phase shifter. FIG. 43B is an equivalent discrete representation of a lumped nonlinear phase shifter. Note that the order of the discrete $h_k[n]$ systems does not matter. Thus, in the absence of RF loss, the coupling of harmonics is identical to that of a lumped phase shifter.

FIG. 43A is a schematic illustration of a lumped nonlinear EO phase shifter according to various embodiments.

FIB. 43B is a schematic illustration of an equivalent discrete representation of a lumped on-linear phase shift according to various embodiments.

A electrically nonlinear EO phase shifter is defined as a phase shifter for which the induced EO phase shift is a nonlinear function of the applied voltage (typically given as a power series) while the phase shift still remains independent of the intensity of the input light (e.g., no self-phase modulation). This is typically the case for silicon-based PN junction phase shifters. The nonlinearity of a lumped EO phase shifter as shown in FIG. 43A generates higher-order harmonics in the optical phase when a sinusoidal RF voltage is applied. Therefore, for a nonlinear phase shifter, the following harmonic representation is considered:

$$\Delta\phi_{EO} = \overline{\Delta\phi}_{dc} l - \sum_{k=1}^{M} \overline{\gamma}_{RF}^{(k)} l \sin(k\omega_{RF} t + \phi_{RF}^{(k)}). \tag{37}$$

The superscripts (k) denote the harmonic index. Plugging this phase shift into eq. (17) results in the discrete system representation shown in FIG. 43B where the discrete impulse response of each block is given by $$h_k[n] = \begin{cases} J_{\frac{n}{k}}(\gamma_{RF}^{(k)} l) e^{j\frac{n}{k}\phi_{RF}^{(k)}} & \text{if } \frac{n}{k} \text{ is integer} \\ 0 & \text{otherwise} \end{cases} \tag{38}$$

Using this representation, it is straightforward to show that after the change of variable in eq. (22), the R-EOCHE generalizes to the following equation for a nonlinear phase shifter with a traveling-wave electrode configuration:

$$\frac{\partial}{\partial z}\tilde{d}_n(z) = \sum_{k=1}^{M} \frac{1}{2}\tilde{\gamma}_{RF}^{(k)}(z)\left(e^{j\phi_{RF}^{(k)}(z)}\tilde{d}_{n-k}(z) - e^{-j\phi_{RF}^{(k)}(z)}\tilde{d}_{n+k}(z)\right). \tag{39}$$

This is the electrically nonlinear reduced electro-optic coupled harmonic equation (ENR-EOCHE) which shows how the evolution of the large-signal RF harmonics of the light depends on the effective RF phase of each harmonic given by $$\tilde{\phi}_{RF}^{(k)}(z) = \phi_{RF}^{(k)}(z) + k\frac{\omega_{RF}}{v_g^{opt}} z. \tag{28}(40)$$

For the small-signal AC response, only k=1 is important because $\overline{\gamma}_{RF}$ depends on higher-order powers of $|\hat{V}_{rf}|$ for ≥2. Therefore, ENR-EOCHE reduces to R-EOCHE for the small-signal analysis. The EOCHE, R-EOCHE, and ENR-EOCHE can all be written in a matrix form because of their linearity with respect to the harmonic amplitudes. Starting with a vector definition of the complex RF harmonic amplitudes of light and the reduced amplitudes along the phase shifter as $$\vec{d}(z) = \begin{bmatrix} \vdots \\ d_{-2}(z) \\ d_{-1}(z) \\ d_0(z) \\ d_1(z) \\ d_2(z) \\ \vdots \end{bmatrix}, \vec{\tilde{d}}(z) = \begin{bmatrix} \vdots \\ \tilde{d}_{-2}(z) \\ \tilde{d}_{-1}(z) \\ \tilde{d}_0(z) \\ \tilde{d}_1(z) \\ \tilde{d}_2(z) \\ \vdots \end{bmatrix} \tag{41}$$

the relation $$\vec{d}(z) = \exp(\int_0^z \overline{D}dz') \cdot \vec{\tilde{d}}(z) \tag{42}$$

follows from eq. (34) with the elements of the diagonal matrix D given by $$\overline{D}_{mn} = \begin{cases} -\left(\overline{\zeta}_{dc} + j\frac{n\omega_{RF}}{v_g^{opt}}\right) & \text{for } m = n \\ 0 & \text{otherwise} \end{cases}. \tag{43}$$

The matrix representation of the R-EOCHE is $$\frac{\partial}{\partial z}\vec{\tilde{d}}(z) = \tilde{M}(z)\vec{\tilde{d}}(z) \tag{44}$$

where $$\tilde{M}_{mn} = \begin{cases} 0.5\tilde{\gamma}_{RF}(z)e^{j\tilde{\phi}_{RF}(z)} & \text{for } n = m-1 \\ -0.5\tilde{\gamma}_{RF}(z)e^{-j\tilde{\phi}_{RF}(z)} & \text{for } n = m+1 \\ 0 & \text{otherwise} \end{cases}. \tag{45}$$

Note that the indices of the M(z) run from −∞ to +∞ with $\tilde{M}_{00}$ being at the center of the matrix. It can be shown that for any two parameters $z_1$ and $z_2$, the matrix commutes $\tilde{M}(z)$ with itself, e.g. Thus, the $\tilde{M}(z_1)\tilde{M}(z_2) = \tilde{M}(z_2)\tilde{M}(z_1)$ general solution of the R-EOCHE may be given by $$\vec{\tilde{d}}(z) = \exp(\int_0^z \tilde{M}(z')dz') \vec{\tilde{d}}(0). \tag{46}$$

Therefore, the transfer matrix of a linear electro-optic phase shifter may be written as $$T_{0\to l} = \exp(\int_0^l \overline{D}dz) \cdot \exp(\int_0^l \tilde{M}(z)dz) \tag{47}$$

which is called the generalized transfer matrix (GTM) because. $\vec{d}(l) = T_{0\to l} \cdot \vec{d}(0)$ The first term represents the optical propagation (DC operation point) and the second term represents generation and coupling of RF harmonics of light (steady-state AC operation). Note that for a lumped phase shifter where the coefficients of the EOCHE and R-EOCHE do not depend on z, the components of the T matrix are given by $$T_{mn} = e^{-\overline{\zeta}_{dc} l} e^{-jn\omega_{RF}\overline{z}_g^{opt} l} J_{m-n}(\tilde{\gamma}_{RF} l) e^{j(m-n)\phi_{RF}} \tag{48}$$

based on the convolution sum of eq. (21). A few points are important to highlight with regard to the GTM method, as follows.

For an optical waveguide that does not have a phase shifter, M=0 and the second factor in eq. (35) is unity. More generally, for a linear photonic structure operating at DC (hence no mixing of RF harmonics), the transfer matrix is generalized to a block matrix using diagonal matrices. For example, the transfer matrix of a compact 2×2 coupler given by $$T = \begin{pmatrix} \sigma & -j\kappa \\ -j\kappa & \sigma \end{pmatrix} \quad (49)$$

may be generalized to $$T = \begin{pmatrix} \sigma I & -j\kappa I \\ -j\kappa I & \sigma I \end{pmatrix} \quad (50)$$

where 1 is the identity matrix.

When $\bar{\gamma}_{RF}$ is non-zero, $\overline{D}$ the $\tilde{M}(z)$ and matrices do not commute with each other. Similarly, and do not commute. Therefore, the order of multiplication in eq. (47) cannot be reversed and the relation $\exp(X)\exp(Y)=\exp(X+Y)$ does not hold in eq. (47). Therefore, the solution of the EOCHE cannot be written as where denotes the $\exp(\int_0^z \tilde{M}(z')dz')$ matrix $\tilde{M}(z)$ of coefficients for the EOCHE. Equation (35) is also a valid representation of the solution of the ENR-EOCHE with its corresponding $\tilde{M}(z)$ matrix from eq. (27).

FIG. 44A is a schematic illustration of a lumped Mach-Zehnder modulator according to various embodiments.

FIG. 44B is a schematic illustration of an equivalent discrete system representation of the RF harmonic for the lumped Mach-Zehnder modulator according to various embodiments.

Considering that the input light to the MZI does not have any RF harmonics, the intensity phasor of the first RF harmonic of light at the output of the MZI shown in FIG. 44A is given by $$I_{out}[1] = \sum_{m=-\infty}^{\infty} g[m]g^*[m-1] \quad (51)$$

FIG. 44A shows a schematic of a lumped Mach-Zehnder modulator. FIG. 44B shows an equivalent discrete system representation of the RF harmonic mixing for the lumped MZI. $\delta[n]$ is the discrete delta function. Based on the equation for g[m] from the block diagram of FIG. 44B:

$$g[m] = \frac{1}{2}\left(e^{-\bar{\gamma}dcl}J_m(\bar{\gamma}_{RF}l)e^{jm\phi_{RF}} + e^{-\bar{\alpha}_{opt}l}e^{-j(\bar{\phi}_{prop}(\omega_0)l+\phi_{Bias})}\delta[m]\right) \quad (52)$$

$$(-1)^m g^*[m]\, e^{-2j(\bar{\phi}_{prop}(\omega_0)l + \Delta\bar{\phi}_{dc}l)},$$

$m \neq 0$ it can be concluded that for the relation holds. Thus, for m>0, all the terms in the summation cancel out except $g[-m]g^*[-m-1]=-g^*[m]g[m+1]=-g[m+1]g^*[m]$ for the two terms where m=0 and m=1. The exact large-signal EO AC response of the lumped MZI is $$I_{out}[1] = -0.5j\sin(\overline{\Delta\phi}_{dc}l - \phi_{Bias})J_1(\bar{\gamma}_{RF}l) \times e^{-2\bar{\alpha}_{opt}l}e^{j\phi_{RF}} \quad (53)$$

which simplifies to $$|I_{out}[1]|=0.25|\sin(\Delta\phi_{dc}-\phi_{Bias})||\bar{\gamma}_{RF}l|e^{-2\alpha_{opt}l} \quad (54)$$

for the small-signal RF excitation. This equation implies that the 3 d EO bandwidth of the lumped MZI is related to $|\gamma RF|$; hence, it can be posited that the EO bandwidth, in this case, is only limited by the electrical RC bandwidth of the phase shifter according to section ILA. This equation also reveals that if the phase shift between the two arms is 0 or $\pi$, no RF first harmonic appears in the output light. This can be easily confirmed from the optical transfer function of the MZI given by, the transfer $\cos^2(\Delta\phi/2)$. At $\Delta\phi \to 0$ function is a quadratic function. If it is assumed that, then the $\Delta\phi_{dc}=0$ amplitude of the first harmonic is maximum for, $\phi_{Bias}=\pi/2$ which is the quadrature point.

For a traveling-wave version of the Mach-Zehnder (n=±2, +3, ...) modulator in FIG. 44A of length l, the small-signal EO response may be formed $d_{-1}(l)$ mainly from the interaction of $d_0(l)$, $d_1(l)$, and RF harmonics. Therefore, the R-EOCHE for these three components may be solved by ignoring coupling to the higher-order components. The system of the three coupled equations is given by $$\frac{\partial}{\partial z}\begin{pmatrix}\tilde{d}_{-1}\\ \tilde{d}_0 \\ \tilde{d}_1\end{pmatrix} = \tilde{M}(z)\begin{pmatrix}\tilde{d}_{-1}\\ \tilde{d}_0 \\ \tilde{d}_1\end{pmatrix} \quad (55)$$

where $$\tilde{M}(z) = \frac{1}{2}\bar{\gamma}_{RF}(z)\begin{pmatrix} 0 & -e^{-j\bar{\phi}_{RF}(z)} & 0 \\ e^{-j\bar{\phi}_{RF}(z)} & 0 & -e^{-j\bar{\phi}_{RF}(z)} \\ 0 & e^{-j\bar{\phi}_{RF}(z)} & 0 \end{pmatrix} \quad (56)$$

To solve the system of equations, first the $\tilde{M}(z)$ matrix is integrated and then the result is exponentiated:

$$N = \int_0^l \tilde{M}(z)dz = \begin{pmatrix} 0 & B & 0 \\ -B^* & 0 & B \\ 0 & -B^* & 0 \end{pmatrix} \quad (57)$$

where $$B = -\frac{1}{2}\int_0^l \bar{\gamma}_{RF}(z)\, e^{-j\bar{\phi}_{RF}(z)}dz. \quad (58)$$

The solution is:

$$\begin{pmatrix}\tilde{d}_{-1}(l)\\ \tilde{d}_0(l) \\ \tilde{d}_1(l)\end{pmatrix} = \exp(N)\begin{pmatrix} 0 \\ \tilde{d}_0(0) \\ 0 \end{pmatrix}. \quad (59)$$

The transfer matrix, exp N, can be analytically calculated in this case using the eigenvalues and the eigenvectors of the matrix N. The final result for the EO frequency response is:

$$|I_{out}[1]| = \left|\sin(\overline{\Delta\phi}_{dc}l - \phi_{Bias})\right|\left|B\frac{\sin(\sqrt{2}|B|)}{\sqrt{2}|B|}\right|e^{-2\bar{\alpha}_{opt}l}. \quad (60)$$

For the small-signal approximation it can be assumed that, $\bar{\gamma}_{RF}(z)\times l<<1$ then, and the $\sin(\sqrt{2}|B|)\leq\sqrt{2}|B|$ small-signal EU frequency response becomes proportional to B, which is in accordance with the EO frequency response that was derived. It is worth pointing out that a more accurate analysis that includes coupling to higher-order RF harmonics can be easily implemented using the GTM method.

The immediate consequences of the solution of the R-EOCHE for the TWMZM are as follows: Co-directional propagation of RF and optical waves with impedance-matched termination at all RF frequencies.
In this case, there is only a forward propagating wave on the transmission line and:

$$\overline{\gamma}_{RF}(z) = -\frac{\pi}{V_\pi L}|V_0^+(\omega_{RF})|e^{-\overline{\alpha}_{RF}z}, \tag{61a}$$

$$\phi_{RF}(z) = -\overline{\beta}_{RF}z. \tag{61b}$$

Therefore, the effective RF phase is:

$$\overline{\phi}_{RF}(z) = \omega_{RF}/c(n_g^{opt} - n_{eff}^{RF})z. \tag{62}$$

In the small-signal approximation, the magnitude of the normalized EO frequency response is $$|B| = \frac{\pi}{2V_\pi}|V_0^+(\omega_{RF})|M(\omega_{RF}) \tag{63}$$

where $$M(\omega_{RF}) = e^{-\frac{\overline{\alpha}_{RF}l}{2}}\left[\frac{\sinh^2\left(\frac{\overline{\alpha}_{RF}l}{2}\right) + \sin^2\left(\frac{\omega_{RF}}{2}\frac{(n_g^{opt} - n_{eff}^{RF})}{c}l\right)}{\left(\frac{\overline{\alpha}_{RF}l}{2}\right)^2 + \left(\frac{\omega_{RF}}{2}\frac{(n_g^{opt} - n_{eff}^{RF})}{c}l\right)^2}\right]^{0.5} \tag{64}$$

In general, it is not possible to achieve impedance matching at all RF frequencies; hence, the usefulness of eq. (64) is limited. Note that as expected, the concept of velocity mismatch naturally pops up in the effective RF phase of eq. (50). Co-directional propagation of RF and optical waves with impedance-matched termination and matched RF-optical velocities.
In this case:

$$\overline{\gamma}_{RF}(z) = -\frac{\pi}{V_\pi L}|V_0^+(\omega_{RF})|e^{-\overline{\alpha}_{RV}z}, \overline{\phi}_{RF}(z) = 0 \tag{65}$$

and the small-signal EO frequency response is given by $$|B| = \frac{\pi}{2V_\pi}|V_0^+(\omega_{RF})|\frac{1 - e^{-\overline{\alpha}_{RF}l}}{\overline{\alpha}_{RF}l}. \tag{66}$$

This equation has been used to design silicon-based traveling-wave Mach-Zehnder modulators. The concept of average RF voltage experienced by the photons along the traveling-wave phase shifter. This concept has been utilized for the small-signal EO response of TWMZM. An effective average voltage can be easily defined by combining eq. (15) and eq. (58) such that $$B = \frac{\partial \phi_{EO}}{\partial v}\bigg|_{bias} \times \hat{V}_{avg}(\omega_{RF}) = \frac{\pi}{V_\pi}\hat{V}_{avg}(\omega_{RF}) \text{ and} \tag{67}$$

$$V_{avg}^* = \tag{68}$$

$$\frac{1}{4}\left(\frac{1 - \Gamma_s}{e^{j\xi_{RF}l} - \Gamma_L\Gamma_s e^{-j\xi_{RF}l}}\right)\hat{V}_s\right)e^{j\frac{\omega_{RF}}{v_g}l}\left(e^{-ju_+}\frac{\sin u_+}{u_+} + \Gamma_L e^{-ju_-}\frac{\sin u_-}{u_-}\right)$$

where $\xi_{RF} = \overline{\beta}_{RF} - j\overline{\alpha}_{RF}$, $T_L$, and $T_S$ are the RF reflection at the load and the source, and $u_\pm = (\Omega_{RF}/v_g^{opt} \mp \xi_{RF})l/2$ $\hat{V}_s$, is the phasor of the RF source voltage. The push-pull operation of a TWMZM increases the average voltage by a factor of 2. Note that the concept of the average voltage becomes less meaningful FIG. 45A is a schematic of a microring resonator with an embedded phase shifter. Note that the input optical frequency can be different from the resonance frequency of the cavity. FIG. 45B is an equivalent discrete system representation of the RF harmonic mixing in a lumped microring modulator ($\zeta_{dc} = \hat{\alpha}_{opt} + j(\Delta\omega_{opt}\tau_g^{opt} + \overline{\Delta\phi}dc)$) when there is a non-negligible coupling to the higher-order RF harmonics (e.g., in the case of large-signal AC response).

Now a resonant structure can be considered for which the RF harmonic mixing is more complex than an MZI structure. As shown in FIG. 45A, an input light with a frequency that may or may not be tuned to the resonance frequency of the ring resonator ($\omega 0$ is the input optical frequency) is. $E_{in} = e^{j\omega_0 t}$ This input light couples into the ring resonator and generates a forward propagating field before applying the RF voltage. After applying the RF voltage, due to the mixing of RF voltage into the optical field, a span of all harmonics of the RF excitation can exist for the light inside the resonator at the steady-state. After one round-trip propagation of light inside the ring, the returned optical field can again contain all of the optical RF harmonics. Therefore, the equivalent steady-state discrete system diagram of this resonant modulator is the one shown in FIG. 45B.

In general, it is possible to explicitly write the equations in terms of the optical frequency offset (detuning) with respect to a particular resonant mode of the ring. If the optical detuning is defined as $\Delta\omega_{opt} = \Omega_0 - \omega_{res}$, then $$\overline{\phi}_{prop}(\omega_n) = \overline{\phi}_{prop}(\omega_{res}) + \frac{d\overline{\phi}}{d\omega}\bigg|_{\omega_{res}}(\Delta\omega_{opt} + n\omega_{RF}) \tag{69}$$

FIG. 46 is a graph illustrating a simulation of the EU frequency peaking phenomenon of the microring modulators due to the optical detuning according to various embodiments. FIG. 46 is a simulation of the EU frequency peaking phenomenon of microring modulators due to the optical detuning using the solution of the EOCHE. exp(−j $\overline{\phi}(\omega_{res})l) = 1$ where and $d\overline{\phi}/d\omega$ is the optical group delay per unit length at the resonance frequency of the cavity. Considering that the output light can carry all of the RF harmonics at the steady-state, the relation between the input and output complex amplitudes of the RF harmonics may be described by the generalized transfer matrix as $$\vec{d}_{out} = (\sigma I - \kappa^2 T(I - \sigma T)^{-1})\vec{d}_{in} \tag{70}$$

where $\sigma$ and k are the coupling coefficients and T is the GTM of the phase shifter inside the ring with the following elements:

$$T_{mn} = e^{-\overline{\alpha}_{opt}l}e^{-j\overline{\Delta\phi}_{dc}l}e^{-j(\Delta\omega_{opt} + n\omega_{RF})/v_g^{opt}l} \times J_{m-n}(\overline{\gamma}_{RF}l)e^{j(m-n)\phi_{RF}}. \tag{71}$$

Note that if the phase shifter inside the ring is considered a traveling-wave phase shifter, eq. (70) still holds and the generalized transfer matrix T is simply replaced by its traveling-wave counterpart from eq. (47). Using eq. (26) and eq. (70) the EO frequency response of the microring modulator can be found.

It is worth pointing out that the GTM approach has reduced the difficult problem of finding the EO frequency response of a microring resonator into a remarkably simple matrix equation. This approach not only avoids using rate equations or perturbation theory but it also provides both the small-signal as well as the large-signal EO frequency response of the cavity for all of the generated RF harmonics of light.

To demonstrate the EO frequency peaking phenomenon of the microring resonators, a lumped microring modulator in Z-cut thin-film lithium niobate (linear EO material) can be simulated based on the previous work with the following parameters:

$$\partial \lambda_{res}/\partial v \ R_{source}=50\Omega, \ C_{modulator}=69fF \ R=30 \ \mu m,$$
$$n_g^{opt}=2.29, \ \bar{\alpha}_{opt}=22 \ dB/cm, \ \kappa=0.3$$

The EO frequency response of the modulator in FIG. 46 using eq. (26) and eq. (70) can be calculated and plotted for six cases in which the optical frequency is detuned from the resonance frequency of the modulator by 0 GHz, 5 GHz, 10 GHz, 15 GHz, 20 GHz, and 25 GHz. As can be seen, frequency peaking occurs as the optical detuning increases.

In summary, the theory of coupled RF harmonics in the optical domain was proposed for electrically linear and nonlinear phase shifters and arrived at the electro-optic coupled harmonic equation (EOCHE) and its variants (R-EOCHE, ENR-EOCHE), which are powerful tools for performing large-signal and small-signal analysis of electro-optic modulators. Based on the EOCHE, the concept of effective RF phase was developed and the generalized transfer matrix method for photonic circuits that accurately capture the evolution of all of the propagating RF harmonics of the light at the DC operating point in the system (from the point of injection to the output port). the generalized transfer matrix enables a fast evaluation of the EO frequency response for non-resonant and resonant modulators and is akin to an AC analysis of electrical circuits.

For a traveling-wave phase shifter, the phase modulation efficiency ('RF(Z)) may be written in the per-unit-length (rad/m) quantity as $$\bar{\gamma}_{RF}(z) = -\left.\frac{\partial\left(\frac{\phi_{EO}}{l}\right)}{\partial v}\right|_{bias} \times |\hat{V}_{rf}(z)| = -\frac{\pi}{V_\pi L}|\hat{V}_{rf}(z)| \quad (72)$$

Therefore, based on eq. (30) for the differential lumped phase shifter the equation can be shown as:

$$d_n(z) + \frac{\partial d_n(z)}{\partial z}\Delta z \approx d_n(z+\Delta z) = \quad (73)$$
$$e^{-\bar{\zeta}_{dc}\Delta z}\sum_{m=-\infty}^{\infty}d_{n-m}(z)e^{-j(n-m)\omega_{RF}\tau_g^{opt}\Delta z}h[m](z).$$

Using $j_{-m}(z)=(-1)^m j_m(z)$ and the small-argument expansion of Bessel $m \geq 0$ functions for:

$$J_m(\bar{\gamma}_{RF}(z)\Delta z) = \frac{1}{m!}\left(\frac{\bar{\gamma}_{RF}(z)\Delta z}{2}\right)^m \quad (74)$$

we see that $\Delta z \to 0$, $h[m](z)$ has $O(\Delta z^{|m|})$ behavior. Thus, only the terms in eq. (73) m=0, m=±1 with are important. Therefore $$d_n(z) + \frac{\partial d_n(z)}{\partial z}\Delta z = \quad (75)$$
$$(1-\bar{\zeta}_{dc}\Delta z)\left(d_n(z)\left(1-jn\omega_{RF}\frac{\Delta z}{v_g^{opt}}\right)h[0](z) + d_{n-1}(z)h[1](z) + \right.$$
$$\left. d_{n+1}(z)h[-1](z) + O(\Delta z^2)\right)$$

After some further algebraic simplification, eq. (33) is derived

The goal of solving R-EOCHE is to find d(l) in terms of d(0)d0). To do so, it is first prove that for any two parameters $z_1$, and $z_2$, the coefficient matrix $\tilde{M}(z)$ from eq. (45) commutes with itself, e.g., $$\tilde{M}(z_1)\cdot\tilde{M}(z_2)=\tilde{M}(z_2)\cdot\tilde{M}(z_1) \quad (76)$$

Using the Kronecker delta notation, the m, n entry of the $\tilde{M}(z)$ matrix is written as $$\tilde{M}_{mn}(z)=-B^*(Z)B(Z)\delta_{m-1,n}+B(z)\delta_{m-1,n} \quad (77)$$

where $B(z)=-0.5\bar{\gamma}_{RF}(z)\exp(-j\bar{\phi}_{RF}(z))$ the m, n component of the left-had side of eq. (76) is given by $$(\tilde{M}_1\tilde{M}_2)_{mn} = f(z_1, z_2) = \sum_{k=-\infty}^{\infty}\tilde{M}_{mk}(z_1)\tilde{M}_{kn}(z_2) \quad (78)$$

where $$f(z_1, z_2) = \quad (79)$$
$$B^*(z_1)B^*(z_2)\delta_{m-2,n} - (B^*(z_1)B(z_2) + B(z_1)B^*(z_2))\delta_{m,n} + B(z_1)B(z_2)\delta_{m+2,n}$$

This equation clearly shows that f(z1, z2)=f(z2, z1). Therefore, eq. (A5) holds true. Due to this commute property, the general solution of R-EOCHE is given by $$\vec{d}(z)=\exp(\int_0^z \tilde{M}(z')dz')\vec{d}(0). \quad (80)$$

Considering that R-EOCHE was derived by eliminating the terms involving the optical power loss, it is expected that the solutions of R-EOCHE conserve the optical power, e.g., $$\sum_{n=-\infty}^{\infty}|d_n(z)|^2 = \sum_{n=-\infty}^{\infty}|d_n(0)|^2. \quad (81)$$

To prove this, it is noted the coefficient matrix $\tilde{M}(z)$ and its integral $N(z)=\int_0^z \tilde{M}(z')dz'$ both exhibit the anti-Hermitian (conjugate transpose) property:

$$(\tilde{M}(z))^H=-\tilde{M}(z), \ (N(z))^H=-N(z). \quad (82)$$

Therefore:

$$(\exp(N))^H=\exp(N^H)=\exp(-N) \quad (83)$$

and the equation can be shown as:

$$\sum_{n=-\infty}^{\infty}|d_n(z)|^2 = \left(\vec{d}(z)\right)^H \vec{d}(z)$$

-continued $$= \left(\vec{d}(0)\right)^H (\exp N)^H (\exp N)\vec{d}(0)$$

$$= \left(\vec{d}(0)\right)^H \vec{d}(0) = \sum_{n=-\infty}^{\infty} |d_n(0)|^2$$

because exp(−N)·exp(N) is the identity matrix.

For a lumped electrically nonlinear phase shifter, the phase shift can be represented as a power series:

$$\Delta \bar{\phi}_{EO} = \Delta \bar{\phi}_{dc} + \left.\frac{\partial \bar{\phi}_{EO}}{\partial v}\right|_{bias} v + \left.\frac{\partial^2 \bar{\phi}_{EO}}{\partial v^2}\right|_{bias} v^2 + \left.\frac{\partial^3 \bar{\phi}_{EO}}{\partial v^3}\right|_{bias} v^3 + \ldots \quad (85)$$

from which eq. (37) is derived. Assuming that this phase shift has M harmonics, the electric field of light gets the following $$e^{-j\Delta\bar{\phi}_{EO}l} = e^{-j\Delta\bar{\phi}_{dc}l} \prod_{k=1}^{M} e^{j\gamma_{RF}^{(k)}l\sin(k\omega_{RF}t+\phi_{RF}^{(k)})} \quad (86)$$

Each term of this multiplication may be expanded into its Jacobi-Anger representation:

$$e^{-j\Delta\bar{\phi}_{EO}l} = e^{-j\Delta\bar{\phi}_{dc}l} \prod_{k=1}^{M}\left(\sum_{n=-\infty}^{\infty} J_n(\bar{\gamma}_{RF}^{(k)}l)e^{jn(k\omega_{RF}t+\phi_{RF}^{(k)})}\right) \quad (87)$$

Using the change of variable p=n×k, the equation can be shown as $$\sum_{n=-\infty}^{\infty} J_n(\bar{\gamma}_{RF}^{(k)}l)e^{jn(k\omega_{RF}t+\phi_{RF}^{(k)})} = \sum_{p=-\infty}^{\infty} h_k[p]e^{jp\omega_{RF}t} \quad (88)$$

where $h_k[p]$ is defined by eq. (38). With this representation, each Jacobi-Anger expansion may be represented by a discrete system with the discrete impulse response $h_k[n]$.

$$\left(\sum_{p=-\infty}^{\infty} h_k[p]e^{jp\omega_{RF}t}\right)\left(\sum_{p=-\infty}^{\infty} h_r[p]e^{jp\omega_{RF}t}\right) = \sum_{p=-\infty}^{\infty} (h_k[p]\otimes h_r[p])e^{jp\omega_{RF}t} \quad (89)$$

Because the multiplication of two Jacobi-Anger expansions results in the convolution sum for the coefficients of the RF harmonics, it can be concluded that the equivalent discrete system representation of a lumped electrically nonlinear phase shifter is the one shown in FIG. 43B. Now, an electrically nonlinear traveling-wave phase shifter can be considered. For a differential segment of length Δz, the equation can be written as:

$$h_p[n] \otimes \left(d_n(z)e^{-\xi_n \Delta z}\right) = \sum_{m=-\infty}^{\infty} h_p[m]d_{n-m}(z)e^{-\xi_{n-m}\Delta z} \quad (90)$$

where $$\xi_n = \bar{\zeta}_{dc} + j\frac{n\omega_{RF}}{v_g^{opt}}.$$

The first three nonzero terms are for m=0, m=±p and the rest of the terms are of O(Δz²).

Therefore:

$$h_p[n] \otimes \left(d_n(z)e^{-\xi_n \Delta z}\right) \approx d_n(z)e^{-\xi_n \Delta z} + \Delta z\frac{1}{2}\bar{\gamma}_{RF}^{(p)}(z)\left(e^{j\phi_{RF}^{(p)}(z)}d_{n-p}(z)e^{-\xi_{n-p}\Delta z} - e^{-j\phi_{RF}^{(p)}(z)}d_{n+p}(z)e^{-\xi_{n+p}\Delta z}\right) \quad (91)$$

and similarly, it can be seen that $$h_q[n] \otimes \left(h_p[n] \otimes \left(d_n(z)e^{-\xi_n \Delta z}\right)\right) \approx$$
$$d_n(z)e^{-\xi_n \Delta z} + \Delta z\frac{1}{2}\bar{\gamma}_{RF}^{(q)}(z)\left(e^{j\phi_{RF}^{(q)}(z)}d_{n-q}(z)e^{-\xi_{n-q}\Delta z} + \Delta z\frac{1}{2}\bar{\gamma}_{RF}^{(p)}(z)\left(e^{j\phi_{RF}^{(p)}(z)}d_{n-p}(z)e^{-\xi_{n-p}\Delta z} - e^{j\phi_{RF}^{(p)}(z)}d_{n+p}(z)e^{-\xi_{n+p}\Delta z}\right). \quad (92)$$

Therefore, by induction it can be concluded that:

$$d_n(z+\Delta z) \approx d_n(z)e^{-\xi_n \Delta z} + \Delta z\sum_{k=1}^{M}\frac{1}{2}\bar{\gamma}_{RF}^{(k)}(z)\left(e^{j\phi_{RF}^{(k)}(z)}d_{n-p}(z)e^{-\xi_{n-k}\Delta z} - e^{j\phi_{RF}^{(k)}(z)}d_{n+k}(z)e^{-\xi_{n+k}\Delta z}\right), \quad (93)$$

which results in eq. (39) as after the change of variable from eq. (34).

The matrix exponential of eq. (59) can be analytically calculated using the eigen-values and eigen-vectors of the N matrix. The eigen-values are found by solving, which results det(N−xI)=0 in the following equation $$x(x^2+2|B|^2)=0. \quad (94)$$

Therefore, the three eigen values and the corresponding eigen vectors are:

$$x_1 = 0 \rightarrow \vec{v}_1 = \frac{1}{\sqrt{2}|B|}\begin{pmatrix} B \\ 0 \\ B^* \end{pmatrix} \quad (95)$$

$$x_2 = j\sqrt{2}|B| \rightarrow \vec{v}_2 = \frac{1}{2|B|}\begin{pmatrix} B \\ j\sqrt{2}|B| \\ -B^* \end{pmatrix} \quad (96)$$

$$x_3 = -j\sqrt{2}|B| \rightarrow \vec{v}_3 = \frac{1}{2|B|}\begin{pmatrix} B \\ -j\sqrt{2}|B| \\ -B^* \end{pmatrix} \quad (97)$$

and the exp (N) is given by $$\exp(N) = e^{x_1}\vec{v}_1\vec{v}_1^H + e^{x_2}\vec{v}_2\vec{v}_2^H + e^{x_3}\vec{v}_3\vec{v}_3^H. \quad (98)$$

For a traveling-wave Mach-Zehnder modulator, the input light does not have any RF harmonics, therefore $$\begin{pmatrix} \tilde{d}_{-1} \\ \tilde{d}_0 \\ \tilde{d}_1 \end{pmatrix}(z=0) = \begin{pmatrix} 0 \\ d_0(0) \\ 0 \end{pmatrix} \qquad (99)$$

And only the second column exp(N) is needed to be found $$(\exp(N))_{12} = \frac{\sqrt{2}\,B}{2|B|}\sin(\sqrt{2}\,|B|), \qquad (100)$$

$$(\exp(N))_{22} = \cos(\sqrt{2}\,|B|), \qquad (101)$$

$$(\exp(N))_{32} = -\frac{\sqrt{2}\,B^*}{2|B|}\sin(\sqrt{2}\,|B|). \qquad (102)$$

The EO frequency response for the first RF harmonic of light at the output of the TWMZM is given by $$I[1] = \sum_{n=-\infty}^{\infty} g_n g_{n-1}^* \qquad (103)$$

where $$g[n] = d_n(l) - e^{j\phi_{Bias}} e^{-\overline{j\phi}_{prop}l} e^{-\overline{\alpha}_{opt}l} d_0(0)\delta[n]. \qquad (104)$$

By noting that $$\left(\frac{\tilde{d}_{-1}(l)}{d_0(0)}\right)^* = -\frac{\tilde{d}_1(l)}{d_0(0)} \qquad (105)$$

arrive at $$\frac{I[1]}{|d_0(0)|^2} = e^{-2\overline{\alpha}_{opt}l} 2j\sin(\overline{\Delta\phi}_{dc}l - \phi_{Bias}) \times \frac{\tilde{d}_1(l)}{d_0(0)} e^{-j\omega_{RF}\tau_g^{opt}l} \qquad (106)$$

which can be further simplified into eq. (60). Note that for silicon-based PN junction traveling-wave phase shifters, the parameter $\overline{\gamma}_{RF}(z)$ has to be modified based on the RC response of the junction:

$$\overline{\gamma}_{RF}(z) = -\frac{\pi}{V_\pi L}|\hat{V}_{rf}(z)| \times |H_{RC}(\omega_{RF})|. \qquad (107)$$

Finally, it can be noted that the small-signal frequency response of a TWMZM biased at the quadrature in eq. (106) simplifies to $$H_{TWMZM}(\omega_{RF}) = 2\frac{|I[1]|}{|E_{in}|^2} = |B|e^{-2\overline{\alpha}_{opt}l}, \qquad (108)$$

where $E_{in}$ is the input amplitude of light.

Considering that the small-signal frequency response of a traveling-wave modulator in eq. (60) is proportional to B as defined in eq. (58), it can be seen that $B/(\partial\phi_{EO}/\partial v)$ the ratio has the dimension of voltage. This can be considered as the phasor of the average voltage seen by the light along the transmission line as defined in eq. (67). Starting with the definition of B from eq. (58), the equation can be written as:

$$B = \frac{1}{l}\frac{\partial\phi_{EO}}{\partial v} \times \left(\frac{1}{2}\int_0^l |\hat{V}_{rf}(z)|e^{-j\phi_{RF}(z)}dz\right) \qquad (109)$$

and the phasor of the average voltage is $$\hat{V}_{avg}^*(\omega_{RF}) = \frac{1}{2l}\int_0^l \hat{V}_{rf}(z) e^{j\frac{\omega_{RF}}{v_g^{opt}}z} dz. \qquad (110)$$

Using the complex propagation constant of the RF signal defined as $\xi_{RF}=\beta_{RF}-j\overline{\alpha}_{RF}$, the phasor of the RF voltage is given by $$\hat{V}_{rf}(z) = V_0^+ e^{-j\xi_{RF}z} + V_0^- e^{-j\xi_{RF}z} \qquad (111)$$

Plugging eq. (111) into eq. (110) results in the following expression $$\hat{V}_{avg}^*(\omega_{RF}) = \frac{1}{2}\left(V_0^+ e^{ju_+}\frac{\sin u_+}{u_+} + V_0^- e^{ju_-}\frac{\sin u_-}{u_-}\right). \qquad (112)$$

where $$u_\pm = \frac{l}{2}\left(\frac{\omega_{RF}}{v_g^{opt}} \mp (\overline{\beta}_{RF} - j\overline{\alpha}_{RF})\right). \qquad (113)$$

Based on the RF reflection coefficients at the source ($\Gamma_L$) and the load ($\Gamma_L$), the amplitudes $V_0^+$ and $V_0^-$ can be further written in terms of the phasor of the source voltage $\hat{V}_{source}$ ($\omega_{RF}$) which results in eq. (68).

The disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms, operations, and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the disclosure is not described with reference to any particular programming language. It will be appreciated that a variety of programming languages can be used to implement the teachings of the disclosure as described herein.

The disclosure can be provided as a computer program product, or software, that can include a machine-readable medium having stored thereon instructions, which can be used to program a computer system (or other electronic devices) to perform a process according to the disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims may generally be construed to mean "one or more" unless specified otherwise or clear from context to be directed to a singular form. Moreover, use of the term "an implementation" or "one implementation" or "an embodiment" or "one embodiment" or the like throughout is not intended to mean the same implementation or implementation unless described as such. One or more implementations or embodiments described herein may be combined in a particular implementation or embodiment. The terms "first," "second," "third," "fourth," etc. as used herein are meant as labels to distinguish among different elements and may not necessarily have an ordinal meaning according to their numerical designation.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus comprising:
a buried oxide layer disposed on a substrate;
a microring resonator disposed on the buried oxide layer and within a bonded semiconductor layer;
an optical waveguide disposed on the buried oxide layer within the bonded semiconductor layer and optically coupled to the microring resonator, wherein the optical waveguide is to input a first optical wave into the microring resonator;
an oxide layer deposited on top of the optical waveguide and on top of the microring resonator; and
a set of electrodes disposed adjacent to the microring resonator and comprising:
an inner electrode disposed on the buried oxide layer and offset from an inside of the microring resonator;
an outer electrode disposed on the buried oxide layer and offset from an outside of the microring resonator; and
a top electrode disposed on top of the deposited oxide layer and located centrally above the microring resonator.

2. The apparatus of claim 1, wherein at least one of the optical waveguide or the microring resonator is a Z-cut lithium niobate-etched thin film.

3. The apparatus of claim 1, wherein, in response to an electrical signal, the set of electrodes are to:
modulate the first optical wave into a modulated optical wave of transverse magnetic polarization within the microring resonator; and
output the modulated optical wave to the optical waveguide.

4. The apparatus of claim 1, wherein the inner electrode, the outer electrode, and the microring resonator are concentric in a first plane, the top electrode is concentric to the inner electrode and the outer electrode and disposed in a second plane that is parallel to the first plane.

5. The apparatus of claim 1, wherein outer sidewalls and inner sidewalls of the top electrode are located within a first vertical plane and a second vertical plane, respectively, and wherein an inner sidewall of the outer electrode extends past the first vertical plane towards the second vertical plane and an outer sidewall of the inner electrode extends past the second vertical plane toward the first vertical plane.

6. The apparatus of claim 1, wherein the inner and outer electrodes are between approximately a quarter and a half of a height of the microring resonator.

7. The apparatus of claim 1, wherein the optical waveguide comprises a protruded portion that is optically coupled to the microring resonator, wherein the inner electrode, the outer electrode, and the microring resonator are circular, except for a portion of the inner electrode that does not complete a full circle, the portion comprising a gap that is occupied by the protruded portion of the optical waveguide.

8. The apparatus of claim 1, further comprising:
a first via deposited between the inner electrode and a top of the bonded semiconductor layer;
a second via deposited between the outer electrode and a top of the bonded semiconductor layer; and
wherein the first via and the second via are coupled to a ground potential and the top electrode is coupled to a signal terminal.

9. The apparatus of claim 1, wherein the microring resonator and the top electrode are separated by a first distance that is between 200 nm and 2000 nm, and wherein the inner electrode and the outer electrode are separated by a second distance that is between 500 nm and 5000 nm.

10. The apparatus of claim 1, wherein the optical waveguide is a single-mode optical waveguide and the first optical wave is a transverse-magnetic-mode optical wave.

11. The apparatus of claim 1, wherein the optical waveguide and the microring resonator are separated by a distance of between 100 nanometers (nm) and 4000 nm.

12. The apparatus of claim 3, further comprising:
a light source to generate the first optical wave;
a first grating coupler coupled between the light source and an input of the optical waveguide, the first grating coupler to provide the first optical wave from the light source to the optical waveguide; and
a second grating coupler coupled to an output of the optical waveguide to output the modulated optical wave.

13. An optical modulator comprising:
an optical waveguide disposed on a buried oxide layer;
a microring resonator disposed on the buried oxide layer and optically coupled to the optical waveguide;
a first vertical grating coupler coupled to an input port of the optical waveguide, the first vertical grating coupler being coupled to an optical source, wherein the optical source is to generate a first optical wave;
a second vertical grating coupler coupled to an output port of the optical waveguide to output a second optical wave, the second optical wave resulting from an interaction between the first optical wave and the microring resonator;

a first electrode disposed on the buried oxide layer and coupled to a ground potential; and a second electrode disposed on top of the buried oxide layer and coupled to a signal terminal, wherein a voltage potential is to be applied between the first electrode and the second electrode to modulate the first optical wave into the second optical wave within the microring resonator.

14. The optical modulator of claim 13, wherein the optical waveguide and the microring resonator are separated by a distance of between 100 nanometers (nm) and 4000 nm, the optical modulator further comprising:

a second optical waveguide optically coupled to the microring resonator, wherein the second optical waveguide is separated from the microring resonator by a second distance of between 100 nm and 4000 nm; and a third vertical grating coupler coupled to the second optical waveguide to output a third optical wave resulting from an interaction between the first optical wave and the microring resonator.

15. The optical modulator of claim 14, wherein first optical waveguide is coupled to the microring resonator at a first point of the microring resonator, and wherein the second optical waveguide is coupled to the microring resonator at a second point of the microring resonator, the second point being opposite the first point along a diameter of the microring resonator.

16. The optical modulator of claim 13, wherein the optical waveguide and the microring resonator is each a Z-cut lithium niobate-etched thin film through which the first optical wave and the second optical wave are to respectively exhibit transverse magnetic polarization.

17. The optical modulator of claim 16, wherein a radius of the microring resonator is between approximately 1 micron (μm) and 1000 μm.

18. The optical modulator of claim 13, wherein an optical response of the microring resonator is isotropic with respect to an axis of symmetry of the microring resonator.

19. A microring modulator comprising:

a first electrode, a second electrode, and a third electrode having a circular pattern, wherein the first electrode and the second electrode are disposed within a first plane and coupled to a ground potential, the third electrode is disposed within a second plane, parallel to the first plane, and wherein the third electrode is coupled to a signal terminal; and a microring resonator having a circular pattern and disposed within the first plane between the first electrode, the second electrode, and the third electrode, wherein the microring resonator is to support modulation of an optical wave radiating with transverse magnetic polarization between the i) first and second electrodes and ii) the third electrode.

20. The microring modulator of claim 19, wherein the first electrode, the second electrode, and the microring resonator are disposed on a buried oxide layer, and the third electrode is disposed above the buried oxide layer.

21. The microring modulator of claim 19, wherein the microring resonator is a Z-cut lithium niobate-etched thin film.

22. The microring modulator of claim 19, further comprising an optical waveguide coupled to the microring resonator, the optical waveguide being a Z-cut lithium niobate-etched thin film, wherein the optical waveguide is to input the optical wave into the microring resonator.

23. The microring modulator of claim 22, further comprising:

an input light source to generate the optical wave;

a first grating coupler coupled between the input light source and an input of the optical waveguide to provide the optical wave from the input light source to the microring resonator; and a second grating coupler coupled to an output of the optical waveguide and that is to output a modulated optical wave resulting from the modulation of the optical wave by the first electrode, the second electrode, and the third electrode.

24. The microring modulator of claim 19, wherein a radius of the microring resonator is between approximately 1 micron (μm) and 1000 μm.

* * * * *